(12) United States Patent
Fukui

(10) Patent No.: US 12,009,381 B2
(45) Date of Patent: Jun. 11, 2024

(54) SOLID-STATE IMAGING DEVICE

(71) Applicant: SONY SEMICONDUCTOR SOLUTIONS CORPORATION, Kanagawa (JP)

(72) Inventor: Hironobu Fukui, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 266 days.

(21) Appl. No.: 17/595,529

(22) PCT Filed: May 27, 2020

(86) PCT No.: PCT/JP2020/020997
§ 371 (c)(1),
(2) Date: Nov. 18, 2021

(87) PCT Pub. No.: WO2020/241717
PCT Pub. Date: Dec. 3, 2020

(65) Prior Publication Data
US 2022/0271069 A1   Aug. 25, 2022

(30) Foreign Application Priority Data
May 31, 2019 (JP) .................. 2019-102044

(51) Int. Cl.
*H01L 27/146* (2006.01)
*H04N 25/75* (2023.01)
*H04N 25/77* (2023.01)

(52) U.S. Cl.
CPC .... *H01L 27/1463* (2013.01); *H01L 27/14612* (2013.01); *H01L 27/14636* (2013.01);
(Continued)

(58) Field of Classification Search
CPC .......... H01L 27/1463; H01L 27/14612; H01L 27/14636; H01L 27/14643;
(Continued)

(56) References Cited

U.S. PATENT DOCUMENTS 10,271,037 B2 * 4/2019 Oh ................... H01L 27/14621
10,347,679 B2 * 7/2019 Kato ................ H01L 27/14627
(Continued)

FOREIGN PATENT DOCUMENTS

CN   102005462 A   4/2011
CN   102446939 A   5/2012
(Continued)

OTHER PUBLICATIONS

International Search Report and Written Opinion of PCT Application No. PCT/JP2020/020997, dated Aug. 18, 2020, 12 pages of ISRWO.

*Primary Examiner* — Shahbaz Nazrul
(74) *Attorney, Agent, or Firm* — CHIP LAW GROUP

(57) ABSTRACT

A solid-state imaging device includes a first semiconductor substrate, an isolation region, a charge holding section, and a charge accumulation section. The first semiconductor substrate is a substrate in which a photoelectric converter is provided for each of unit regions. The isolation region is provided to run through the first semiconductor substrate in a thickness direction and electrically isolates the unit regions from each other. The charge holding section is electrically coupled to the photoelectric converter and configured to receive signal charge from the photoelectric converter. The charge accumulation section is shared by two or more of the unit regions and is a section to which the signal charge is transferred from the photoelectric converter and the charge holding section of each of the unit regions sharing the charge accumulation section.

14 Claims, 49 Drawing Sheets

(52) U.S. Cl.
CPC ....... *H01L 27/14643* (2013.01); *H04N 25/75* (2023.01); *H04N 25/77* (2023.01)

(58) Field of Classification Search
CPC ......... H01L 2224/08145; H01L 25/065; H01L 25/07; H01L 25/18; H01L 27/146; H04N 25/75; H04N 25/77; H04N 25/778
See application file for complete search history.

(56) References Cited

U.S. PATENT DOCUMENTS

| | | | |
|---|---|---|---|
| 2010/0045837 A1* | 2/2010 | Yamashita | H01L 27/14609 257/E31.127 |
| 2011/0204467 A1 | 8/2011 | Ohchi et al. | |
| 2012/0085888 A1 | 4/2012 | Endo et al. | |
| 2013/0009224 A1 | 1/2013 | Ohri | |
| 2013/0083225 A1 | 4/2013 | Minowa et al. | |
| 2013/0221463 A1 | 8/2013 | Okada | |
| 2014/0054662 A1* | 2/2014 | Yanagita | H01L 27/14645 438/73 |
| 2014/0160335 A1* | 6/2014 | Shimotsusa | H04N 25/75 438/69 |
| 2016/0141326 A1 | 5/2016 | Hanzawa | |
| 2016/0204153 A1* | 7/2016 | Tayanaka | H01L 27/14689 257/229 |
| 2016/0360126 A1* | 12/2016 | Soda | H01L 27/1463 |

FOREIGN PATENT DOCUMENTS

| | | |
|---|---|---|
| CN | 102867834 A | 1/2013 |
| CN | 103403869 A | 11/2013 |
| CN | 105210363 A | 12/2015 |
| CN | 105405856 A | 3/2016 |
| CN | 110100312 A | 8/2019 |
| EP | 3593382 A1 | 1/2020 |
| JP | 2011-077498 A | 4/2011 |
| JP | 2012-084644 A | 4/2012 |
| JP | 2013-016675 A | 1/2013 |
| JP | 2013-080797 A | 5/2013 |
| JP | 2013-175610 A | 9/2013 |
| JP | 2014-123771 A | 7/2014 |
| JP | 2015-012127 A | 1/2015 |
| JP | 2015-177429 A | 10/2015 |
| JP | 2017-191950 A | 10/2017 |
| JP | 2018-148116 A | 9/2018 |
| KR | 10-2011-0025087 A | 3/2011 |
| KR | 10-2014-0015326 A | 2/2014 |
| KR | 10-2016-0132342 A | 11/2016 |
| KR | 10-2019-0119029 A | 10/2019 |
| TW | 201117365 A | 5/2011 |
| TW | 201143073 A | 12/2011 |
| TW | 201537983 A | 10/2015 |
| TW | 201843825 A | 12/2018 |
| WO | 2012/117931 A1 | 9/2012 |
| WO | 2015/141161 A1 | 9/2015 |
| WO | 2018/163838 A1 | 9/2018 |

* cited by examiner

[FIG. 1]
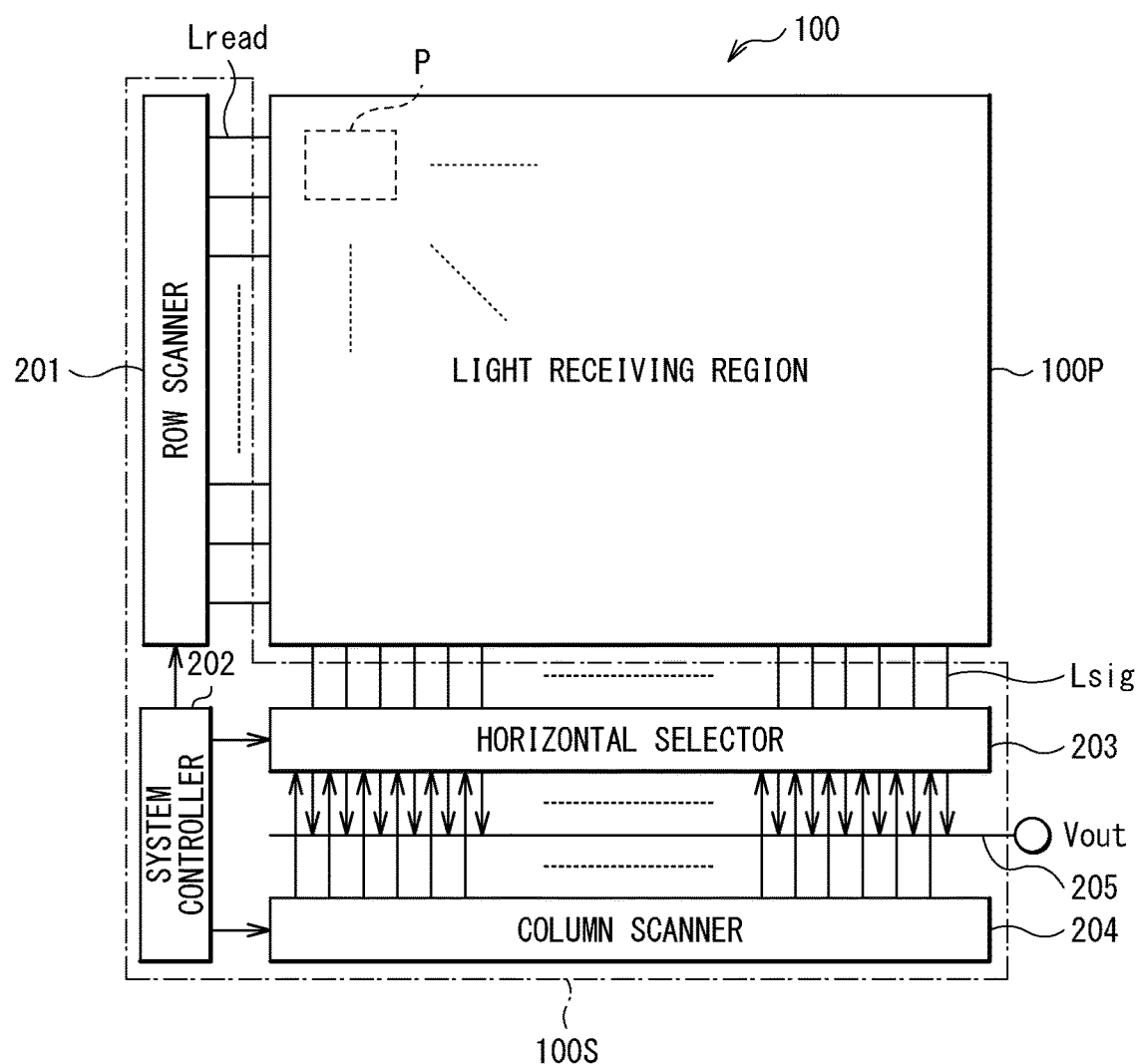

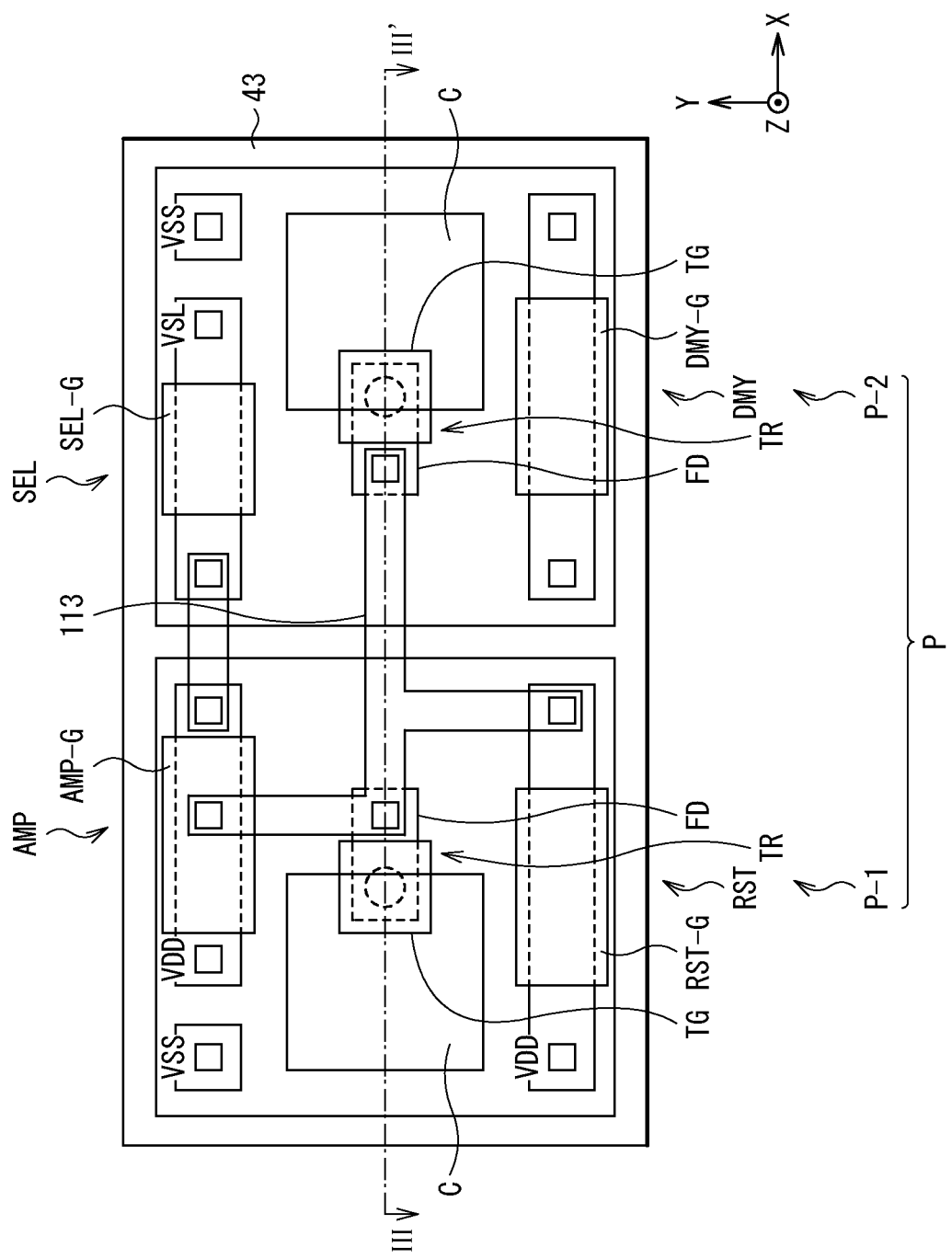
[FIG. 2]

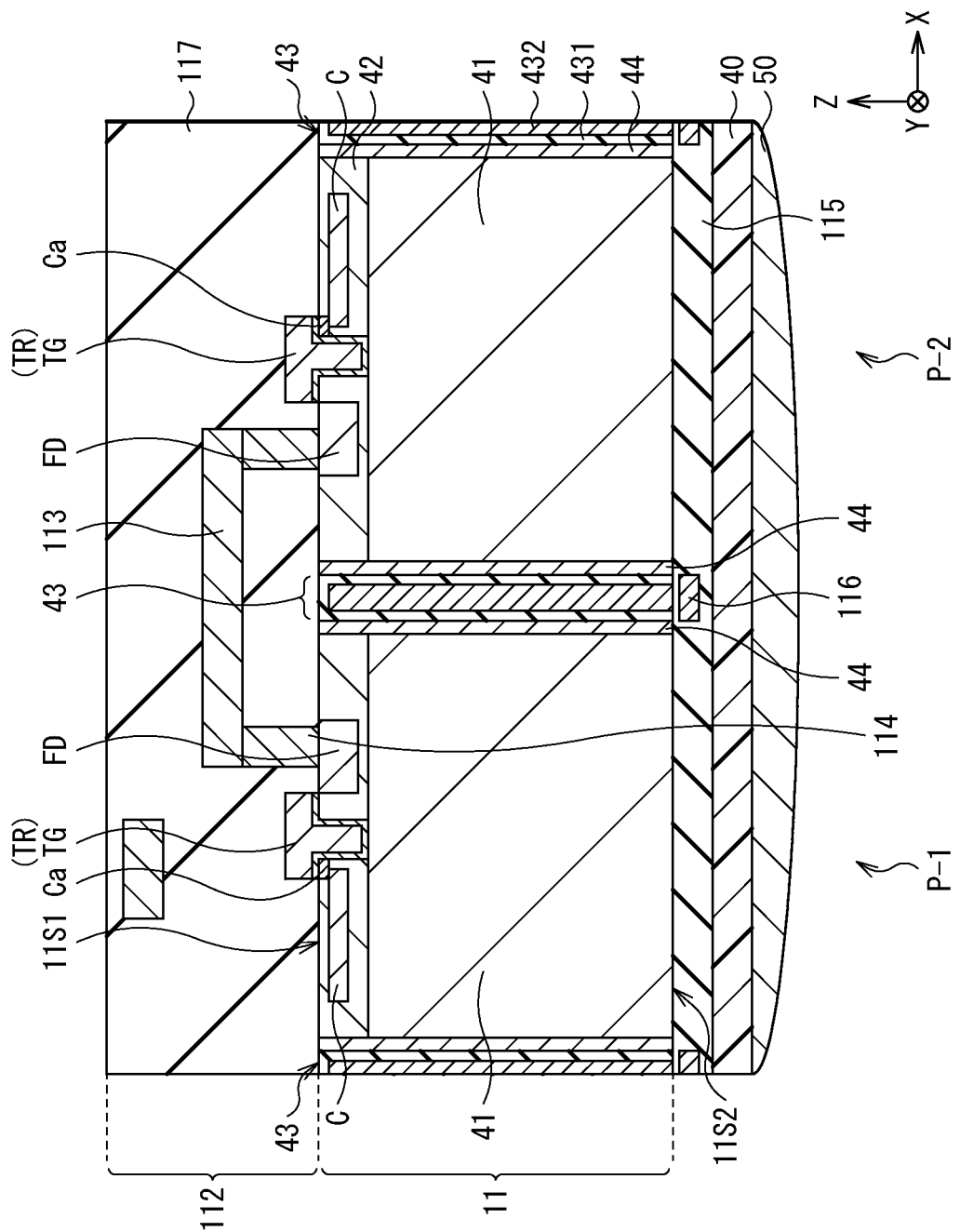
[FIG. 3]

[FIG. 4]
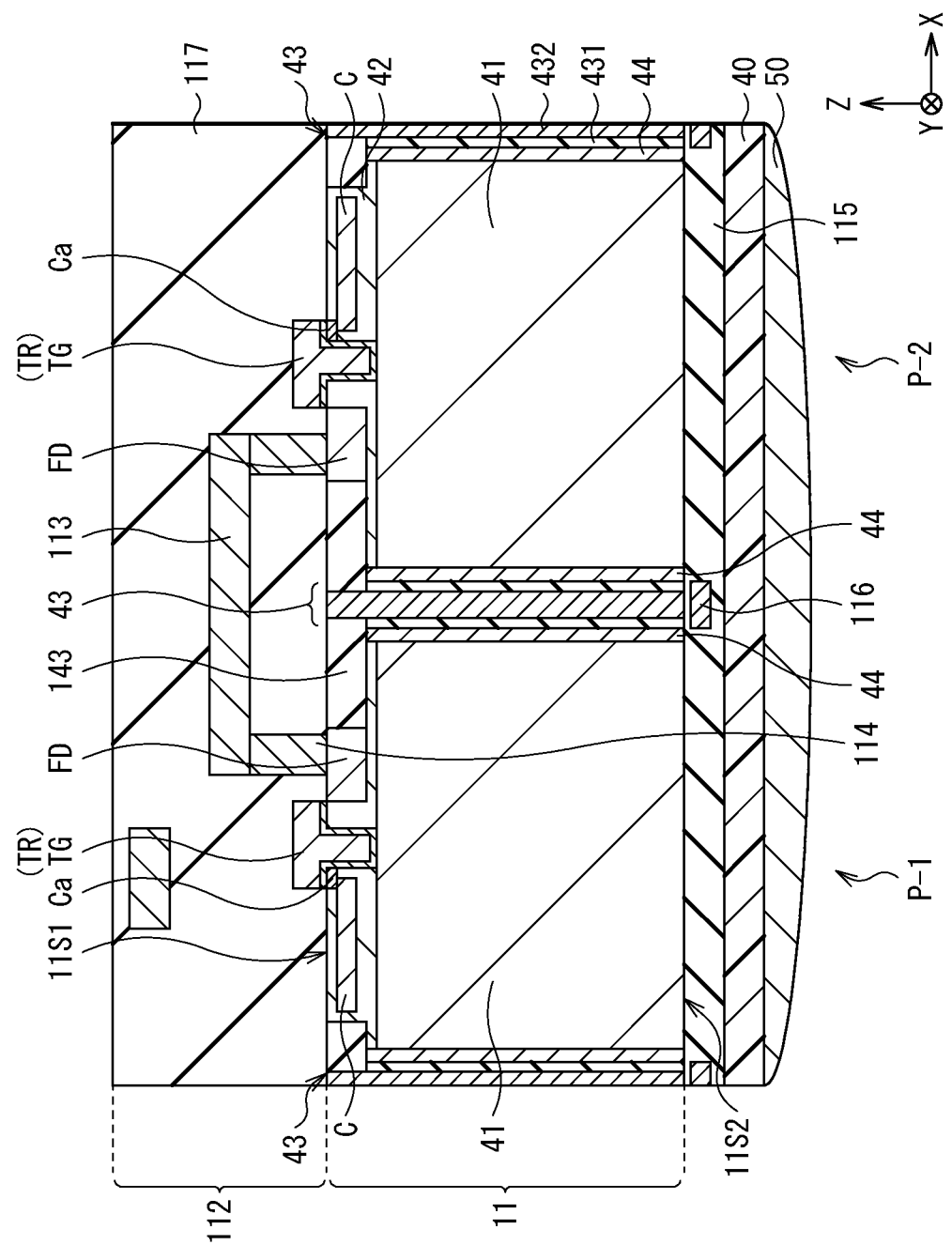

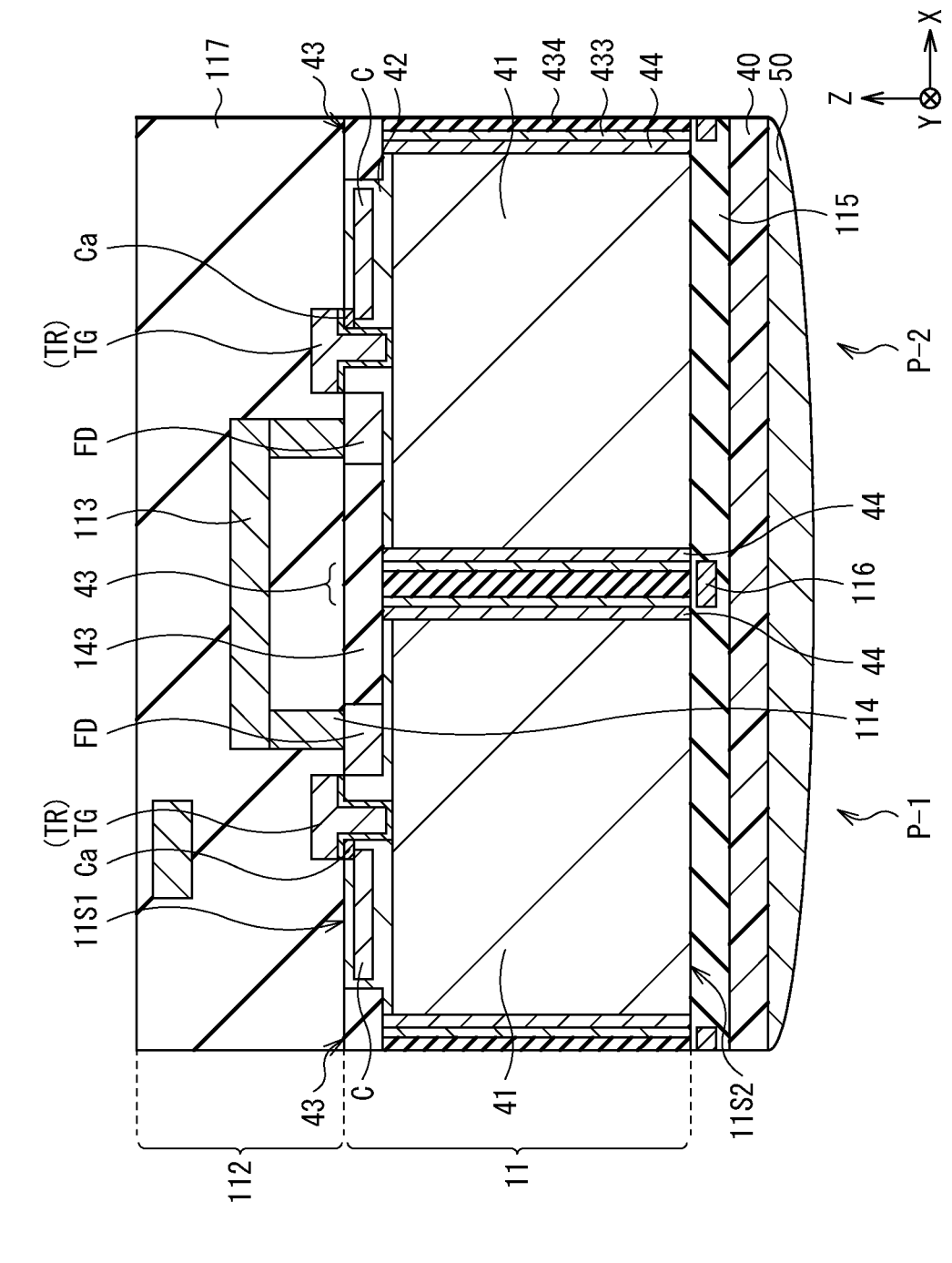
[FIG. 5]

[FIG. 6]
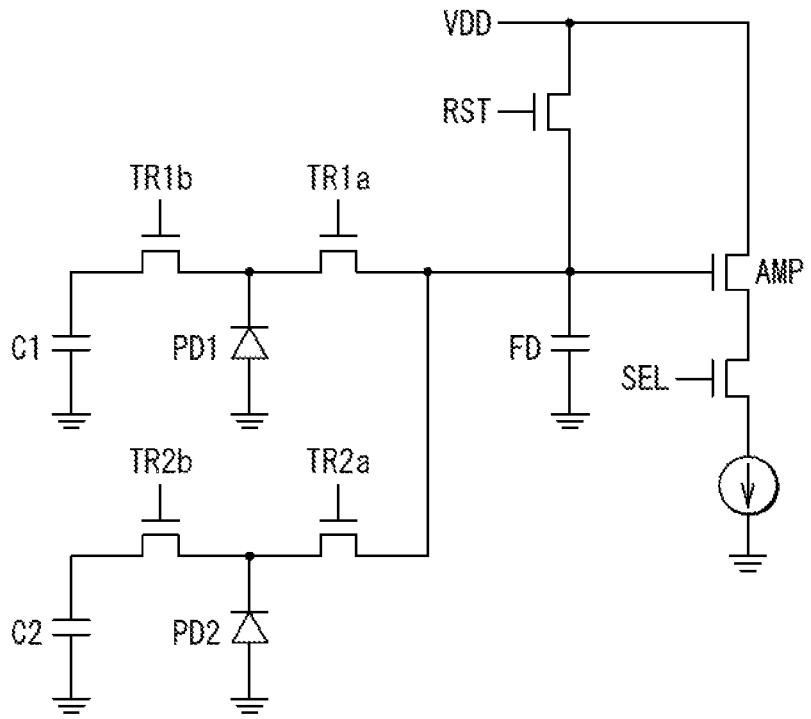
[FIG. 7]
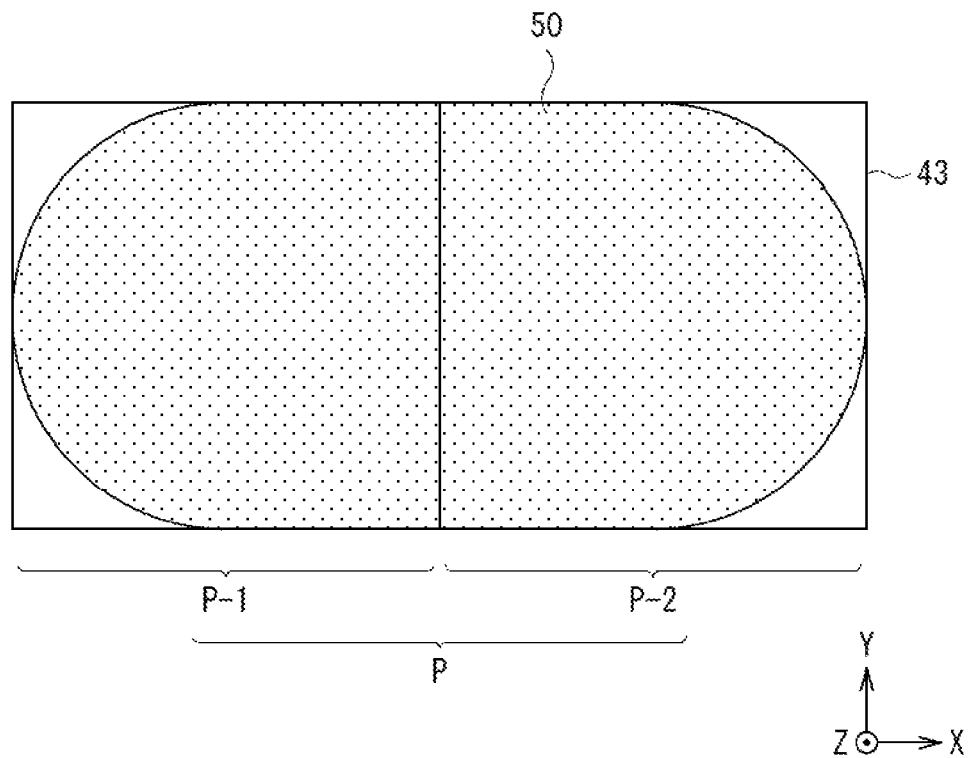

[FIG. 8]
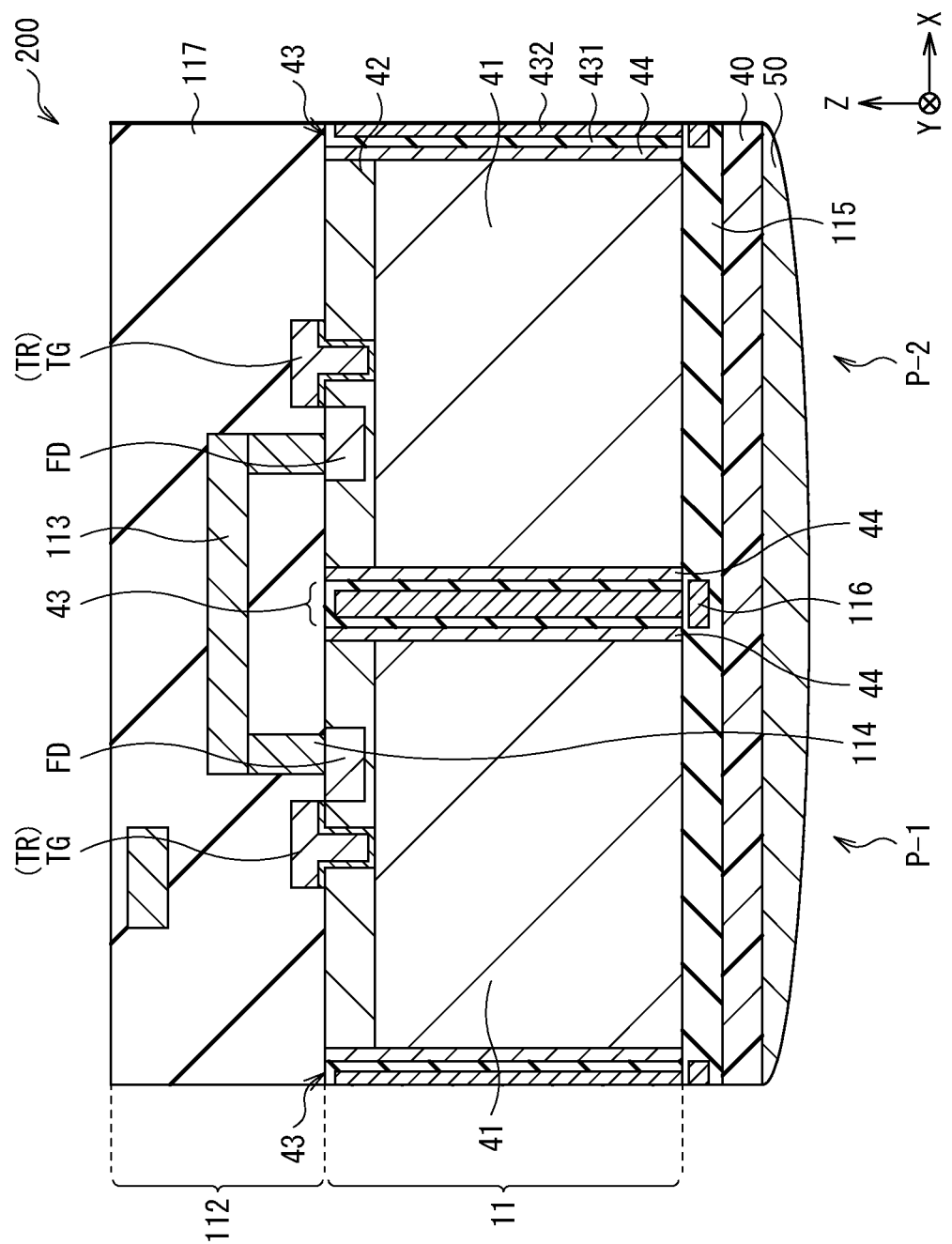

[FIG. 9]
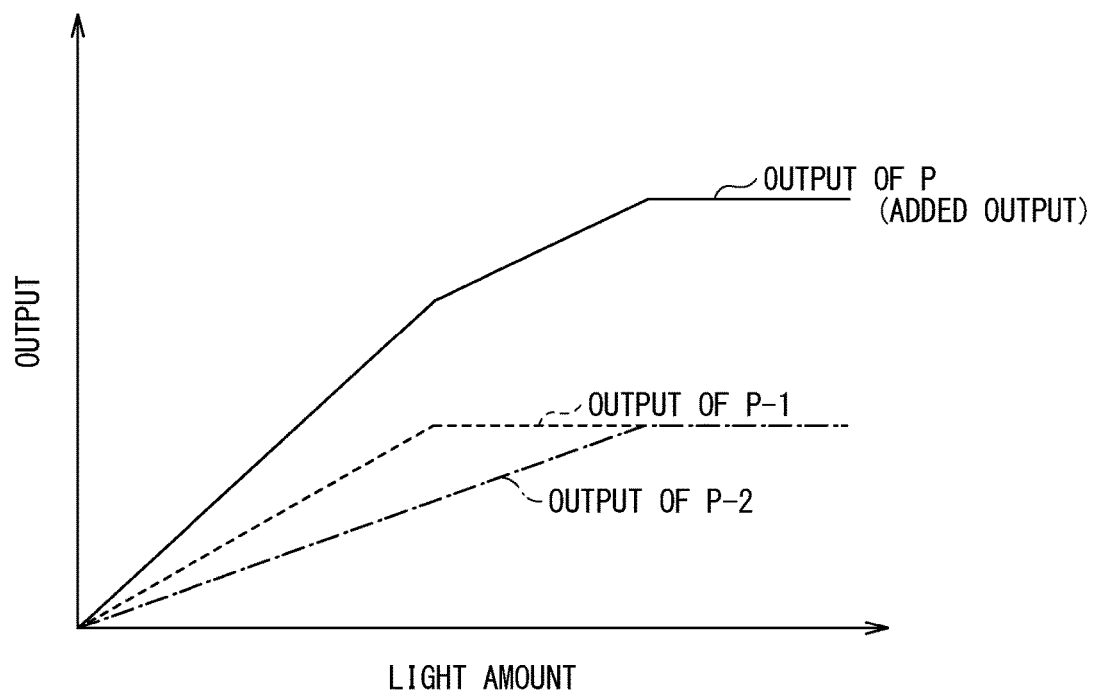

[FIG. 10A]
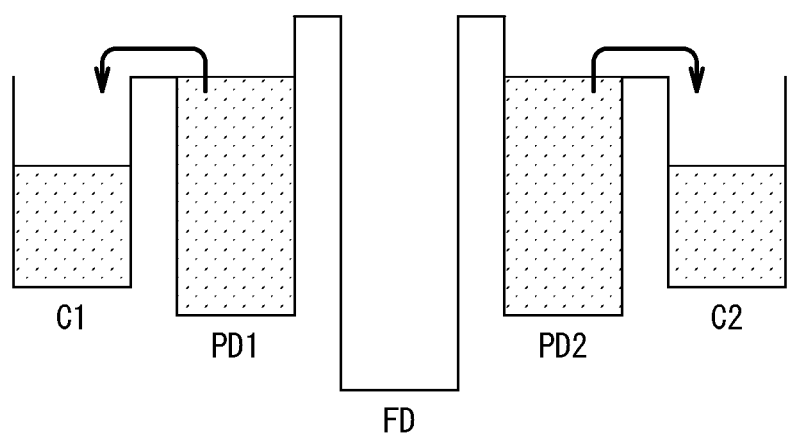
[FIG. 10B]
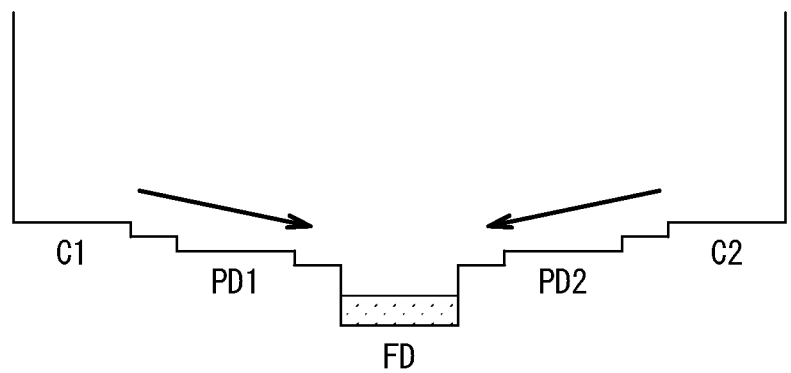

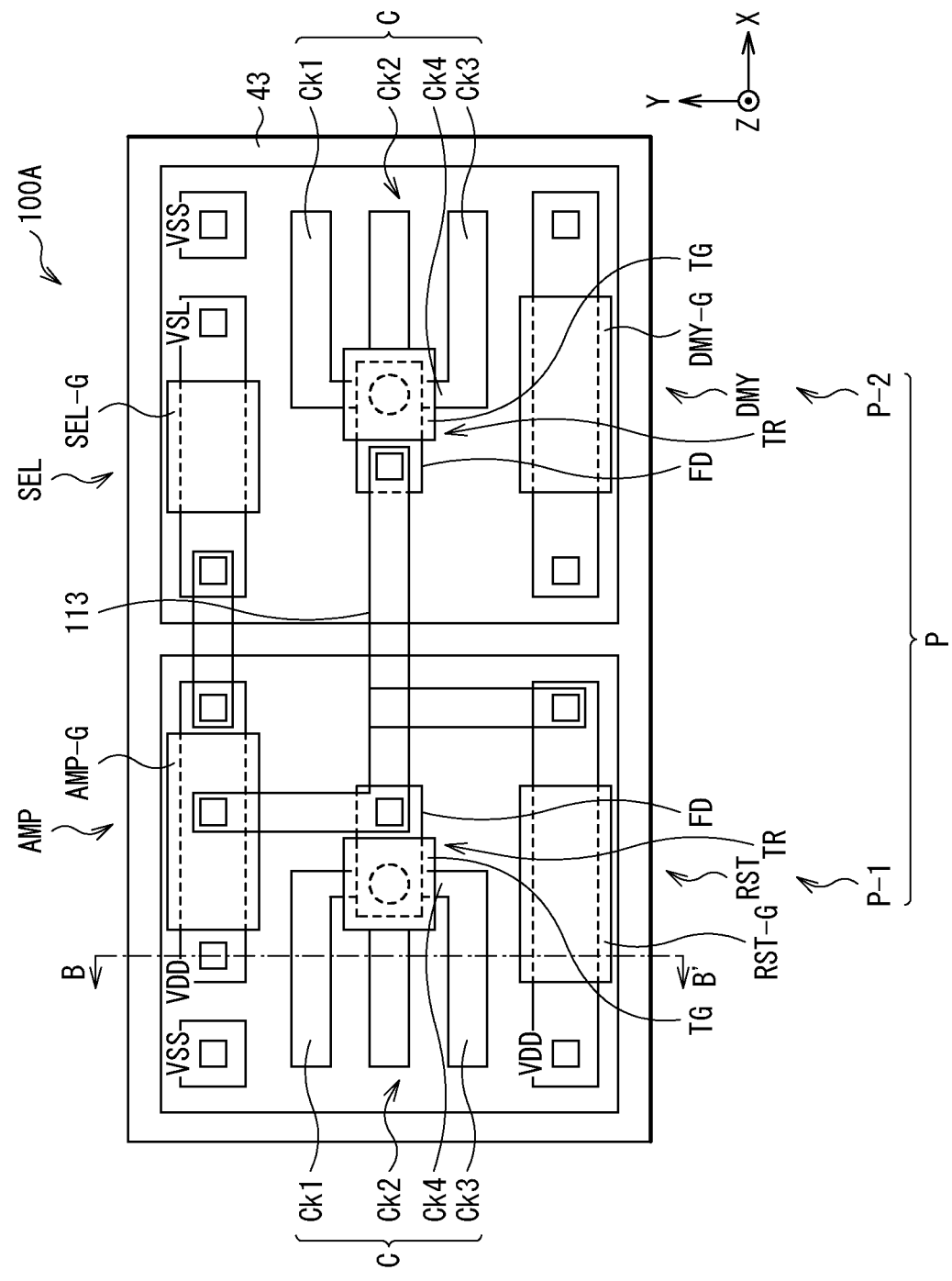
[FIG. 11A]

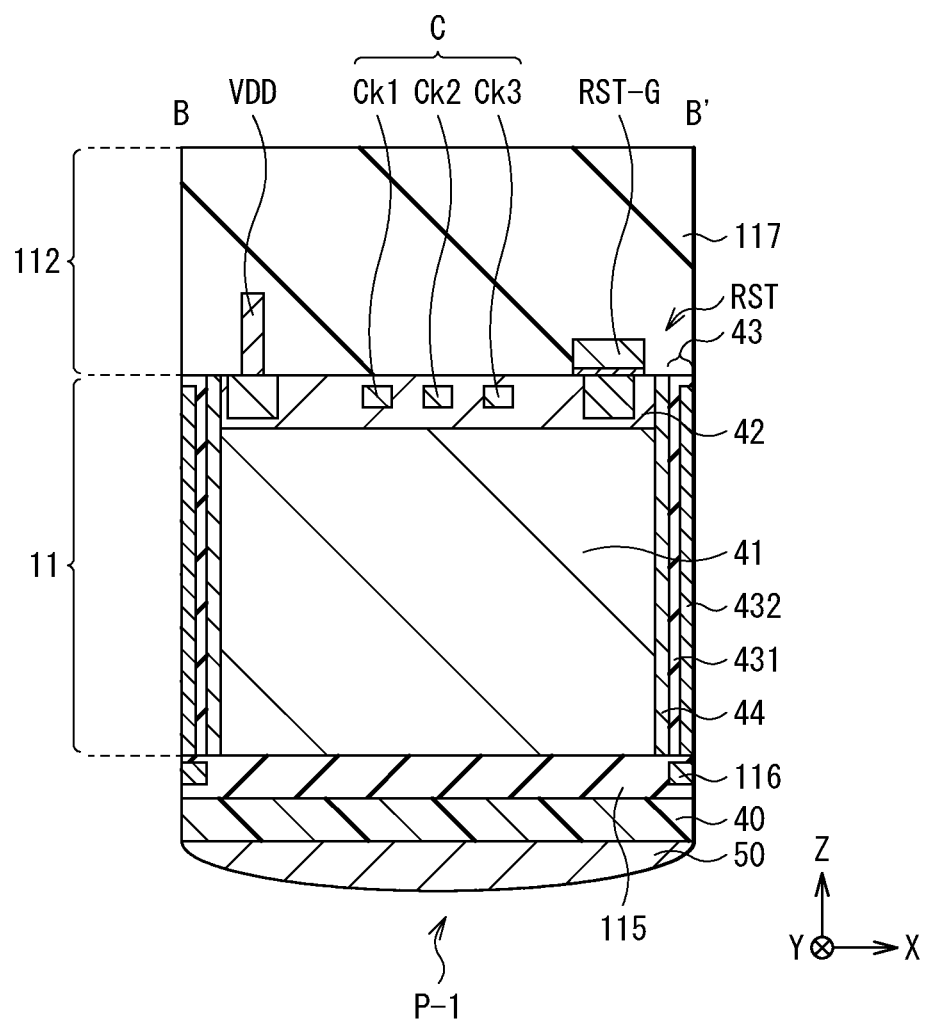
[FIG. 11B]

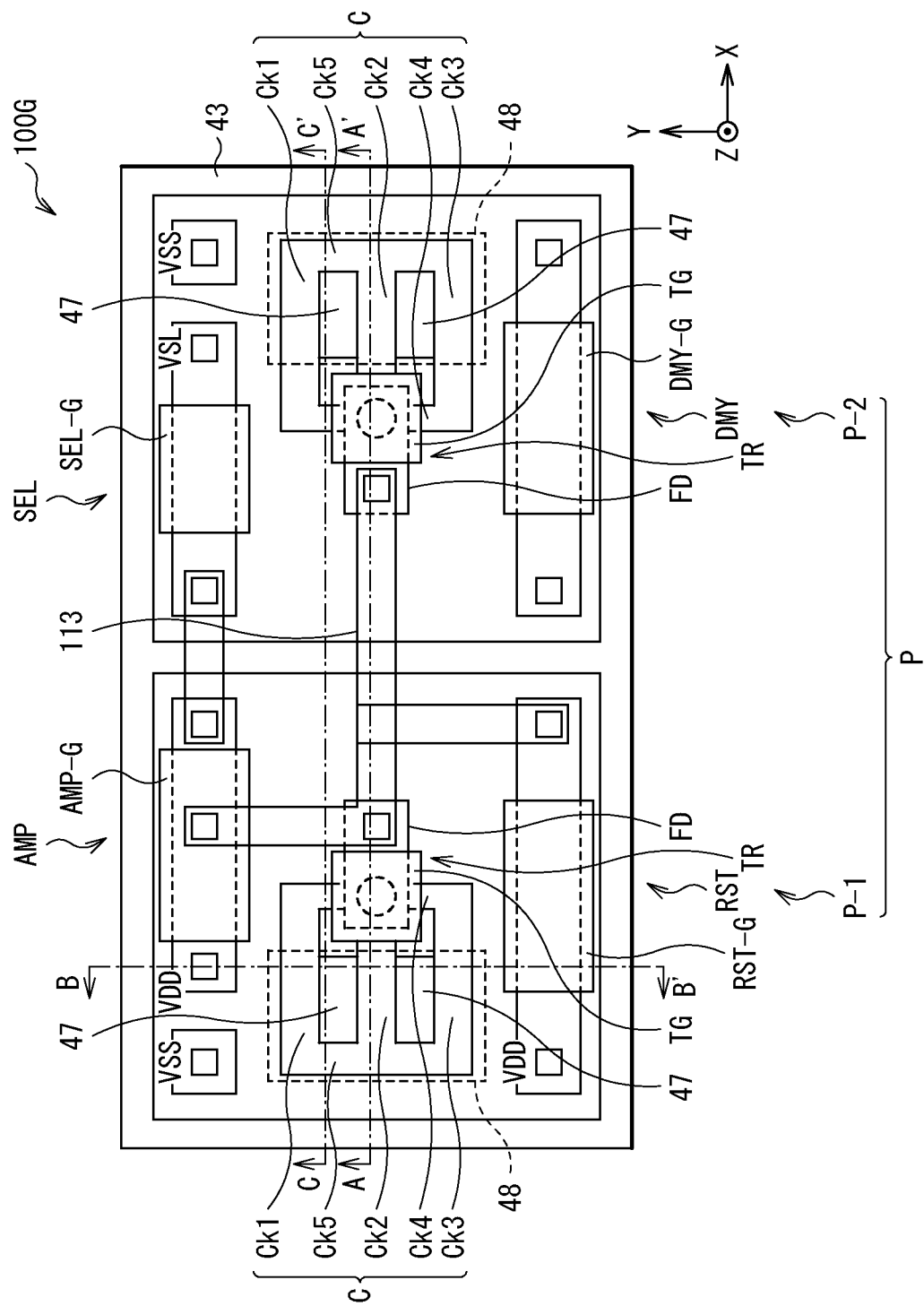
[FIG. 12A]

[FIG. 12B]
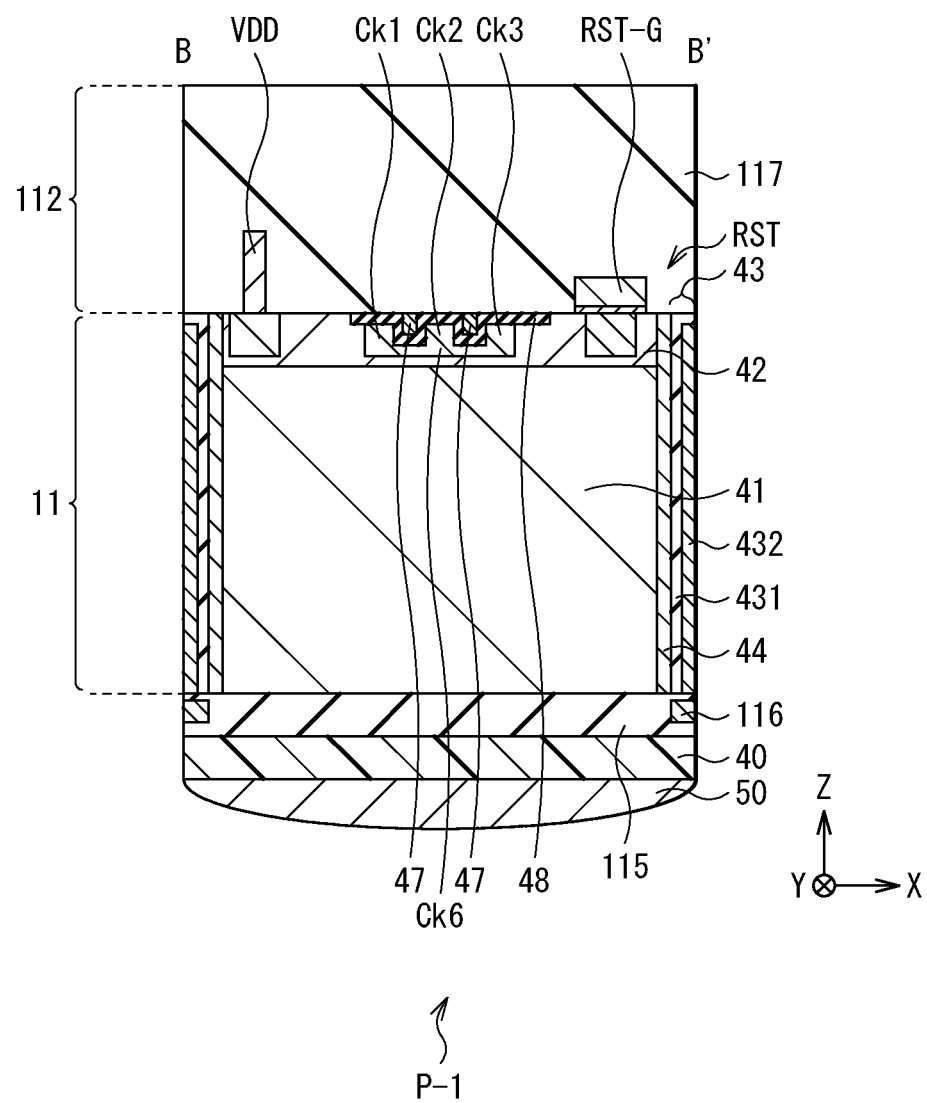

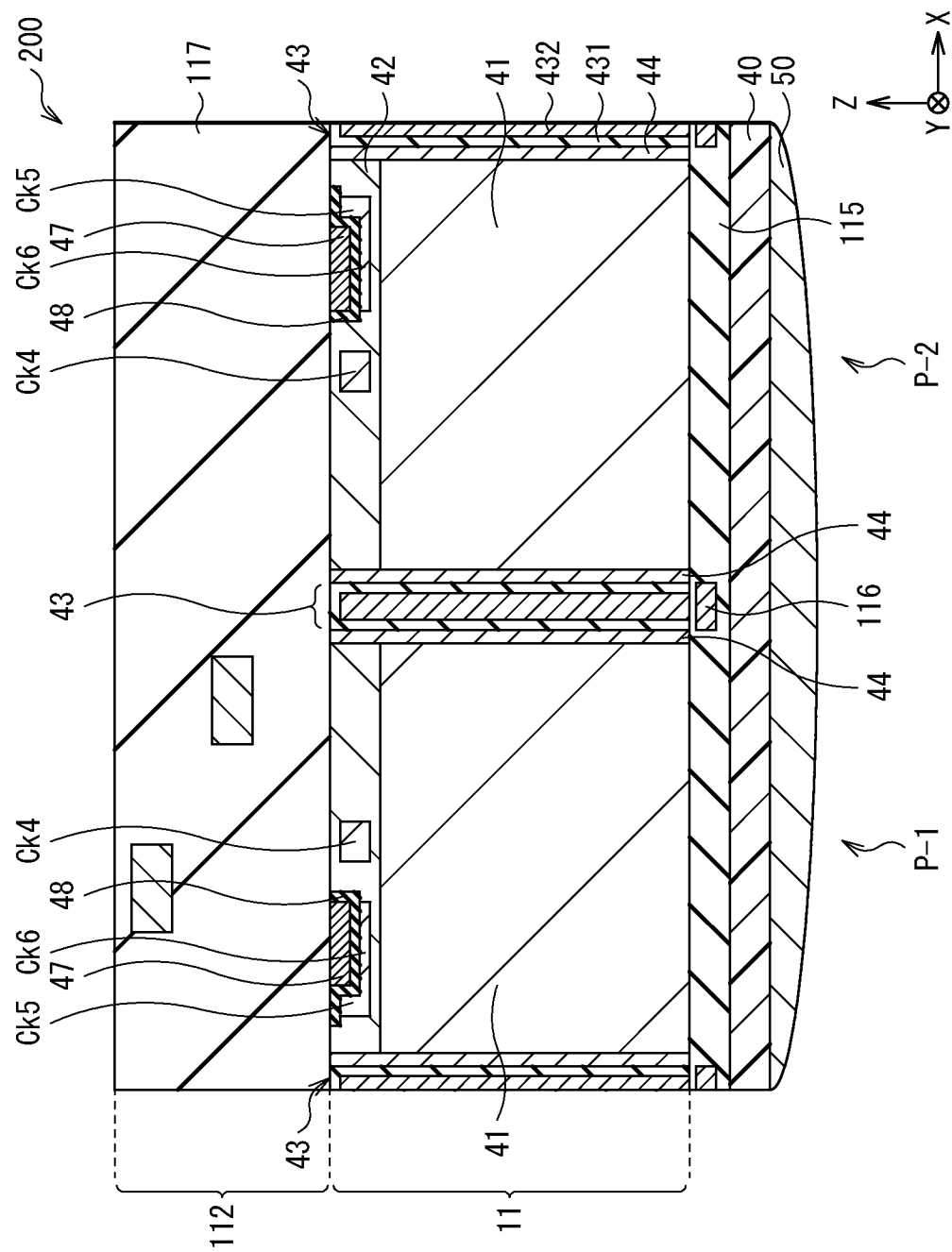
[FIG. 12C]

[FIG. 13]
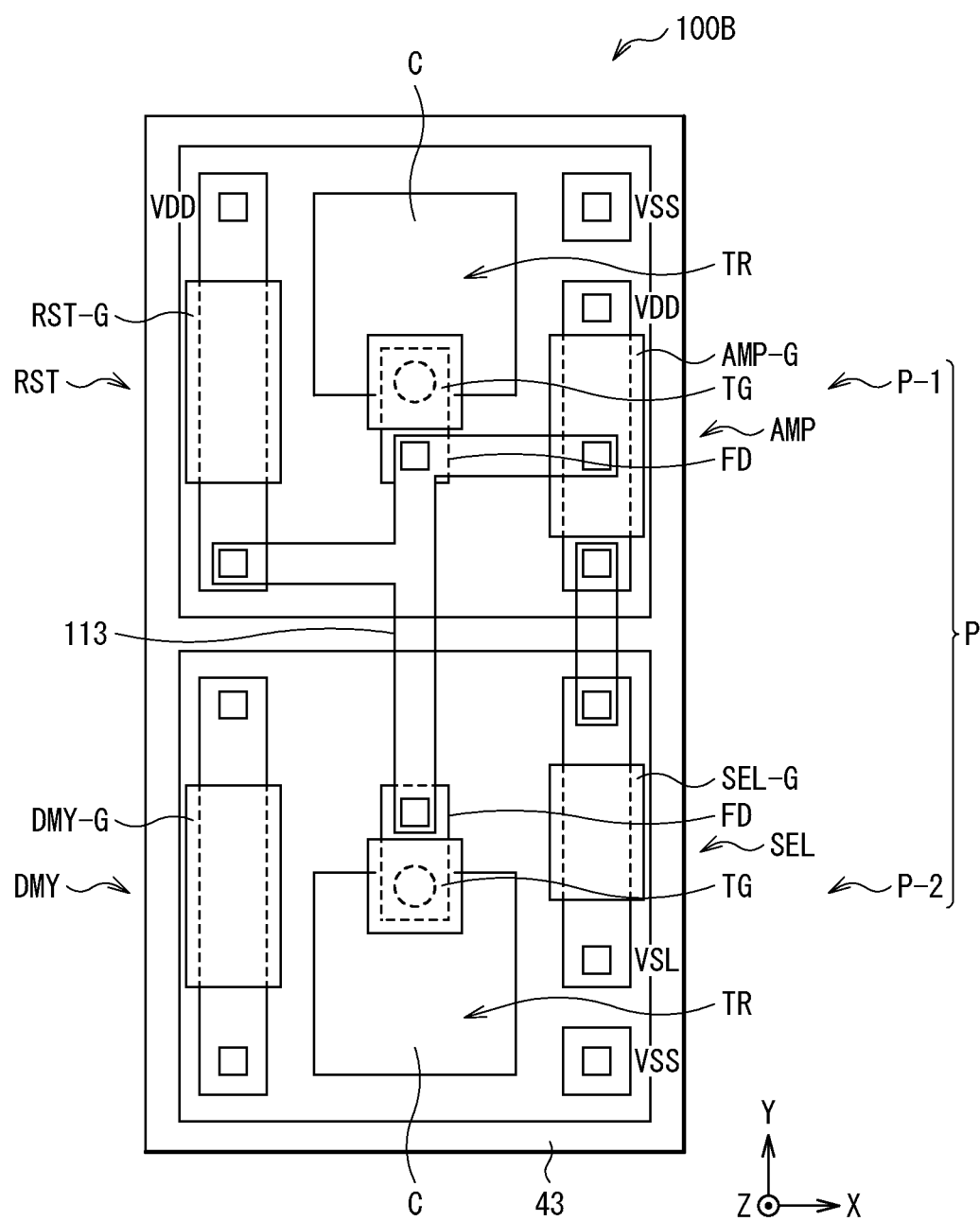

[FIG. 14]
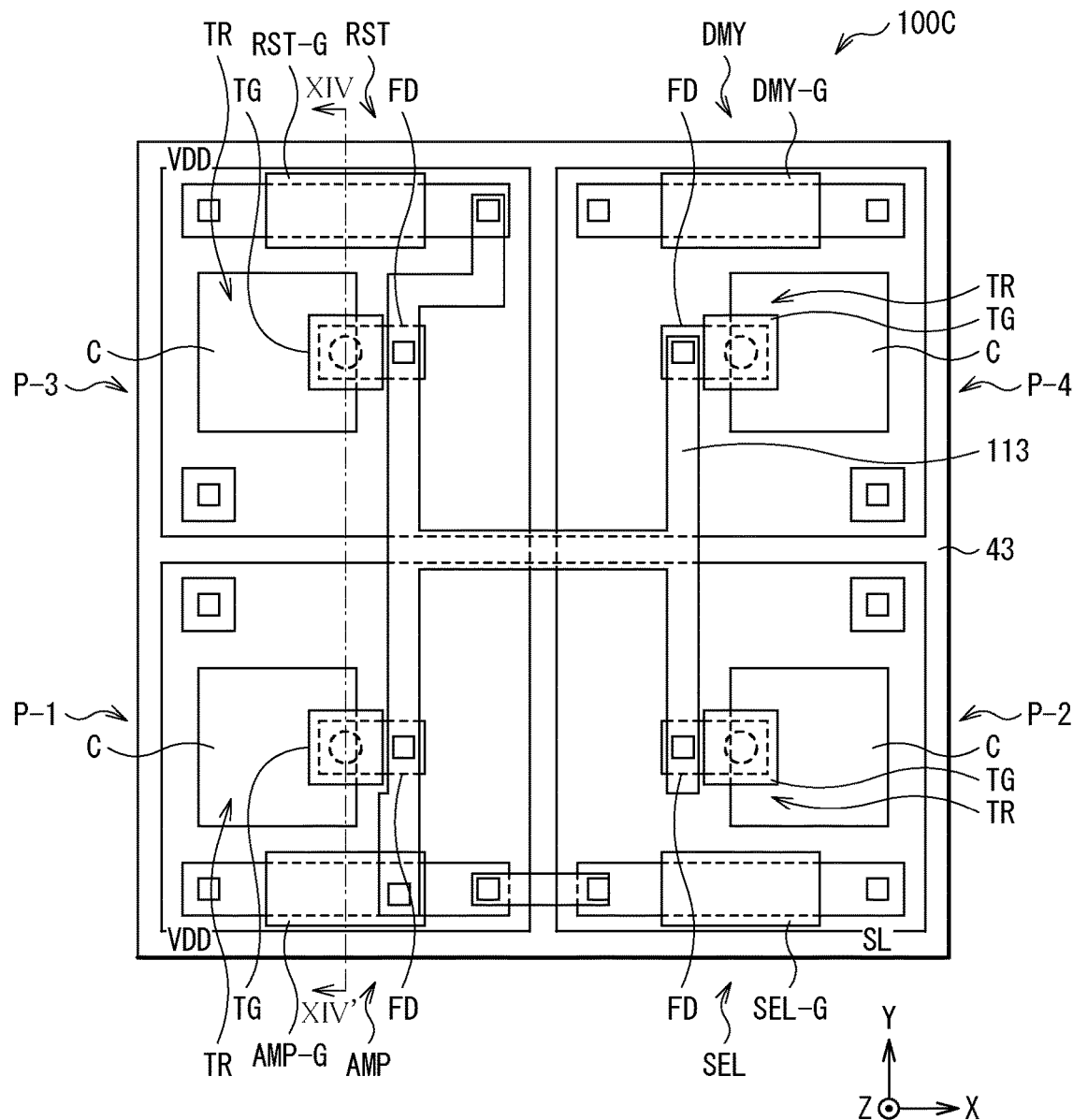

[FIG. 15]
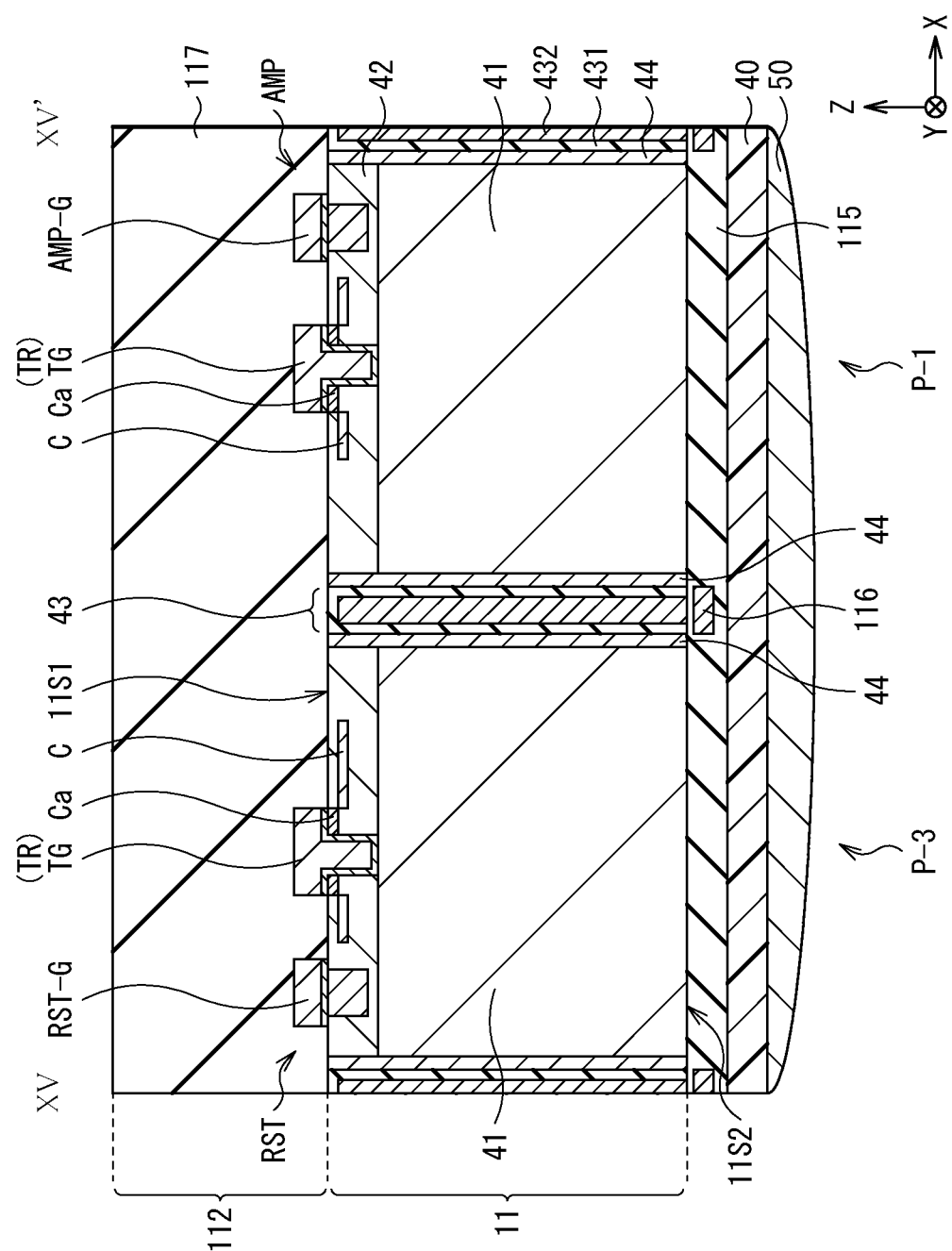

[FIG. 16]
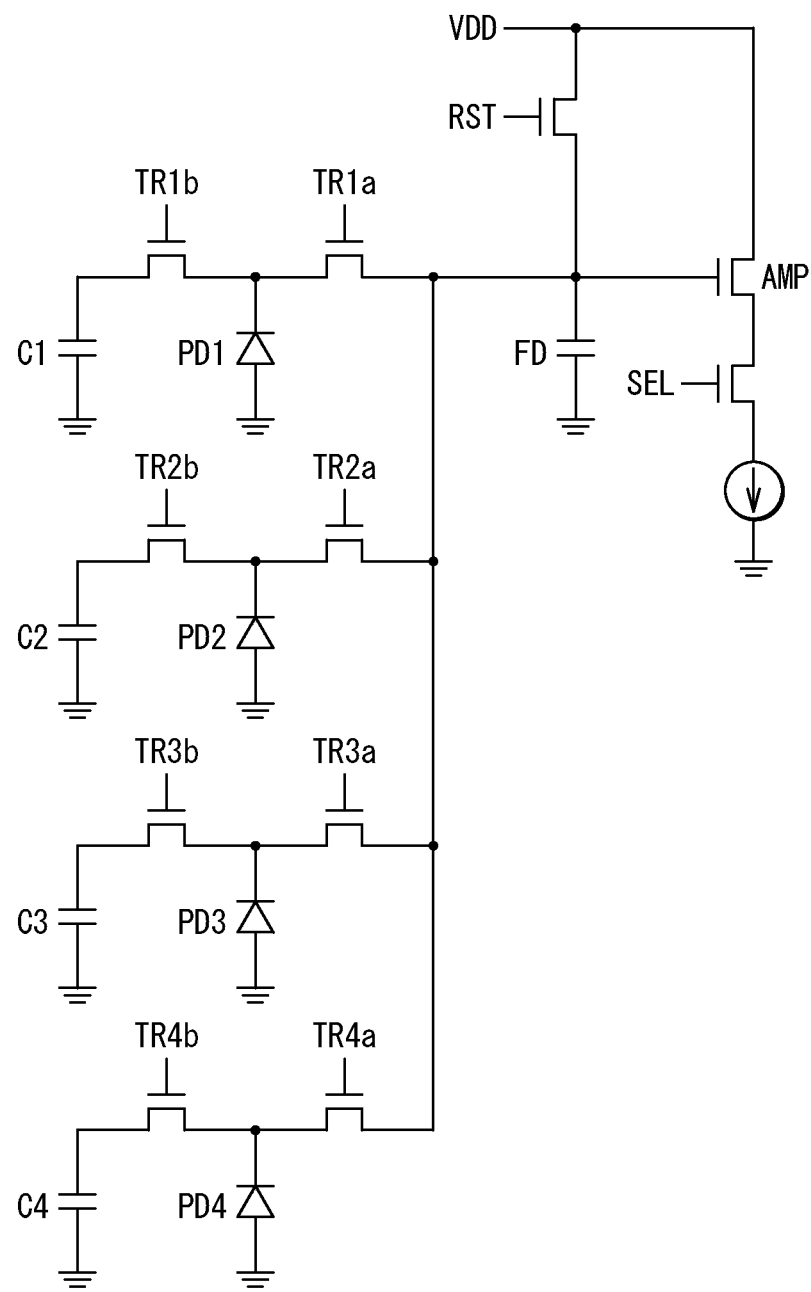

[FIG. 17]
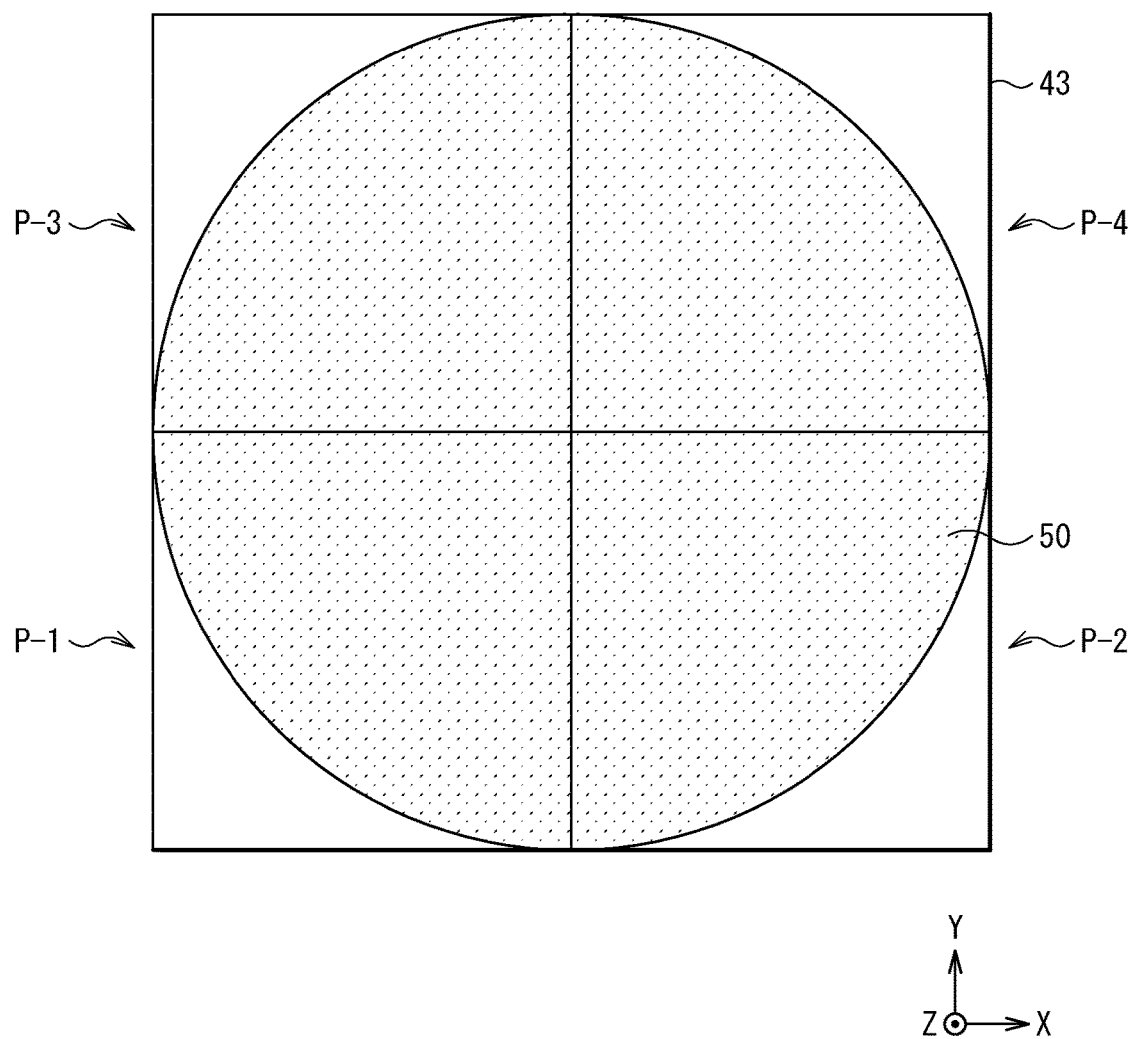

[FIG. 18]
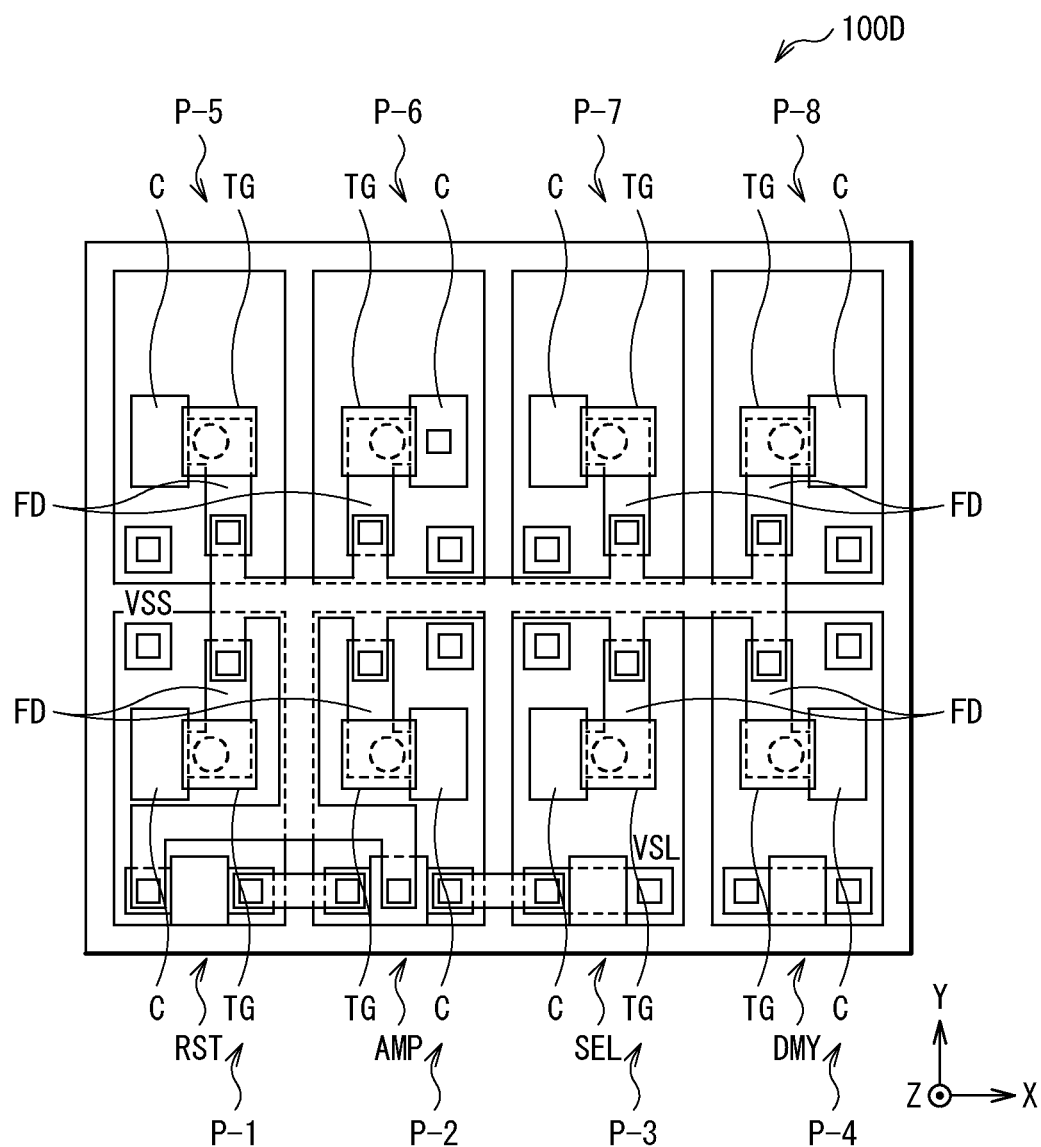

[FIG. 19]
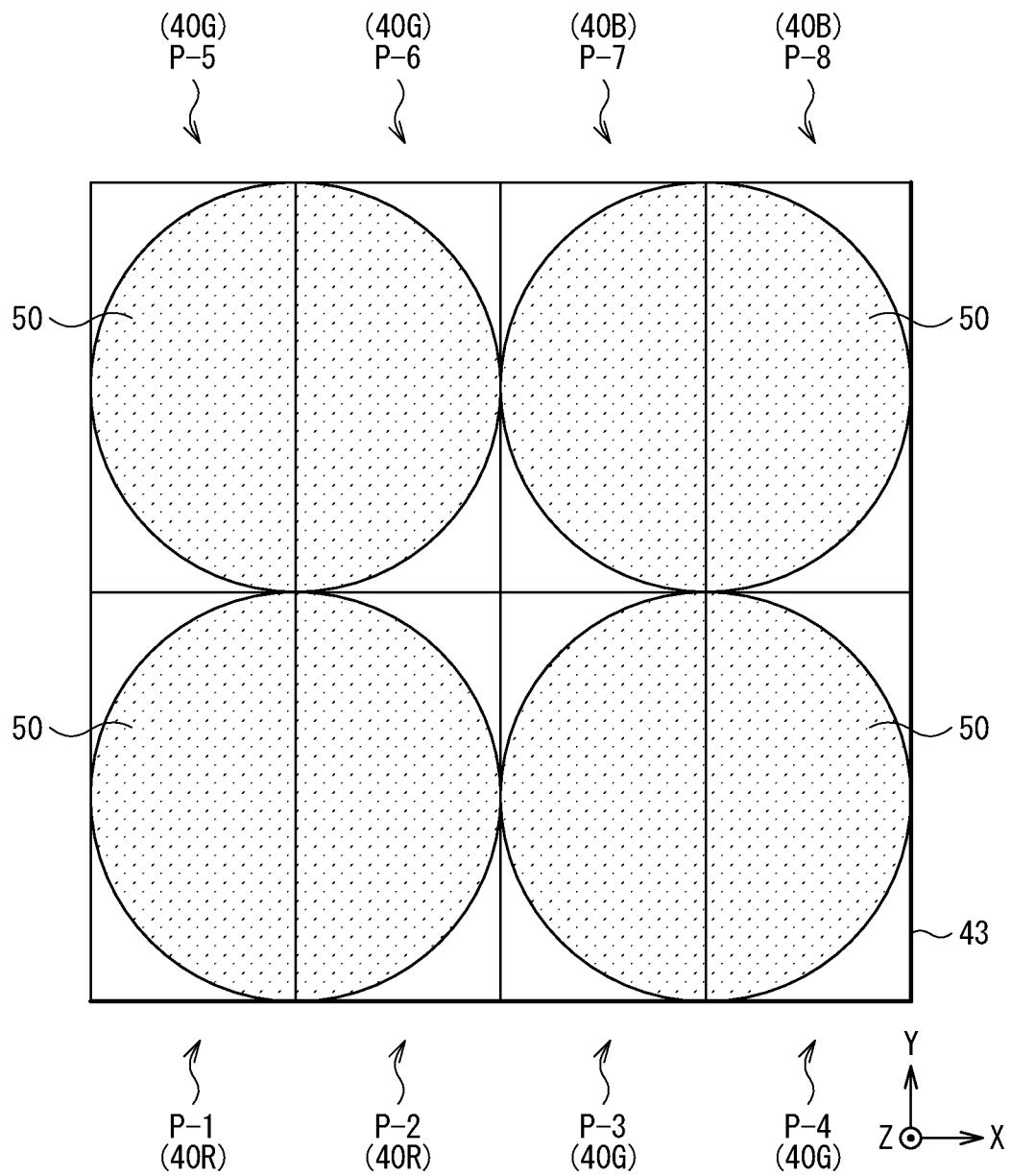

[FIG. 20]
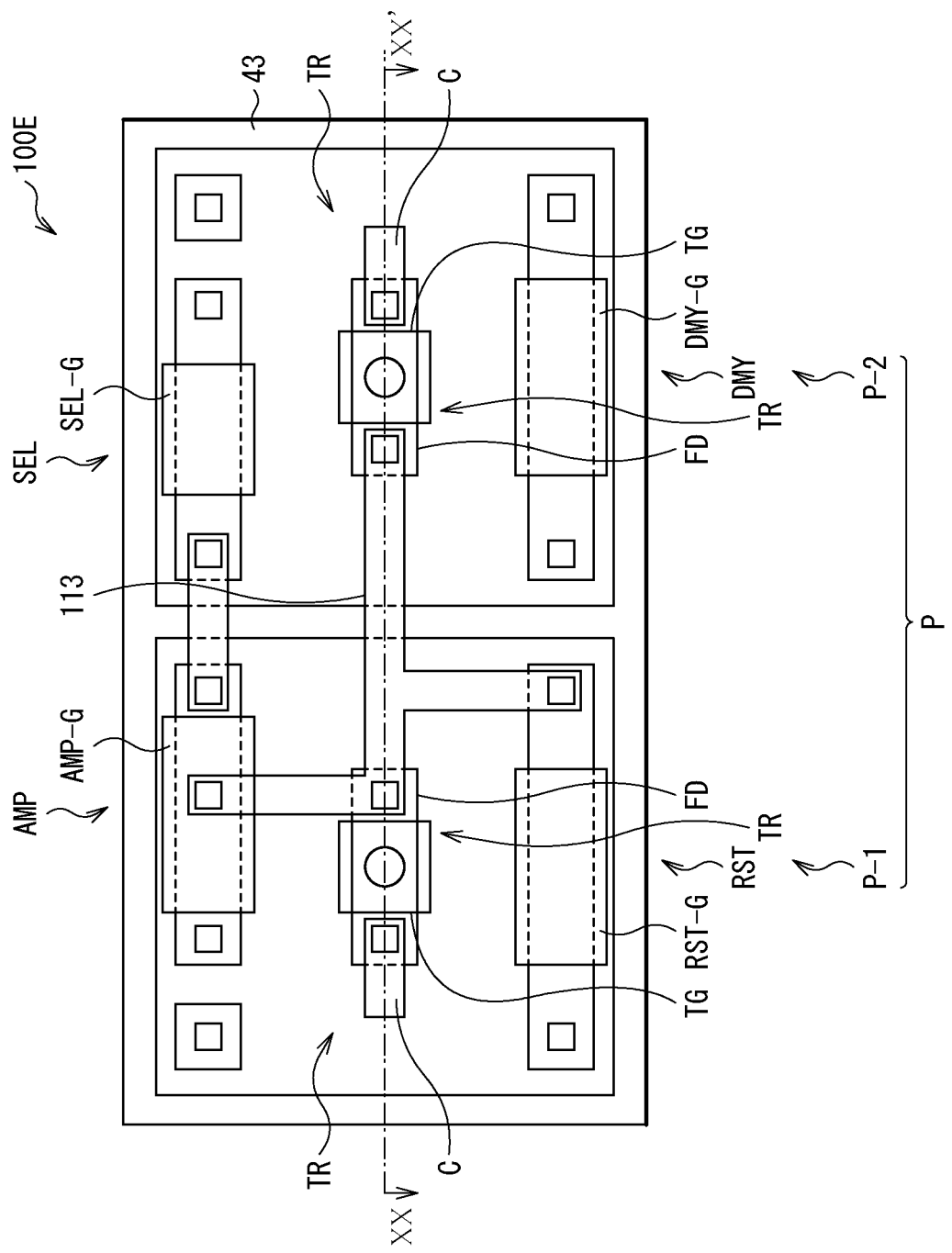

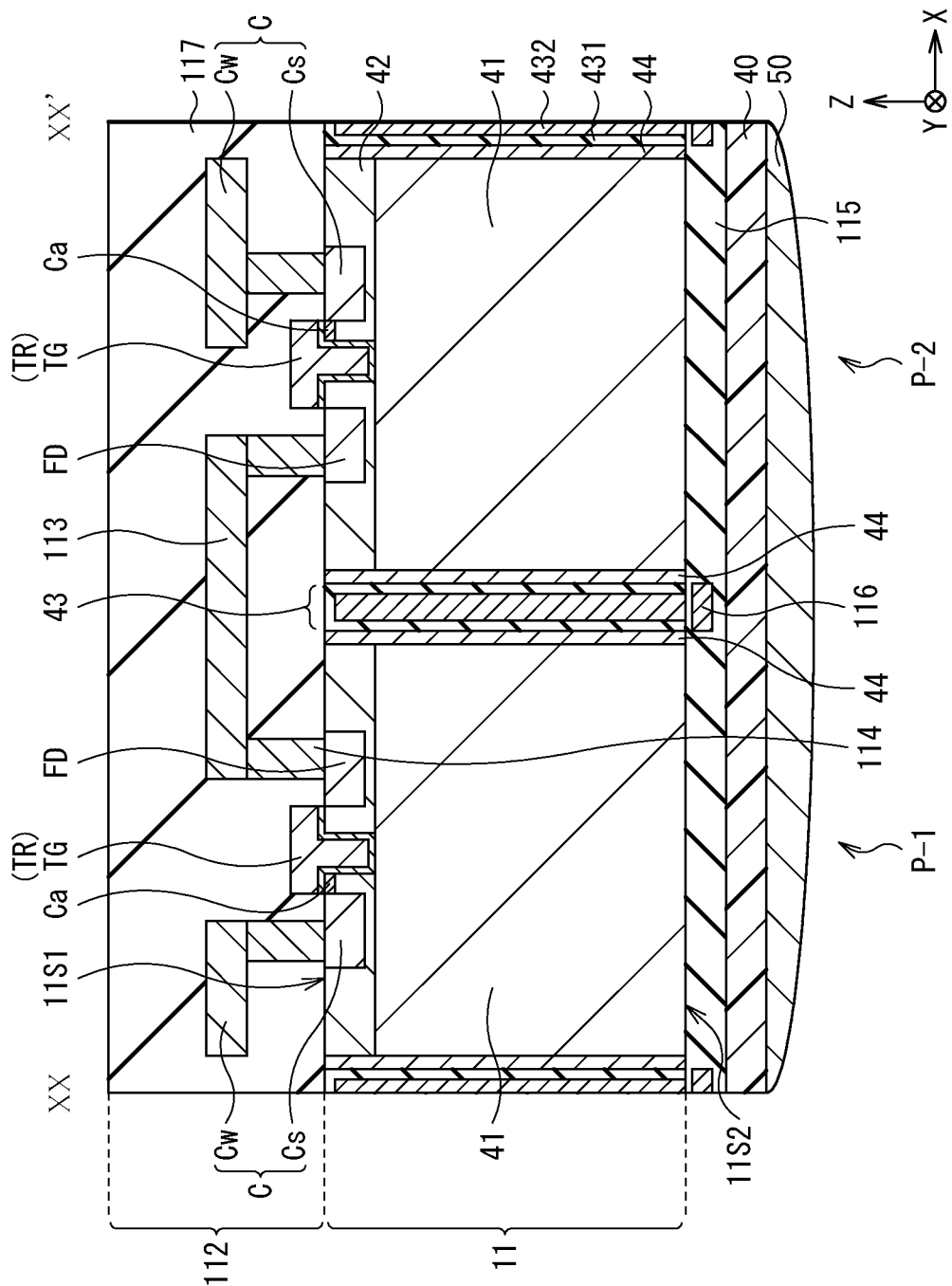
[FIG. 21]

[FIG. 22]
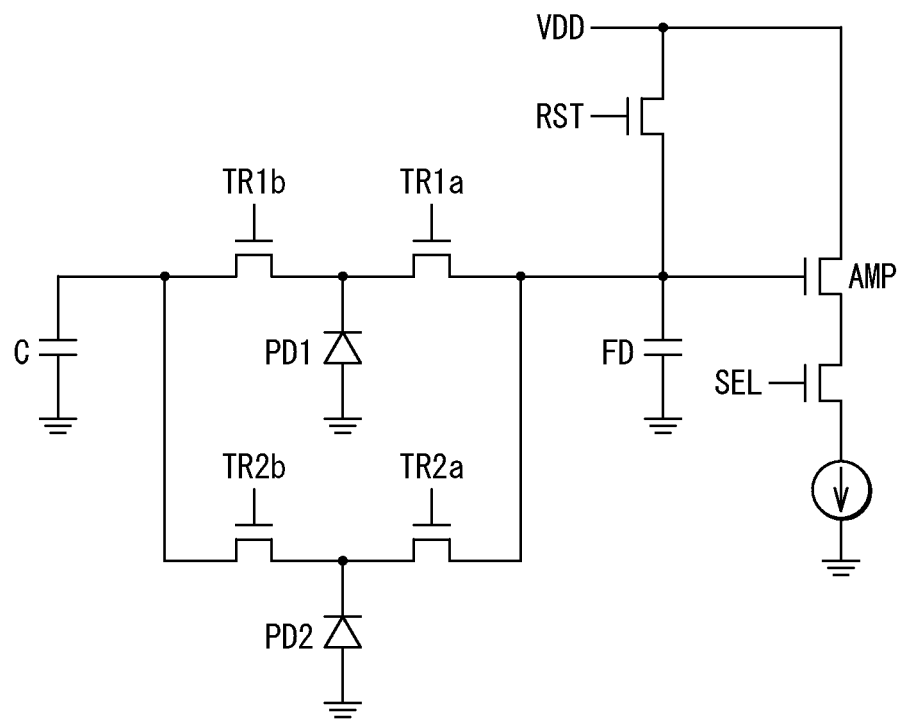

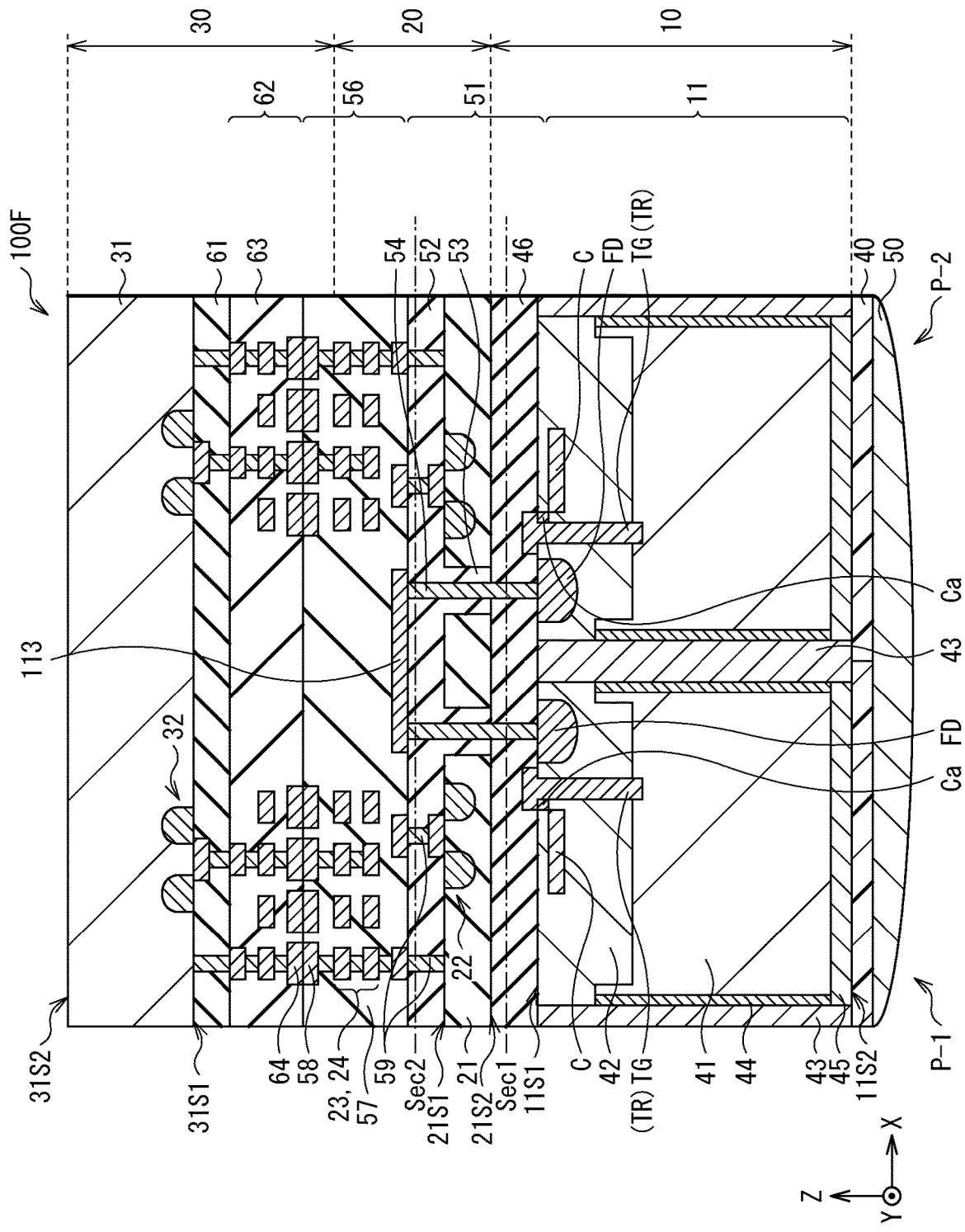
[FIG. 23]

[FIG. 24]
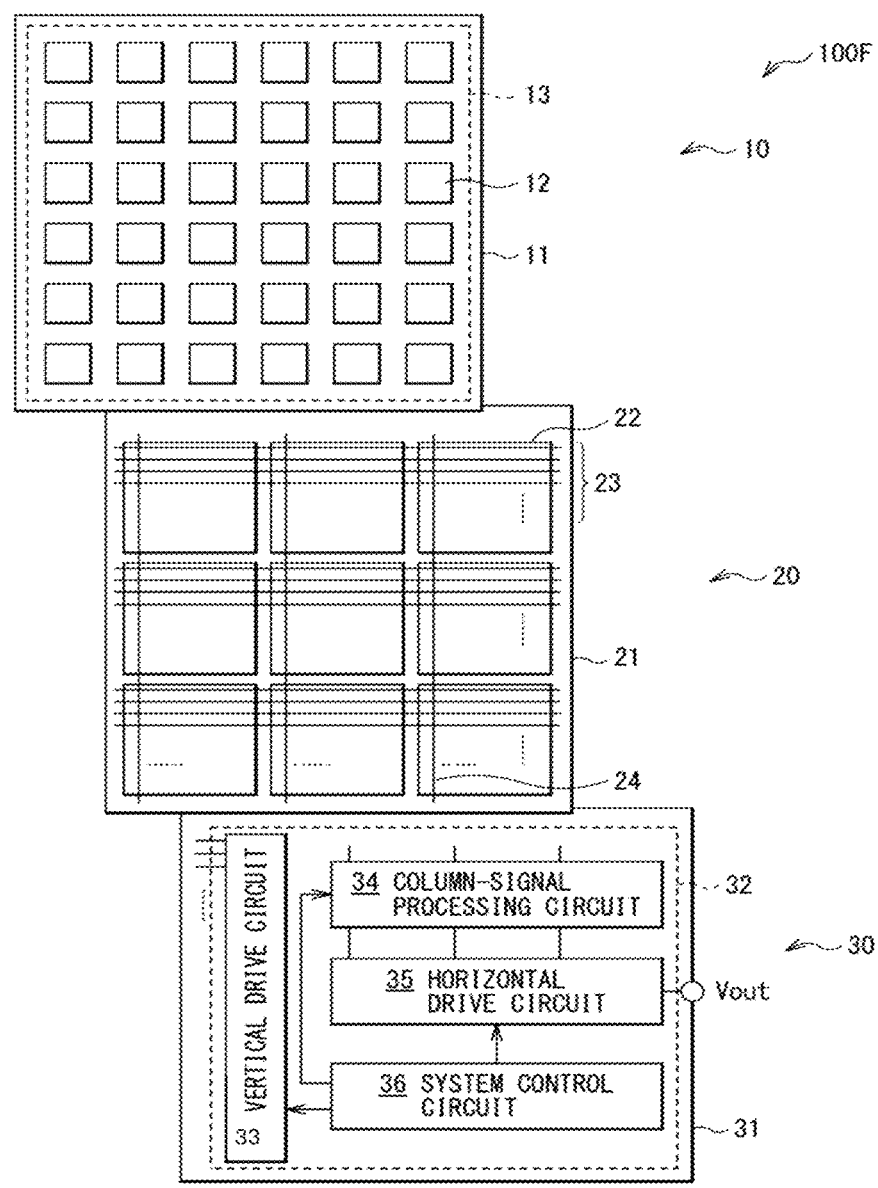

[FIG. 25]
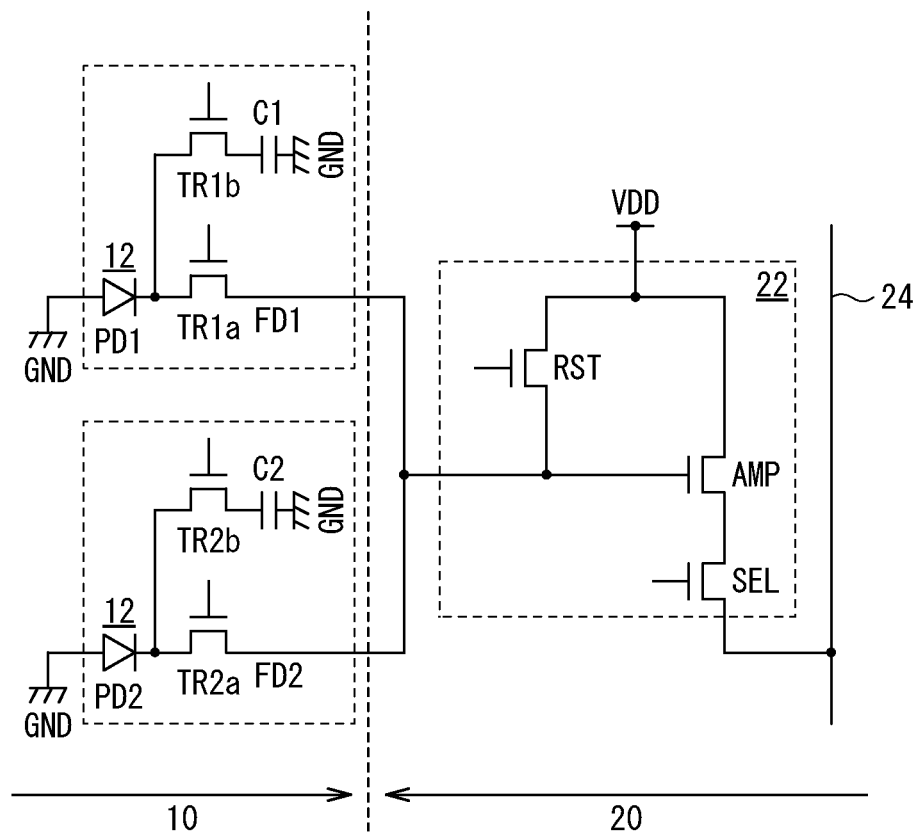

[FIG. 26]
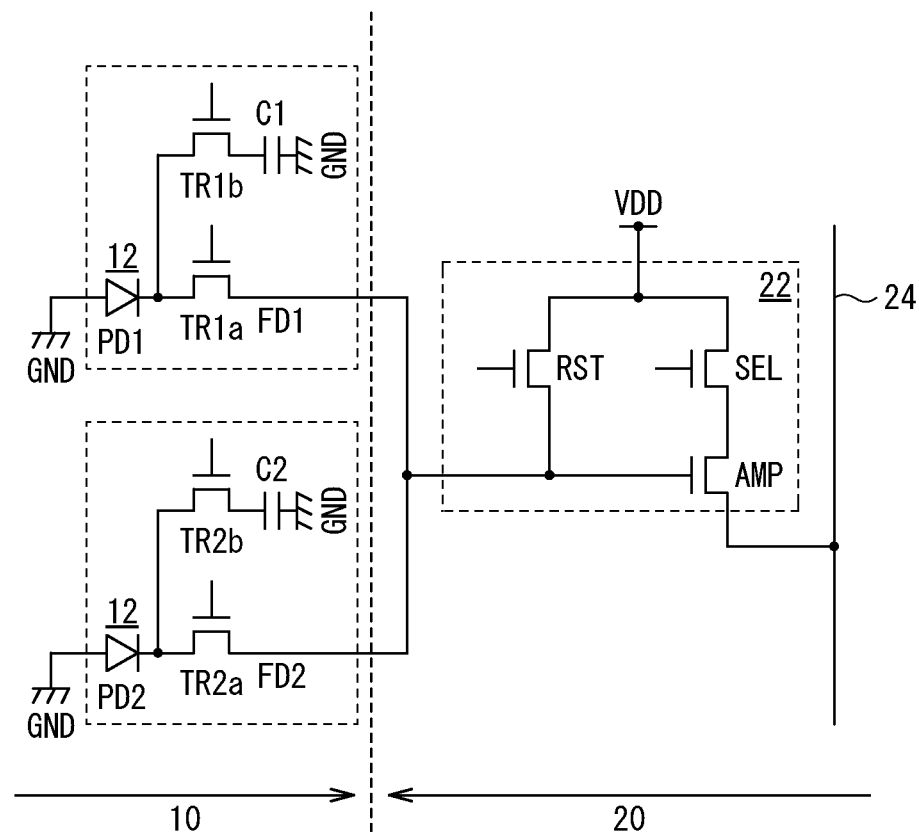

[FIG. 27]
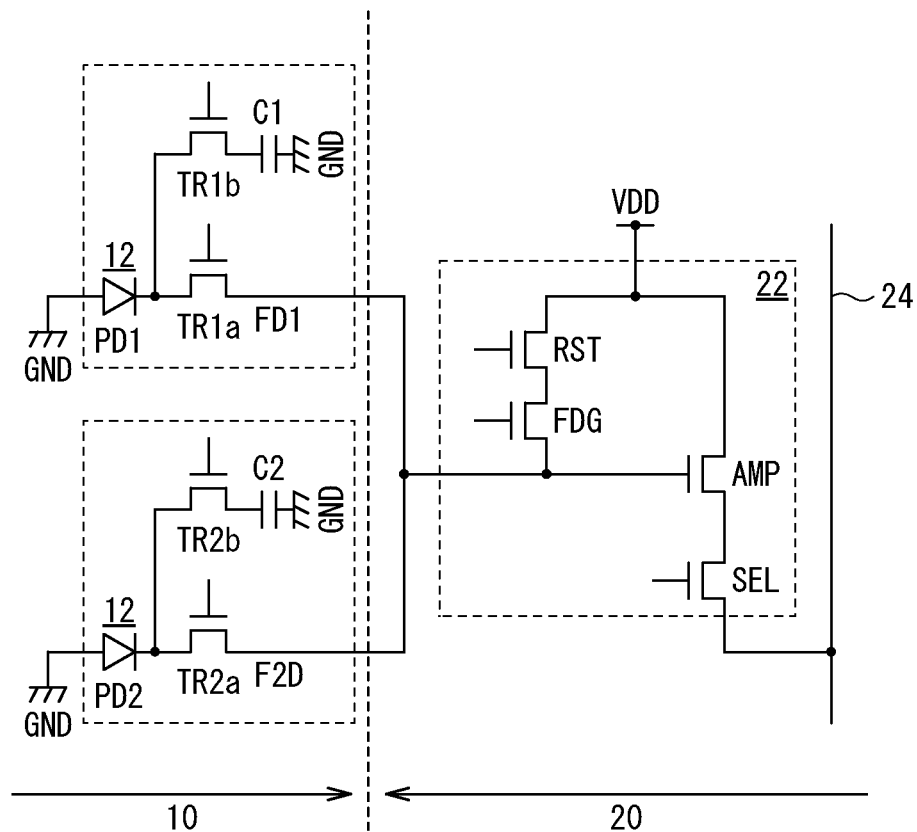

[FIG. 28]
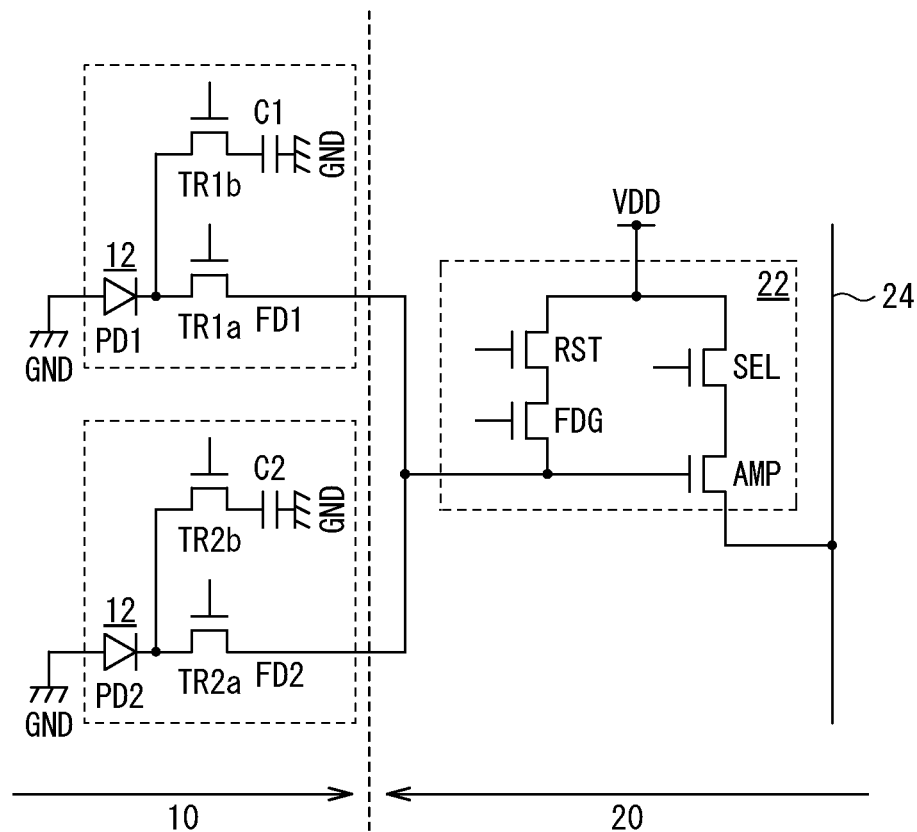

[FIG. 29]
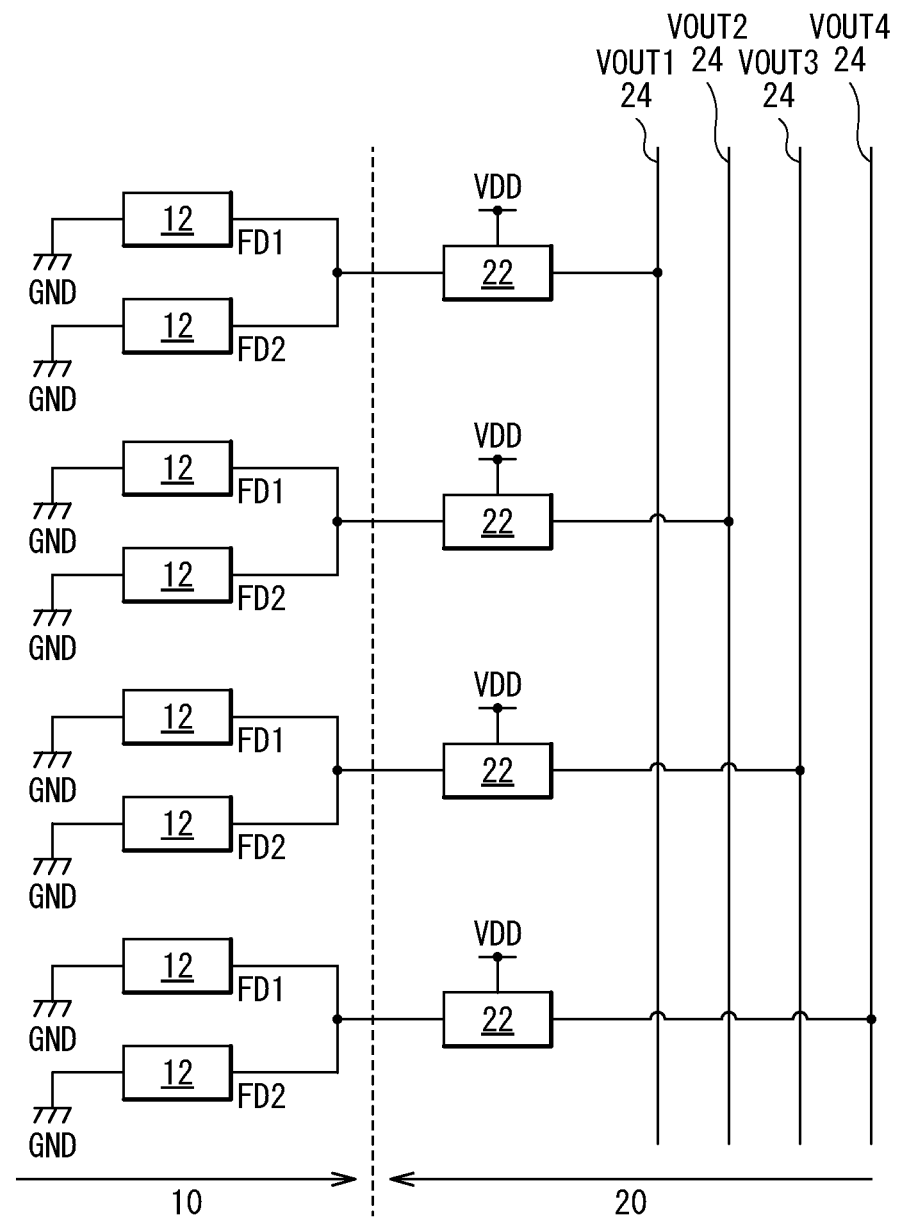

[FIG. 30]
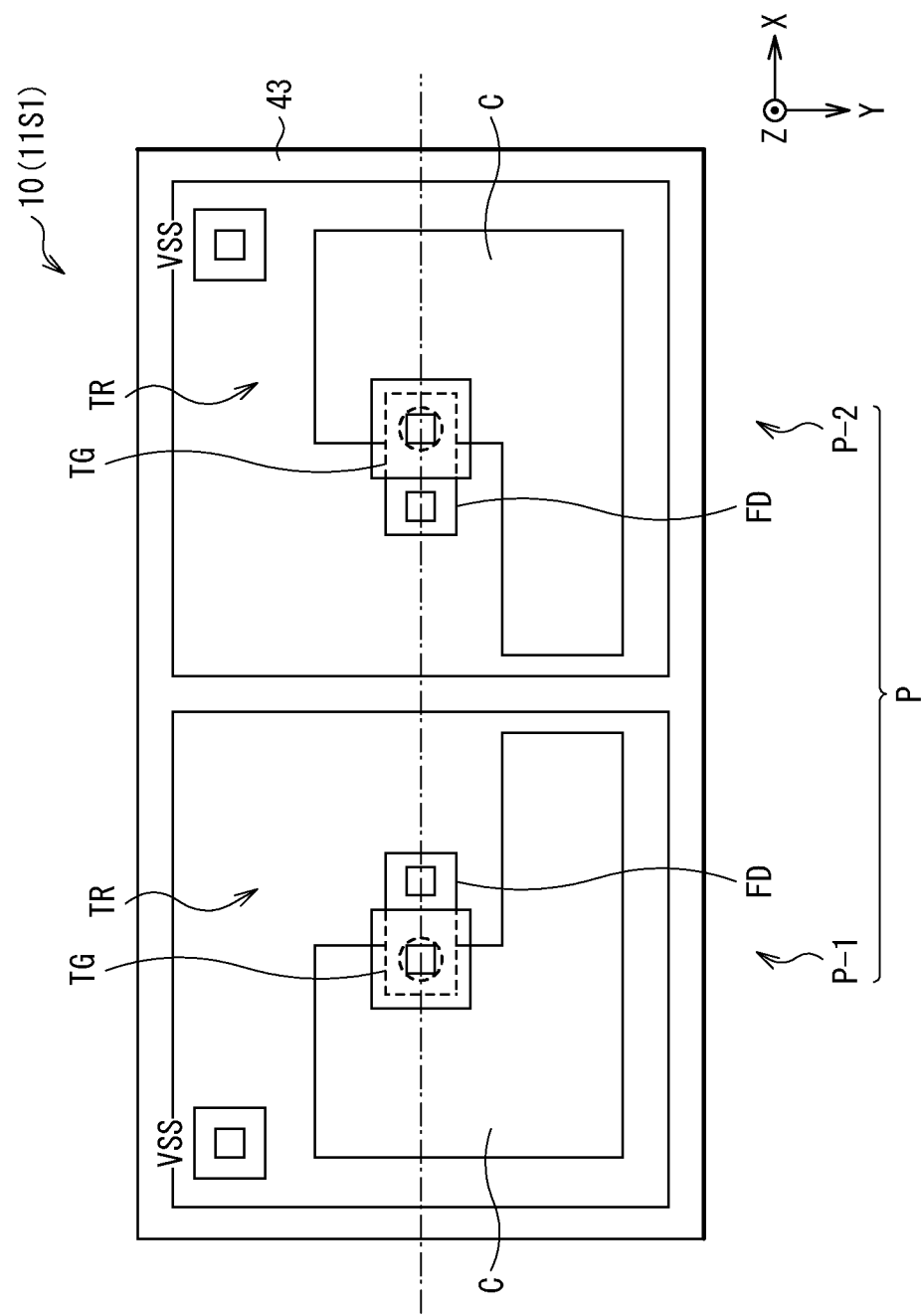

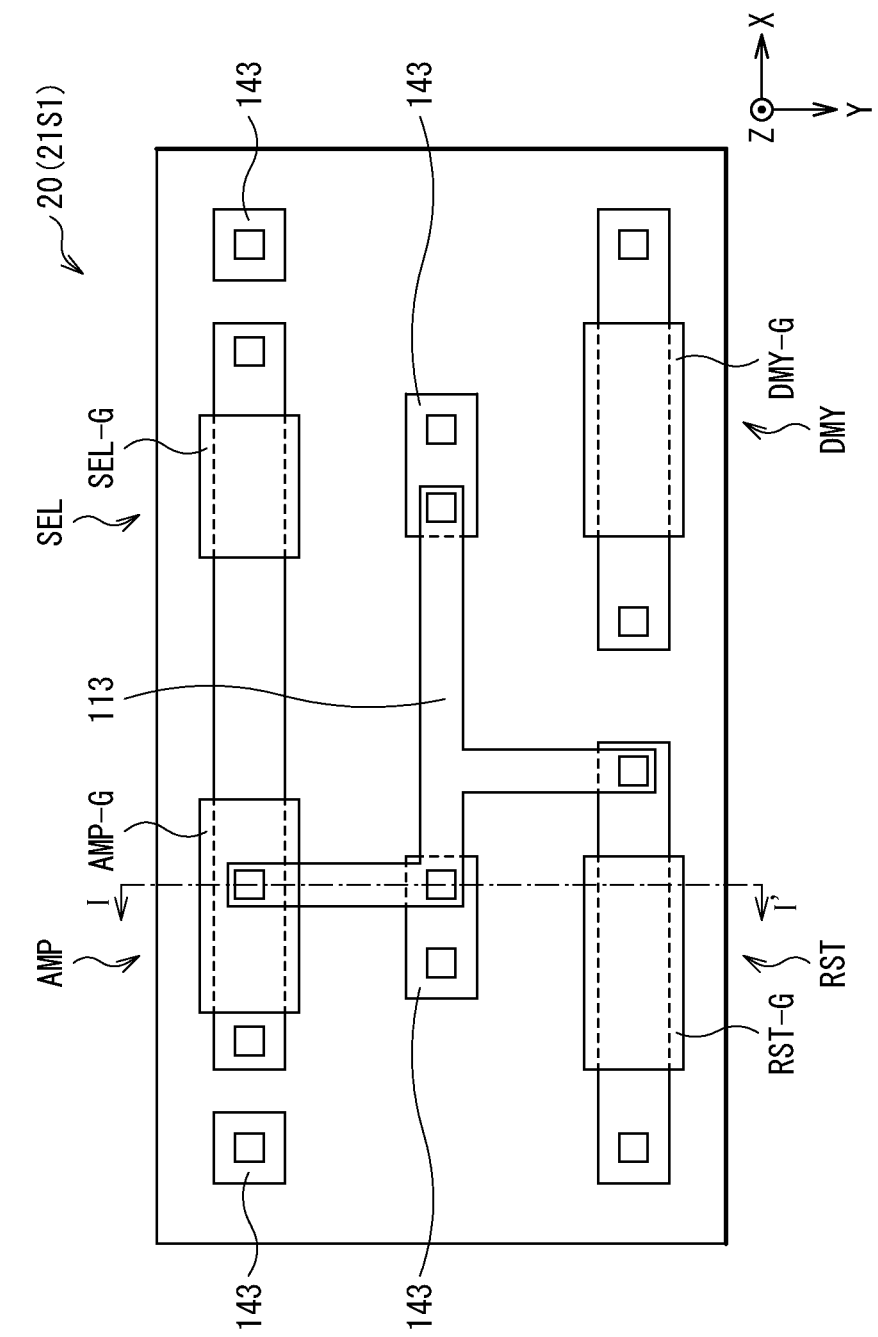
[FIG. 31]

[FIG. 32]
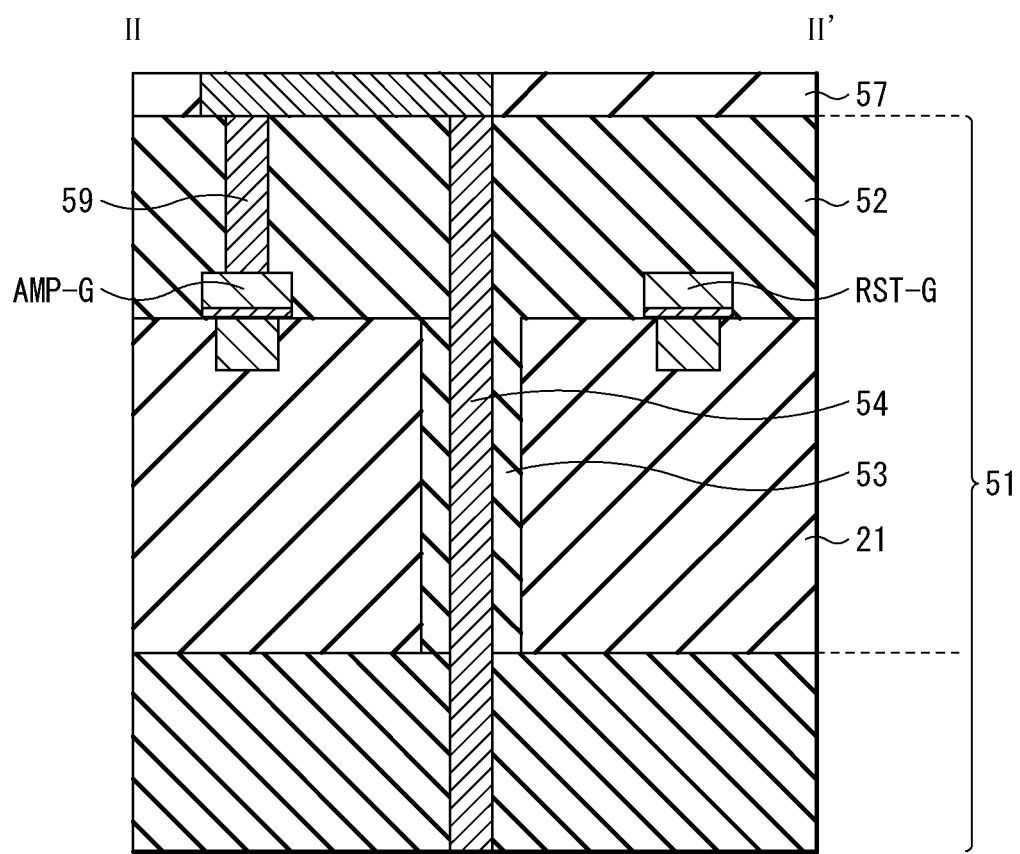

[FIG. 33]
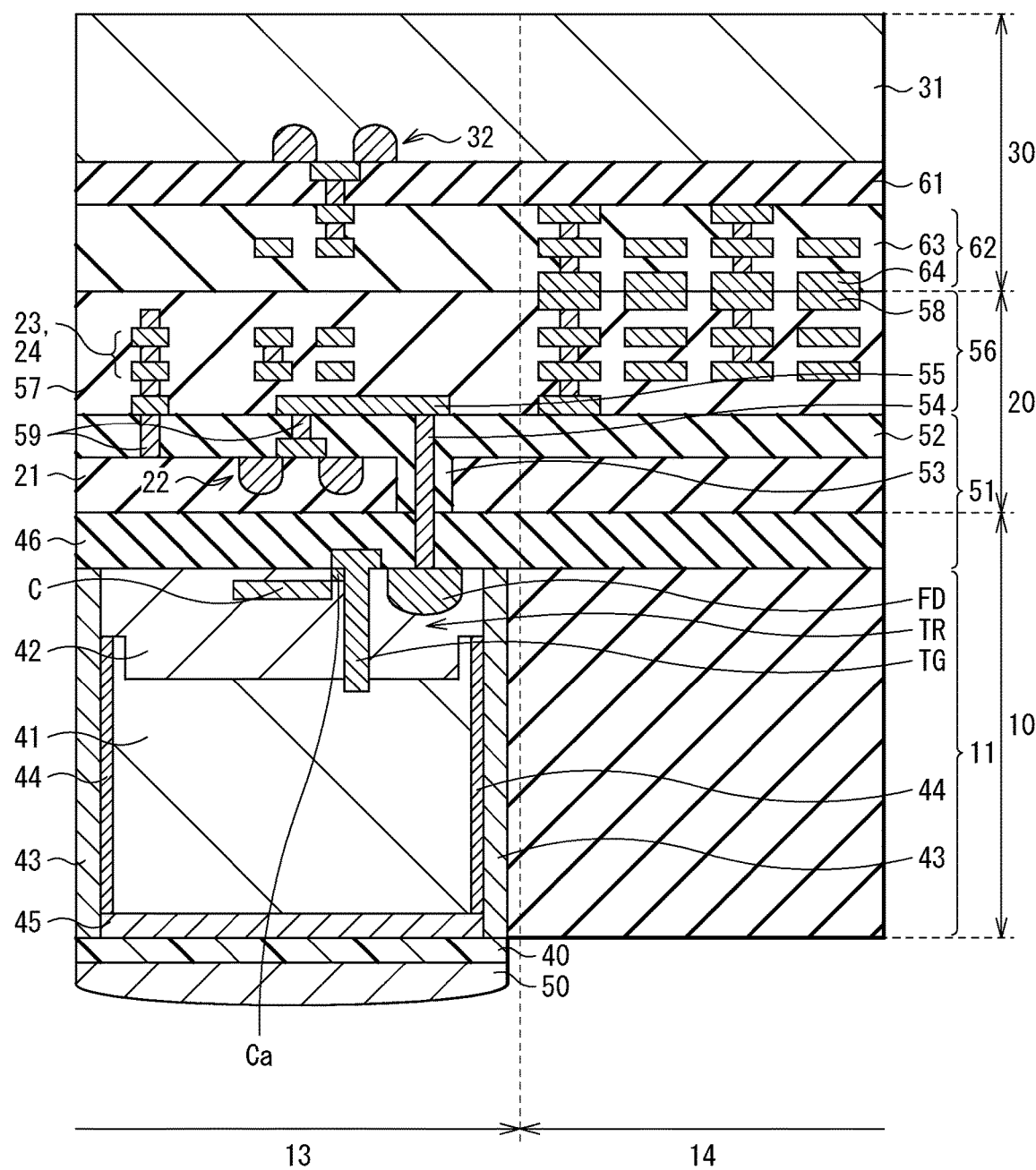

[FIG. 34]
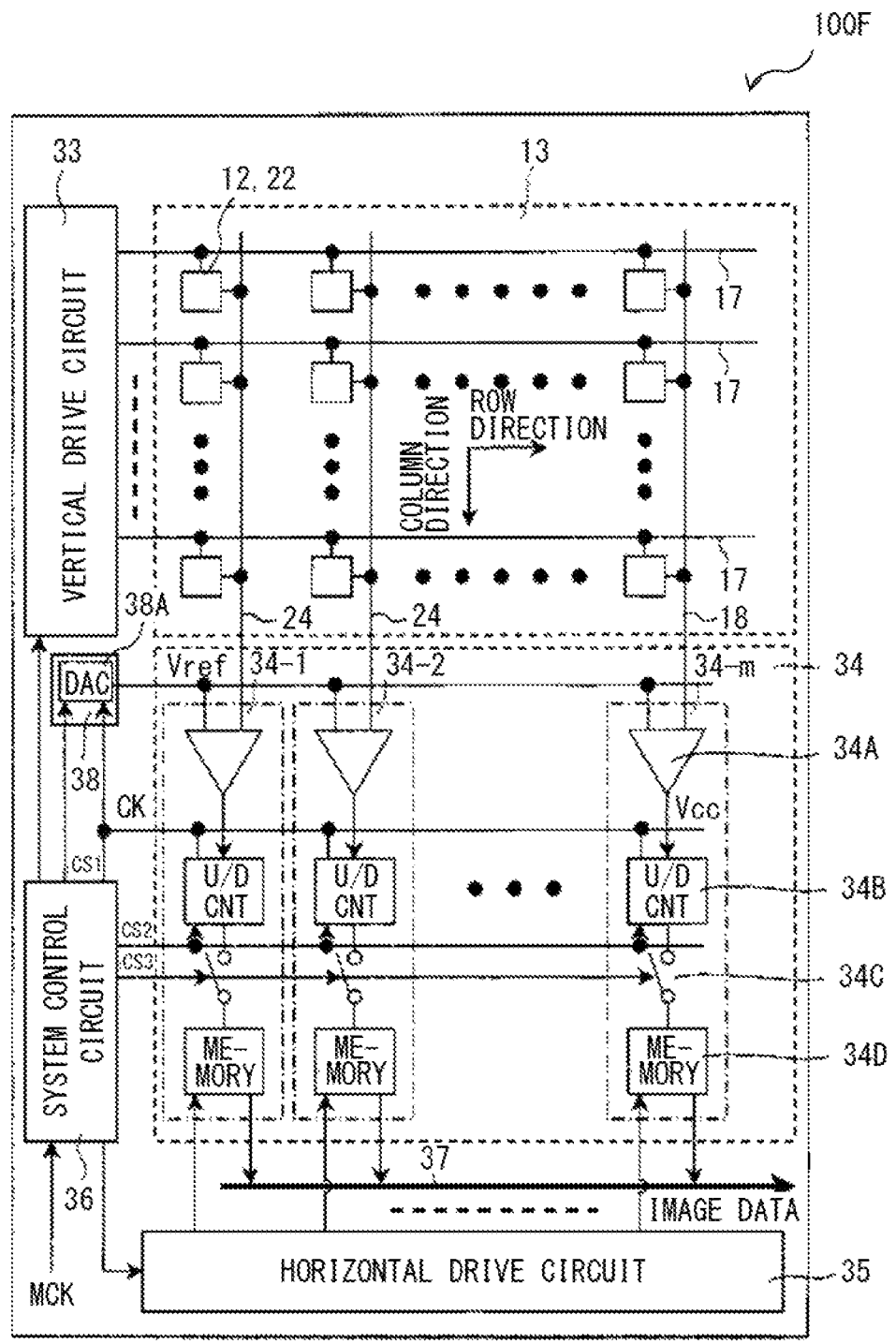

[FIG. 35]
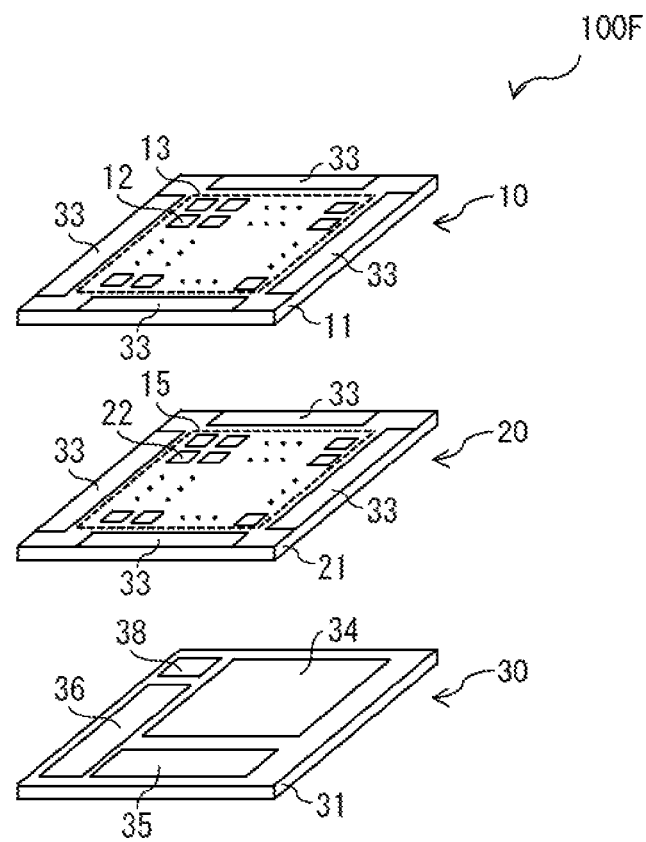
[FIG. 36]
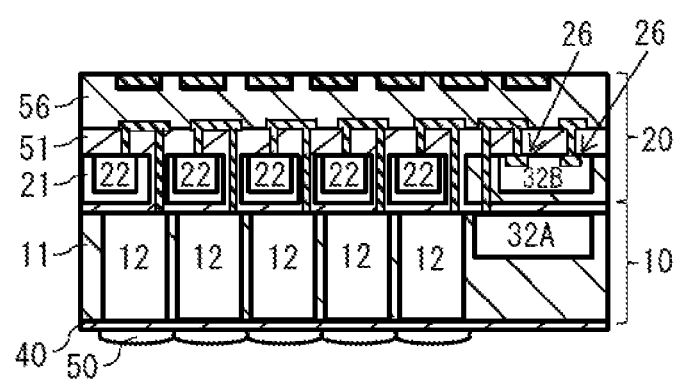

[FIG. 37]
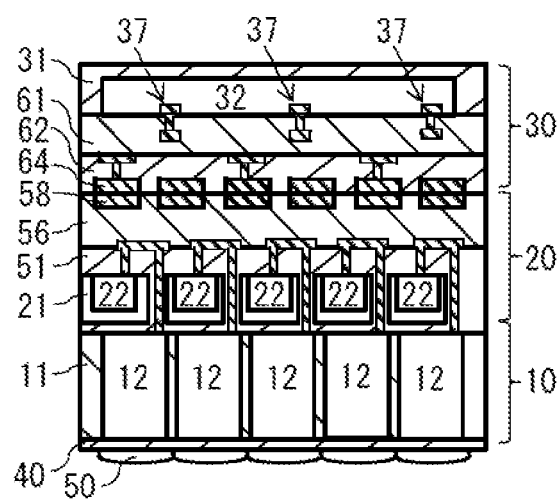

[FIG. 38]
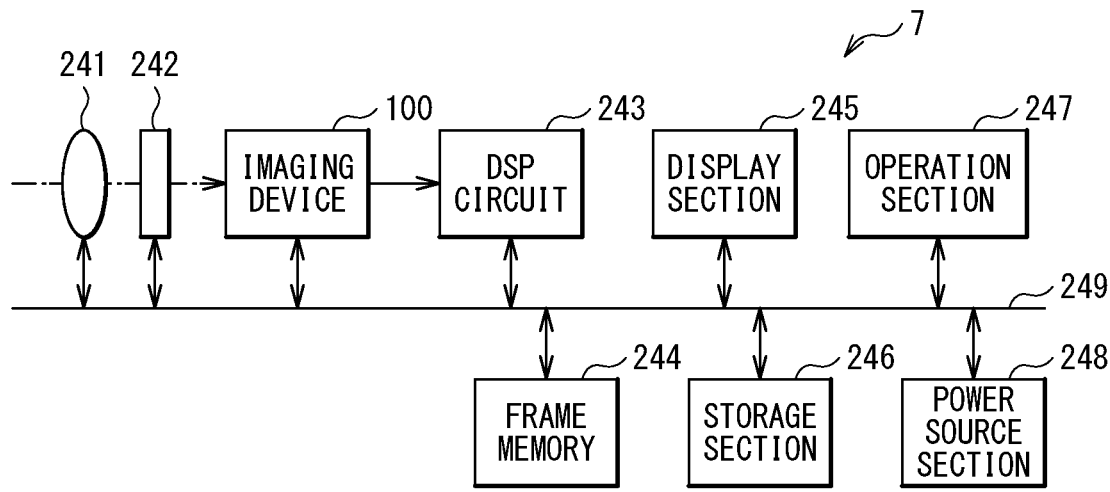
[FIG. 39]
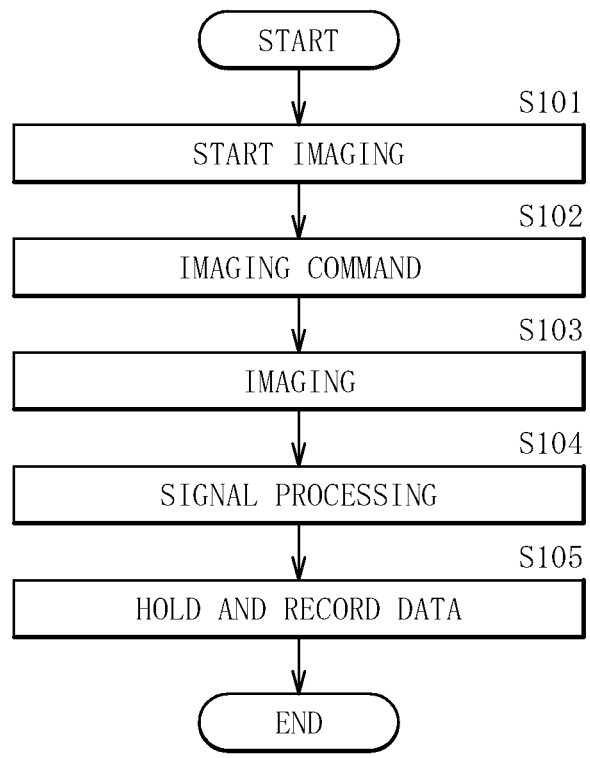

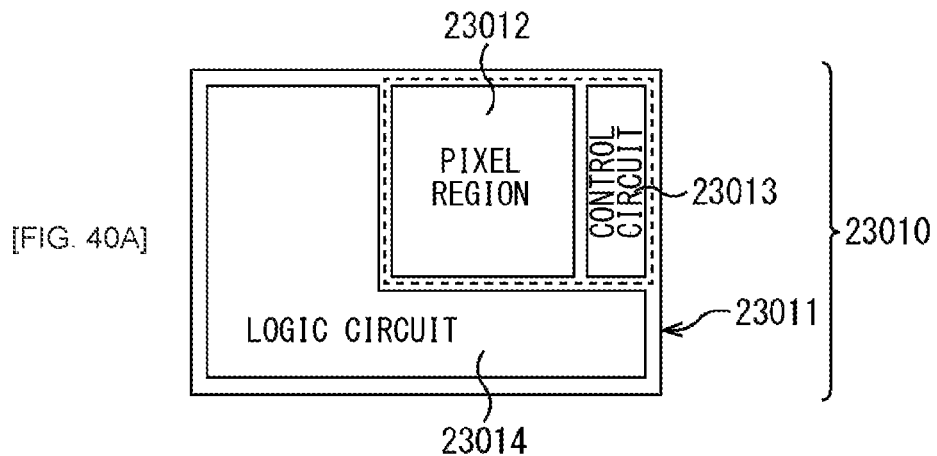
[FIG. 40A]
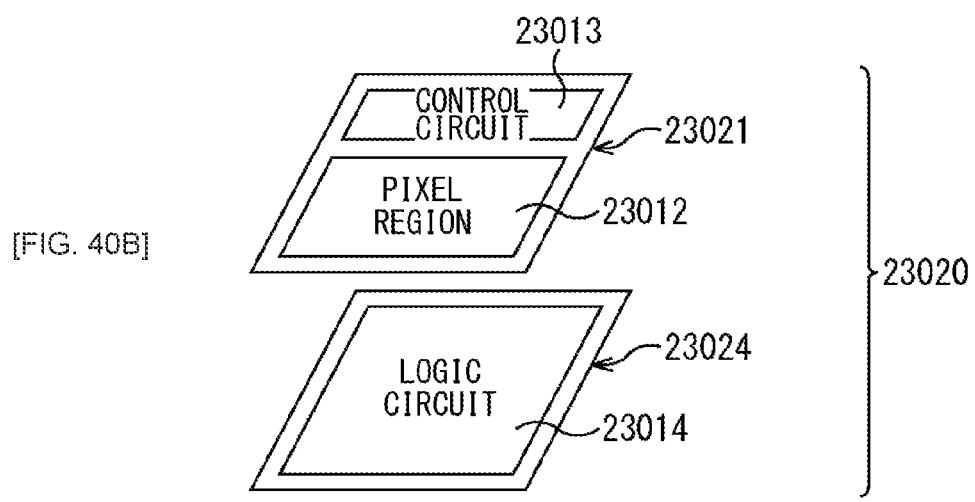
[FIG. 40B]
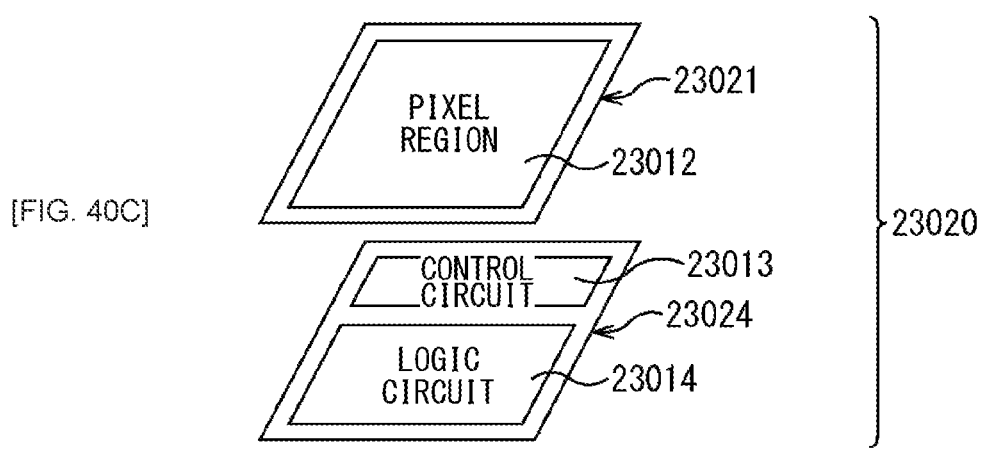
[FIG. 40C]

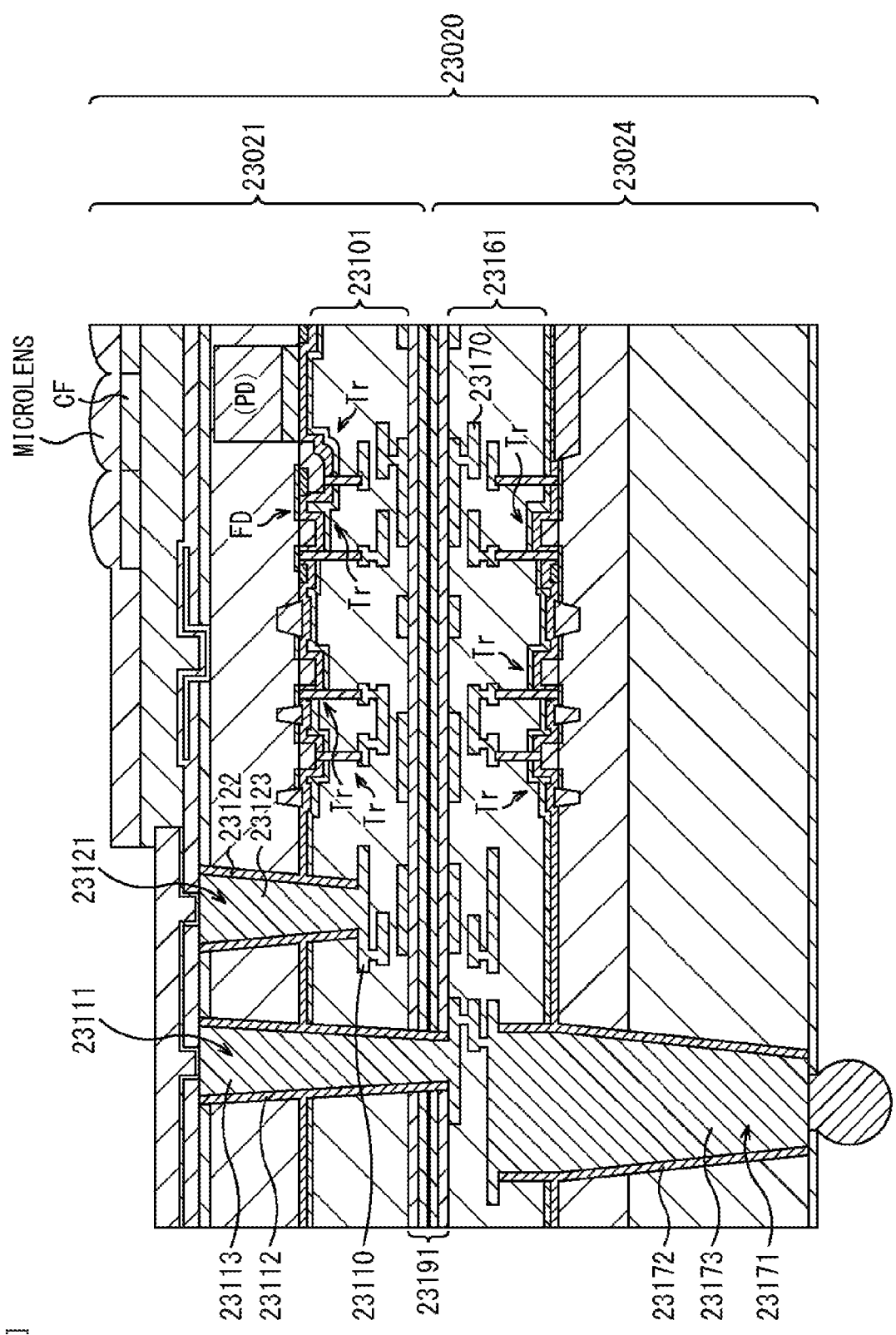
[FIG. 41]

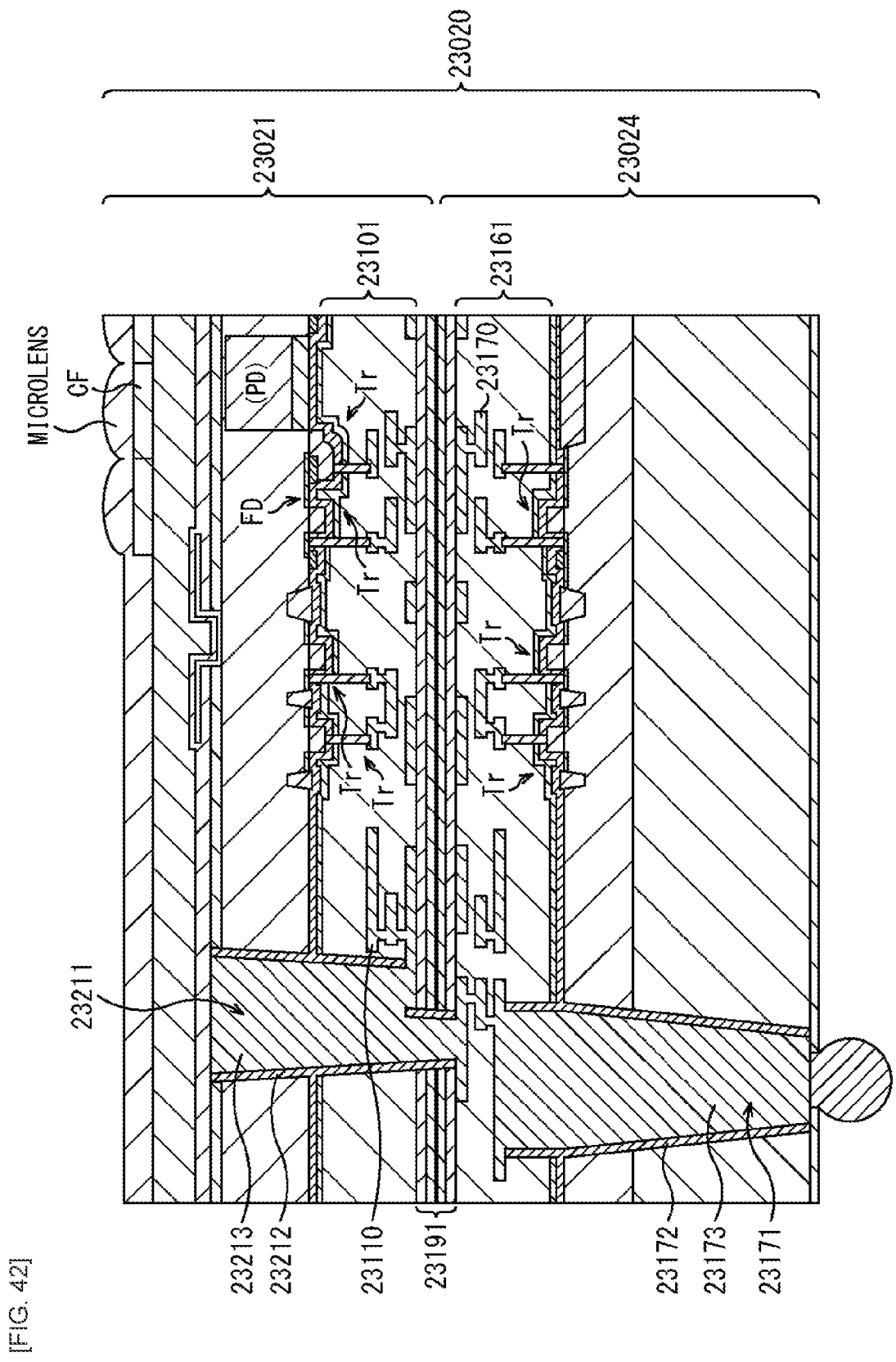
[FIG. 42]

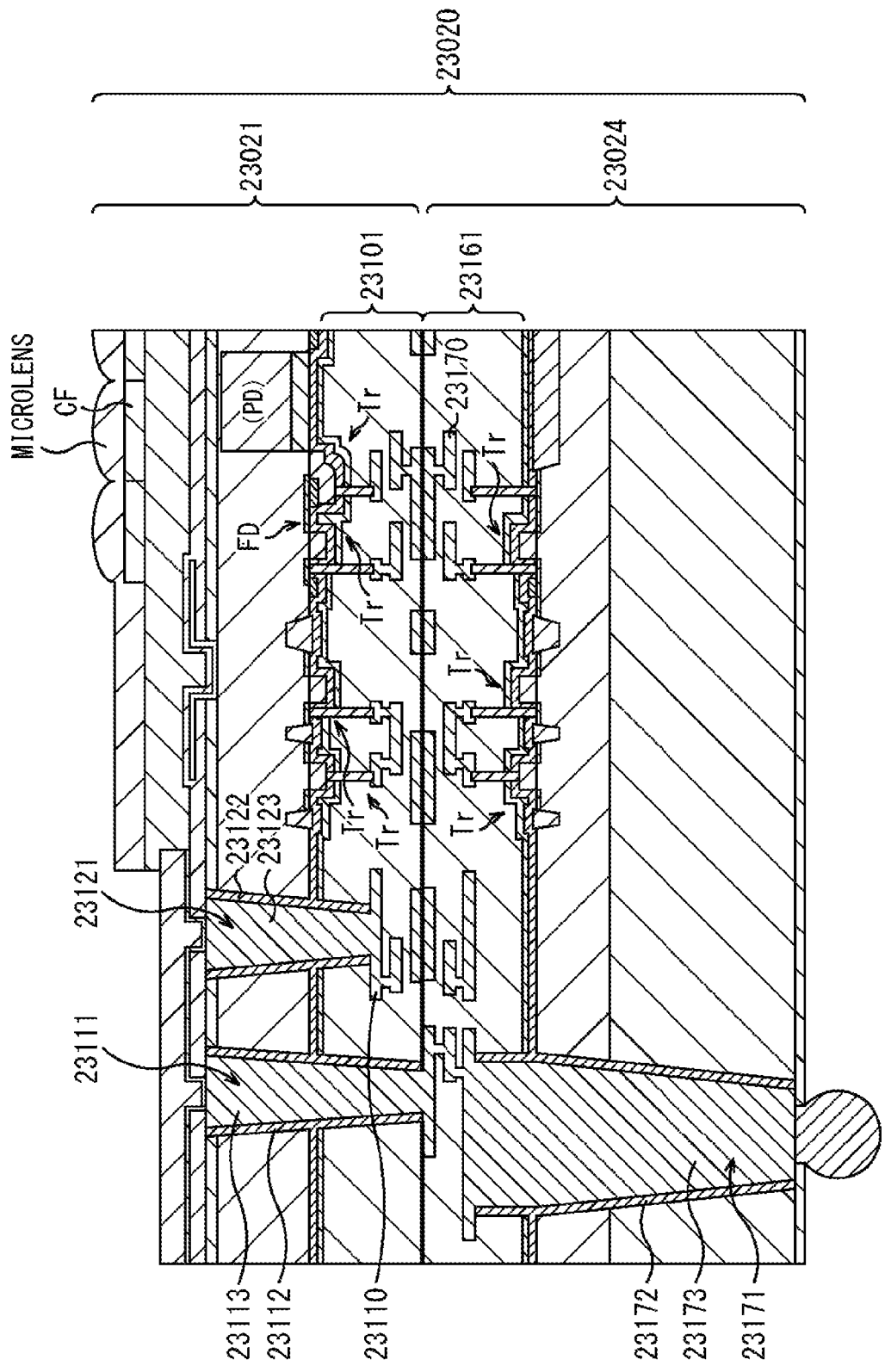

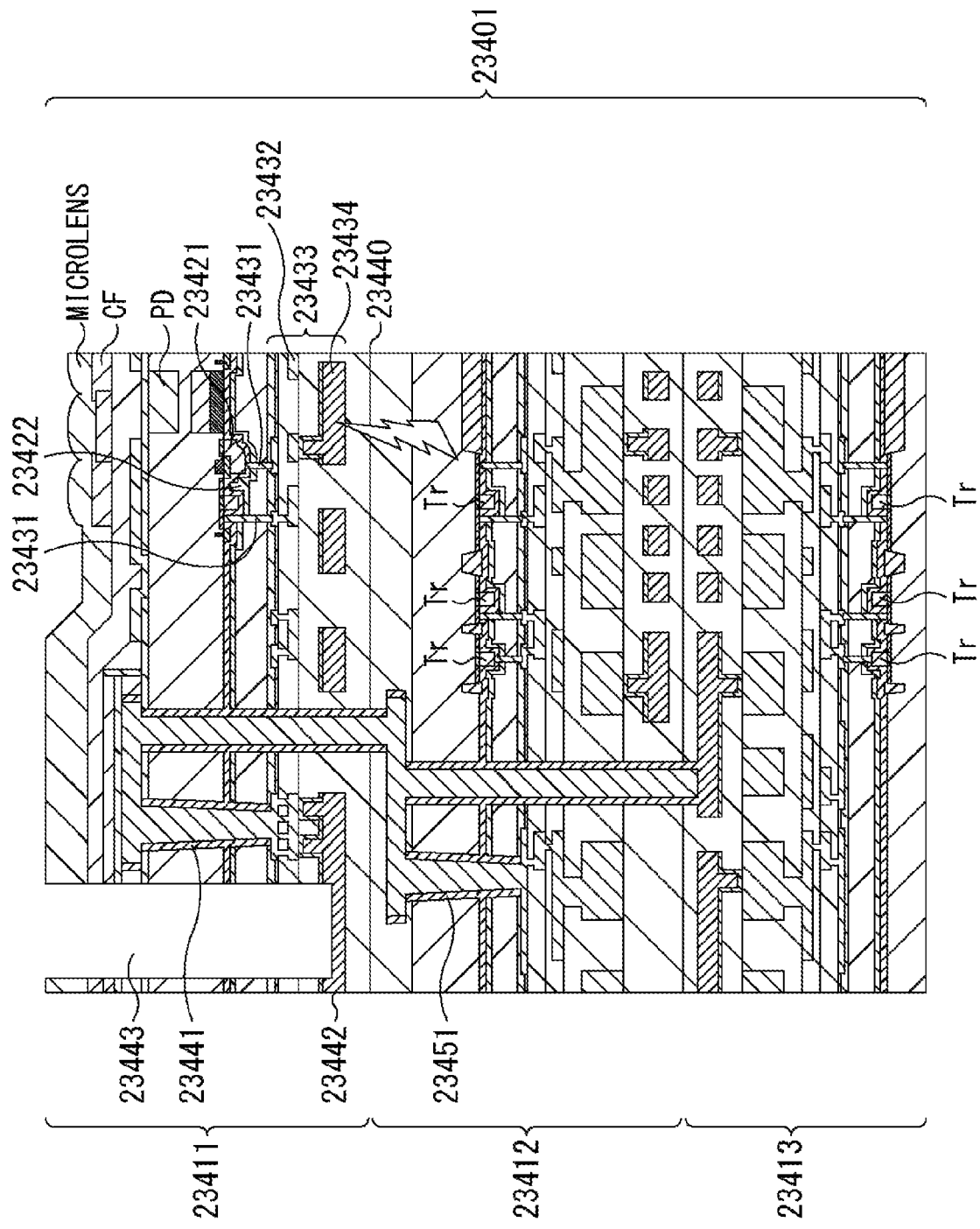
[FIG. 44]

[FIG. 45]
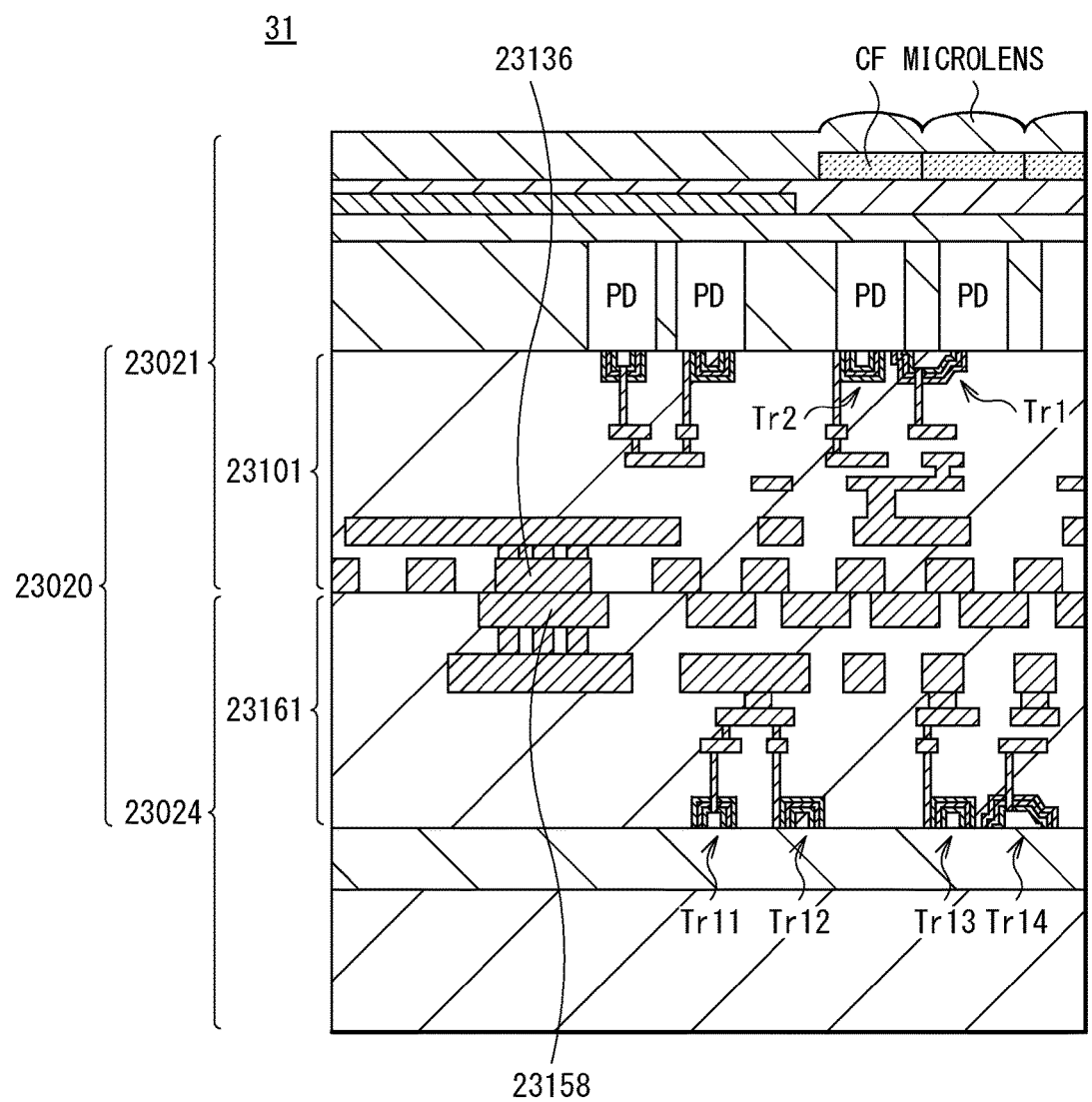

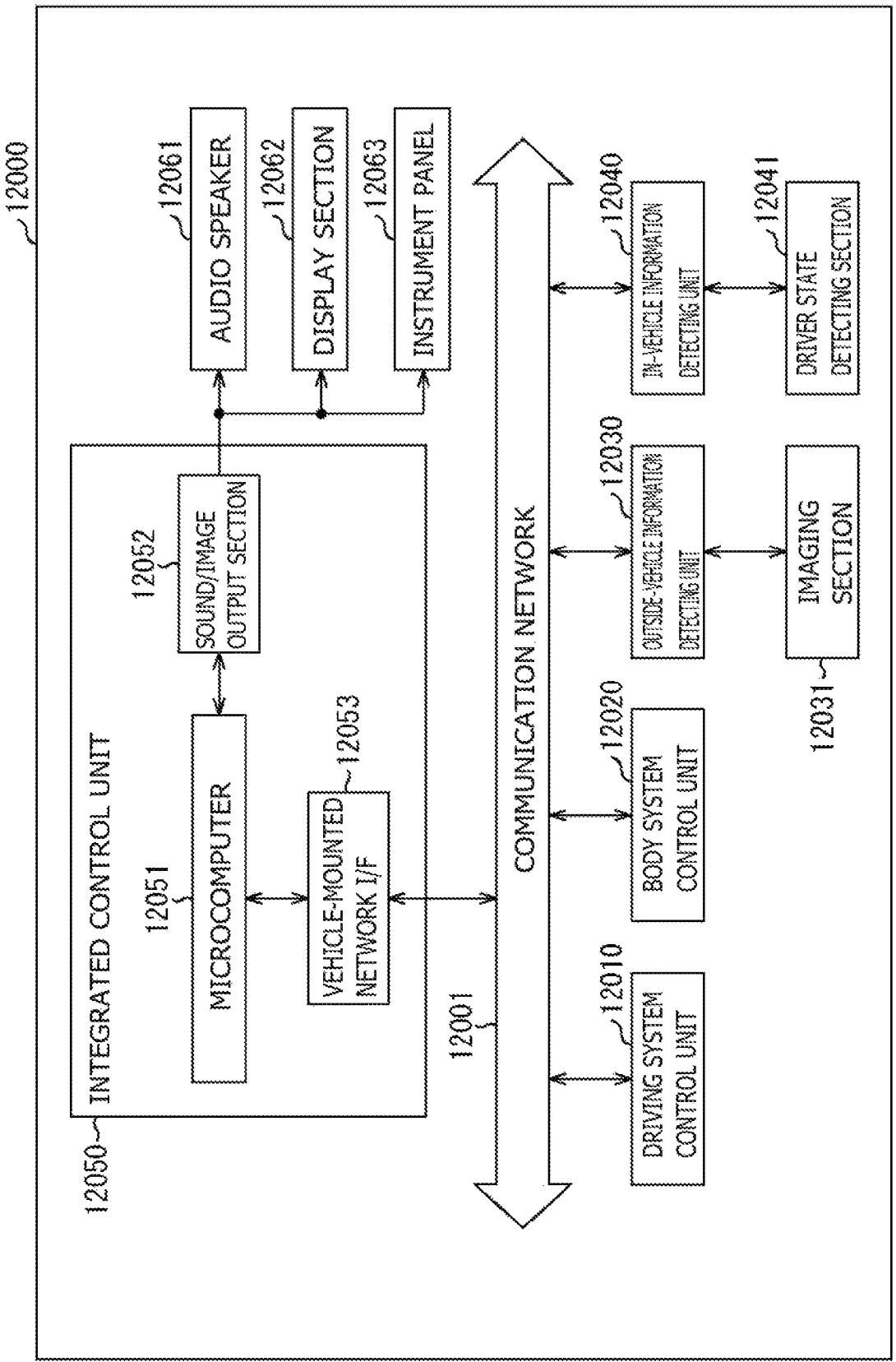

[FIG. 47]
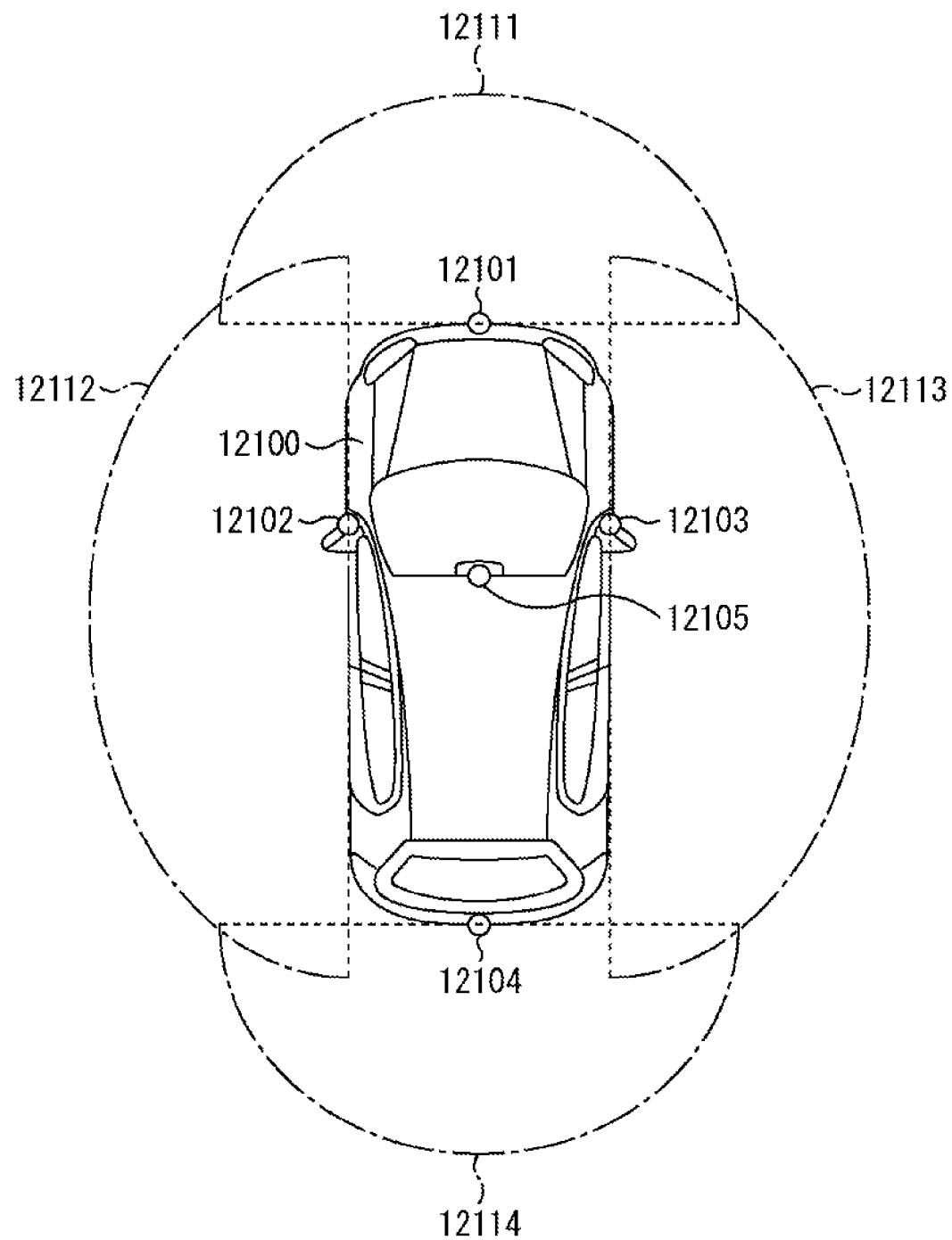

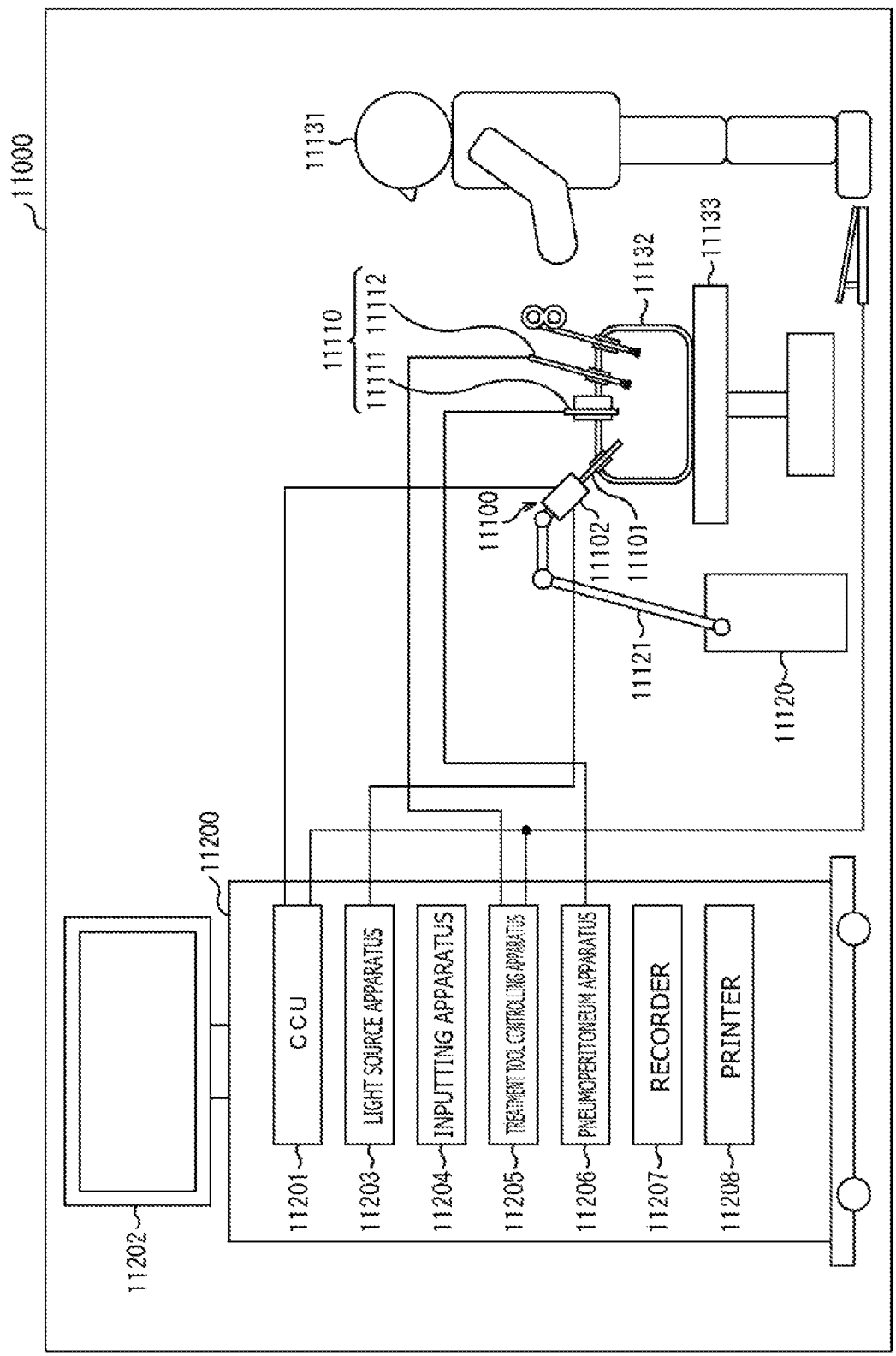
[FIG. 48]

[FIG. 49]
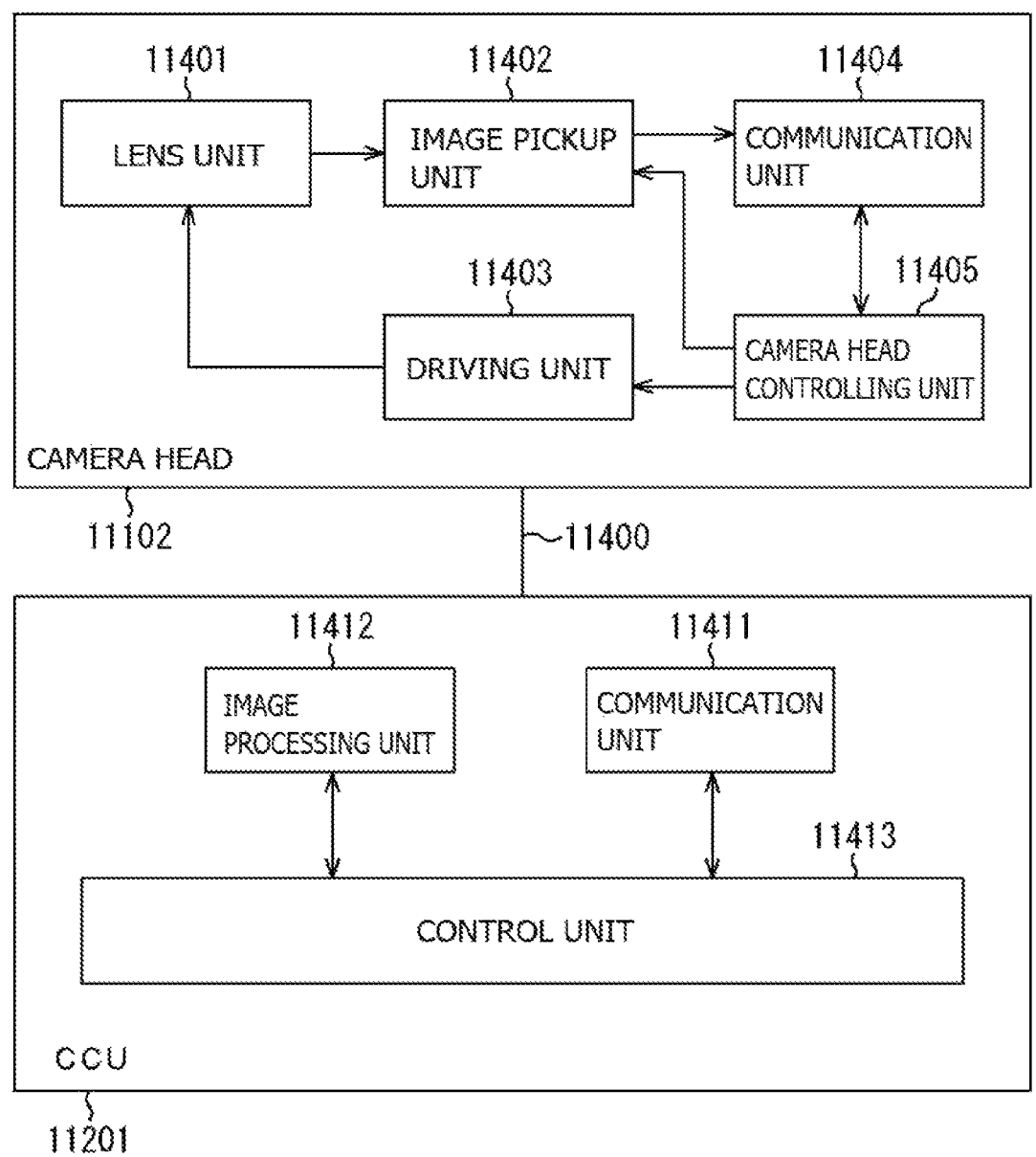

SOLID-STATE IMAGING DEVICE

CROSS REFERENCE TO RELATED APPLICATIONS

This application is a U.S. National Phase of International Patent Application No. PCT/JP2020/020997 filed on May 27, 2020, which claims priority benefit of Japanese Patent Application No. JP 2019-102044 filed in the Japan Patent Office on May 31, 2019. Each of the above-referenced applications is hereby incorporated herein by reference in its entirety.

TECHNICAL FIELD

The present disclosure relates to a solid-state imaging device including a semiconductor substrate.

BACKGROUND ART

Recently, a technique of image-plane phase-difference detection AF (Auto Focus) is used in a solid-state imaging device using a CMOS (Complementary Metal Oxide Semiconductor) image sensor or the like. In the image-plane phase-difference detection AF, a phase difference is detected with use of imaging pixels.

For example, PTL 1 discloses an image-plane phase-difference detection AF technique of a so-called PD (Photo Diode) division method. The PD division method is a method in which a PD is divided into a plurality of parts in a single pixel, and phase information is obtained from each of the divided PDs.

CITATION LIST

Patent Literature

PTL 1: Japanese Unexamined Patent Application Publication No. 2015-12127

SUMMARY OF THE INVENTION

Regarding such a solid-state imaging device, it is desired to suppress image degradation caused by signal charge saturation in a photoelectric converter.

It is desirable to provide a solid-state imaging device that makes it possible to suppress image degradation caused by signal charge saturation in a photoelectric converter.

A solid-state imaging device according to an embodiment of the present disclosure includes a first semiconductor substrate, an isolation region, a charge holding section, and a charge accumulation section. The first semiconductor substrate is a substrate in which a photoelectric converter is provided for each of unit regions. The isolation region is provided to run through the first semiconductor substrate in a thickness direction and electrically isolates the unit regions from each other. The charge holding section is electrically coupled to the photoelectric converter and configured to receive signal charge from the photoelectric converter. The charge accumulation section is shared by two or more of the unit regions and is a section to which the signal charge is transferred from the photoelectric converter and the charge holding section of each of the unit regions sharing the charge accumulation section.

The solid-state imaging device according to the embodiment of the present disclosure is provided with the charge holding section. Therefore, when the photoelectric converter is saturated with signal charge, the signal charge flows from the photoelectric converter to the charge holding section.

BRIEF DESCRIPTION OF DRAWINGS

FIG. 1 is a schematic plan view of an overall configuration of an imaging element according to an embodiment of the present disclosure.

FIG. 2 is a schematic plan view of a configuration of a main part of a light receiving region illustrated in FIG. 1.

FIG. 3 is a schematic diagram illustrating an example of a cross-sectional configuration along a line III-III' illustrated in FIG. 2.

FIG. 4 is a schematic diagram illustrating another example (1) of a cross-sectional configuration of a light receiving region illustrated in FIG. 3.

FIG. 5 is a schematic diagram illustrating another example (2) of the cross-sectional configuration of the light receiving region illustrated in FIG. 3.

FIG. 6 is a diagram illustrating an example of a circuit configuration of a pixel illustrated in FIG. 2.

FIG. 7 is a schematic diagram illustrating a plan configuration of an element isolation section and a light receiving lens illustrated in FIG. 3.

FIG. 8 is a schematic diagram illustrating a cross-sectional configuration of a main part of an imaging device according to a comparative example.

FIG. 9 is a diagram schematically illustrating an input and output characteristic of the imaging device illustrated in FIG. 8.

FIG. 10A is a diagram schematically illustrating a potential diagram at the time of signal charge accumulation in an imaging device illustrated in FIG. 2 or the like.

FIG. 10B is a diagram schematically illustrating a potential diagram at the time of signal charge reading in the imaging device illustrated in FIG. 2 or the like.

FIG. 11A is a schematic plan view of a configuration of a main part of an imaging device according to Modification 1.

FIG. 11B is a schematic diagram illustrating a cross-sectional configuration along a line B-B' illustrated in FIG. 11A.

FIG. 12A is a schematic plan view of a configuration of a main part of an imaging device according to Modification 2.

FIG. 12B is a schematic diagram illustrating a cross-sectional configuration along a line B-B' illustrated in FIG. 12A.

FIG. 12C is a schematic diagram illustrating a cross-sectional configuration along a line C-C' illustrated in FIG. 12A.

FIG. 13 is a schematic plan view of a configuration of a main part of an imaging device according to Modification 3.

FIG. 14 is a schematic plan view of a configuration of a main part of an imaging device according to Modification 4.

FIG. 15 is a schematic diagram illustrating a cross-sectional configuration along a line XIV-XIV' illustrated in FIG. 14.

FIG. 16 is a diagram illustrating an example of a circuit configuration of a pixel illustrated in FIG. 14 or the like.

FIG. 17 is a schematic plan view for describing another configuration of the light receiving lens illustrated in FIG. 15.

FIG. 18 is a schematic plan view of a configuration of a main part of an imaging device according to Modification 5.

FIG. 19 is a schematic plan view of an example of a configuration of a color filter and a light receiving lens of the imaging device illustrated in FIG. 18.

FIG. 20 is a schematic plan view of a configuration of a main part of an imaging device according to Modification 6.

FIG. 21 is a schematic diagram illustrating a cross-sectional configuration along a line XX-XX' illustrated in FIG. 20.

FIG. 22 is a diagram illustrating an example of a circuit configuration of a pixel illustrated in FIG. 20 or the like.

FIG. 23 is a schematic cross-sectional view of a configuration of a main part of an imaging device according to Modification 7.

FIG. 24 is a diagram illustrating an example of a schematic configuration of the imaging device illustrated in FIG. 23.

FIG. 25 is a diagram illustrating an example of a sensor pixel and a readout circuit illustrated in FIG. 23.

FIG. 26 is a diagram illustrating an example of the sensor pixel and the readout circuit illustrated in FIG. 23.

FIG. 27 is a diagram illustrating an example of the sensor pixel and the readout circuit illustrated in FIG. 23.

FIG. 28 is a diagram illustrating an example of the sensor pixel and the readout circuit illustrated in FIG. 23.

FIG. 29 is a diagram illustrating an example of a coupling state between a plurality of readout circuits and a plurality of vertical signal lines.

FIG. 30 is a diagram illustrating an example of a cross-sectional configuration of the imaging device illustrated in FIG. 23 in a horizontal direction.

FIG. 31 is a diagram illustrating an example of a cross-sectional configuration of the imaging device illustrated in FIG. 24 in the horizontal direction.

FIG. 32 is a diagram illustrating a cross-sectional configuration along a line I-I' illustrated in FIG. 31.

FIG. 33 is a diagram illustrating another example of a cross-sectional configuration of the imaging device illustrated in FIG. 23 in a vertical direction.

FIG. 34 is a diagram illustrating an example of a circuit configuration of the imaging device illustrated in FIG. 23.

FIG. 35 is a diagram illustrating an example in which the imaging device illustrated in FIG. 34 includes a stack of three substrates.

FIG. 36 is a diagram illustrating an example in which a logic circuit illustrated in FIG. 35 is divided to be provided in a substrate provided with sensor pixels and a substrate provided with readout circuits.

FIG. 37 is a diagram illustrating an example in which the logic circuit illustrated in FIG. 36 is provided in a third substrate.

FIG. 38 is a diagram illustrating an example of a schematic configuration of an imaging system including the imaging device according to any of the embodiment and the modifications thereof described above.

FIG. 39 is a diagram illustrating an example of an imaging procedure of the imaging system in FIG. 38.

FIGS. 40A, 40B and 40C are diagrams illustrating an outline of respective configuration examples of a solid-state imaging device of a non-stacked type and a solid-state imaging device of a stacked type to which the technology according to the present disclosure is applicable.

FIG. 41 is a cross-sectional view of a first configuration example of the solid-state imaging device of the stacked type.

FIG. 42 is a cross-sectional view of a second configuration example of the solid-state imaging device of the stacked type.

FIG. 43 is a cross-sectional view of a third configuration example of the solid-state imaging device of the stacked type.

FIG. 44 is a cross-sectional view of another configuration example of the solid-state imaging device of the stacked type to which the technology according to the present disclosure is applicable.

FIG. 45 is a cross-sectional view of a fourth configuration example of the solid-state imaging device of the stacked type.

FIG. 46 is a block diagram depicting an example of schematic configuration of a vehicle control system.

FIG. 47 is a diagram of assistance in explaining an example of installation positions of an outside-vehicle information detecting section and an imaging section.

FIG. 48 is a view depicting an example of a schematic configuration of an endoscopic surgery system.

FIG. 49 is a block diagram depicting an example of a functional configuration of a camera head and a camera control unit (CCU).

MODES FOR CARRYING OUT THE INVENTION

In the following, embodiments of the present disclosure are described in detail with reference to the drawings. Note that the description is given in the following order.

1. Embodiment (a solid-state imaging device including a charge holding section)
2. Modification 1 (an example in which the charge holding section has a comb-like plan shape)
3. Modification 2 (an example in which a charge accumulation section is shared by each 1×2 unit regions)
4. Modification 3 (an example in which the charge accumulation section is shared by each 2×2 unit regions)
5. Modification 4 (an example in which the charge accumulation section is shared by each 2×4 unit regions)
6. Modification 5 (an example in which the charge holding section includes an N-type diffusion layer and a wiring line)
7. Modification 6 (an example having a stacked structure including three substrates)
8. Application Example
9. Practical Application Examples Embodiment (Configuration of Imaging Device 100)

FIG. 1 schematically illustrates an example of a functional configuration of a solid-state imaging device (an imaging device 100) according to an embodiment of the present disclosure. The imaging device 100 is sensitive to, for example, light having a wavelength in the visible region. The imaging device 100 is provided with, for example, a quadrangular light receiving region 100P and a peripheral region 100S outside the light receiving region 100P. The peripheral region 100S is provided with peripheral circuits for driving the light receiving region 100P.

The light receiving region 100P of the imaging device 100 is provided with, for example, a plurality of readout unit regions (pixels P). The readout unit regions (pixels P) are arranged two-dimensionally, for example. The peripheral circuits provided in the peripheral region 100S include, for example, a row scanner 201, a horizontal selector 203, a column scanner 204, and a system controller 202.

The pixels P are provided with a pixel driving line Lread (e.g., a row select line and a reset control line) wired for each pixel row, and a vertical signal line Lsig wired for each pixel column, for example. The pixel driving line Lread is adapted to transmitting a drive signal for reading a signal from the pixel P. One end of the pixel driving line Lread is coupled to an output end corresponding to each row of the row scanner 201.

The row scanner 201 includes a shift register, an address decoder, and the like. The row scanner 201 is a pixel driving section that drives each of the pixels P in the light receiving region 100P, for example, on a row unit basis. A signal outputted from each of the pixels P in the pixel row selected and scanned by the row scanner 201 is supplied to the horizontal selector 203 via each of the vertical signal lines Lsig. The horizontal selector 203 includes an amplifier, a horizontal selection switch, and the like provided for each of the vertical signal lines Lsig.

The column scanner 204 includes a shift register, an address decoder, and the like. The column scanner 204 sequentially drives each of the horizontal selection switches of the horizontal selector 203 while scanning the horizontal selection switches of the horizontal selector 203. The selection scanning by the column scanner 204 causes respective signals of the pixels transmitted via the vertical signal lines Lsig to be sequentially outputted to a horizontal signal line, and to be supplied to an unillustrated signal processor or the like via the horizontal signal line 205.

The system controller 202 receives a clock supplied from the outside, data instructing an operation mode, and the like, and outputs data such as internal information of the imaging device 100. The system controller 202 further includes a timing generator that generates various timing signals. The system controller 202 performs drive controls of the row scanner 201, the horizontal selector 203, the column scanner 204, and the like on the basis of various timing signals generated by the timing generator.

FIG. 2 illustrates a schematic plan configuration of the light receiving region 100P illustrated in FIG. 1. FIG. 2 illustrates a single pixel P in the light receiving region 100P. The imaging device 100 is configured to perform so-called phase-difference detection by the PD division method. For example, the pixels P provided in the light receiving region 100P each include two unit regions (unit regions P-1 and P-2). That is, all the pixels P in the light receiving region 100P can function as phase-difference detection pixels. The pixels P and the unit regions P-1 and P-2 each have, for example, a quadrangular plan shape. The unit region P-1 and the unit region P-2 are isolated from each other by an element isolation section 43. The adjacent pixels P are also isolated from each other by the element isolation section 43. The unit regions P-1 and P-2 are each provided with a transfer transistor TR, a floating diffusion FD, a potential adjustment region Ca, and a charge holding section C. In each of the pixels P, the floating diffusion FD of the unit region P-1 and the floating diffusion FD of the unit region P-2 are electrically coupled by a wiring line 113. That is, the floating diffusions FD are shared by the two unit regions (the unit regions P-1 and P-2). Each of the pixels P is provided with, for example, an amplifying transistor AMP, a reset transistor RST, a selection transistor SEL, and a dummy transistor DMY. Here, the floating diffusion FD corresponds to a specific example of a "charge accumulation section" of the present disclosure.

FIG. 3 illustrates a cross-sectional configuration along a line III-III' illustrated in FIG. 2. The imaging device 100 includes a semiconductor substrate 11 and a multilayer wiring layer 112. The semiconductor substrate 11 includes a surface 11S1 (a front surface) and a surface 11S2 (a back surface) that oppose each other. The multilayer wiring layer 112 is provided on the surface 11S 1 of the semiconductor substrate 11. The imaging device 100 is a solid-state imaging device of a back-illuminated type, and the surface 11S2 of the semiconductor substrate 11 serves as a light receiving surface. The multilayer wiring layer 112 stacked on the semiconductor substrate 11 includes a plurality of wiring lines (the wiring lines 113 and the like which will be described later) and an interlayer insulating film 117. The imaging device 100 includes a color filter 40 and a light receiving lens 50 on the surface 11S2 of the semiconductor substrate 11 with an insulating film 115 interposed therebetween. Here, the semiconductor substrate 11 corresponds to a specific example of a "first semiconductor substrate" of the present disclosure.

The semiconductor substrate 11 is mainly provided with a PD 41 and the element isolation section 43. The PD 41 is provided in each of the unit regions P-1 and P-2. The element isolation section 43 is provided in such a manner as to partition the PDs 41 adjacent to each other. Here, the PD 41 corresponds to a specific example of a "photoelectric converter" of the present disclosure, and the element isolation section 43 corresponds to a specific example of an "isolation region" of the present disclosure.

The semiconductor substrate 11 includes, for example, P-type silicon (Si). The element isolation section 43 extending in a thickness direction (a Z-direction in FIG. 3) of the semiconductor substrate 11 has, for example, an FTI (Full Trench Isolation) structure, and is provided, for example, to run through from the surface 11S1 to the surface 11S2. The element isolation section 43 has, for example, a lattice plan shape, and is disposed in such a manner as to surround each of the unit regions P-1 and P-2 (FIG. 2). The element isolation section 43 includes, for example, a through groove reaching the surface 11S2 from the surface 11S1, a sidewall film 431 covering an inner wall of the groove, and a filler 432 provided in the through groove with the sidewall film 431 interposed therebetween. The sidewall film 431 includes, for example, an insulating film of silicon oxide (SiO), silicon nitride (SiN), or the like. The filler 432 includes, for example, polycrystalline silicon (Poly Si) or the like. The filler 432 may be an air layer, for example. Alternatively, the filler 432 may be a light-blocking metal material such as tungsten (W). Thus partitioning the unit region P-1 and the unit region P-2 with use of the element isolation section 43 having the FTI structure makes it possible to suppress movement of signal charge between the PD 41 of the unit region P-1 and the PD 41 of the unit region P-2. Accordingly, it is possible to suppress decrease in accuracy of phase-difference detection caused by the movement of the signal charge between the unit region P-1 and the unit region P-2.

FIGS. 4 and 5 illustrate other examples of the cross-sectional configuration of the light receiving region 100P.

As illustrated in FIG. 4, the element isolation film 143 may be provided in the vicinity of the surface 11S1 of the semiconductor substrate 11. The element isolation film 143 is so-called STI (Shallow Trench Isolation), and is embedded in the surface 11S1 of the semiconductor substrate 11. The element isolation film 143 is provided, for example, around the floating diffusion FD, the transfer transistor Tr, the reset transistor RST, the amplifying transistor AMP, the selection transistor SEL, and the dummy transistor DMY. The element isolation film 143 electrically isolates the adjacent impurity diffusion regions from each other. The element isolation film 143 includes, for example, an insulating material such as silicon oxide (SiO) or TEOS (Tetra Ethyl Ortho Silicate). In the vicinity of the surface 11S1, the element isolation section 43 may reach such an element isolation film 143.

As illustrated in FIG. 5, the element isolation section 43 includes a through groove that reaches the surface 11S2 from the surface 11S1, a fixed charge film 433 covering an inner wall of the groove, and an insulating material 434 provided in the through groove with the fixed charge film 433 interposed therebetween. The fixed charge film 433 is a film having negative fixed charge, and may include, for example, a hafnium oxide (HfO) film, a tantalum oxide (TaO) film, an aluminum oxide (A1O) film, or the like. For the insulating material 434, for example, silicon oxide ($SiO_2$) or the like can be used. In such an element isolation section 43, pinning of the sidewall of the element isolation section 43 is enhanced. Accordingly, a dark current property is improved more effectively.

The semiconductor substrate 11 includes a P-well layer 44 between the element isolation section 43 and the PD 41 (FIGS. 3 to 5). The P-well layer 44 is provided around the element isolation section 43. Providing the P-well layer 44 makes it possible to suppress a dark current. In the thickness direction of the semiconductor substrate 11, the P-well layer 44 is provided from the surface 11S1 across to the surface 11S2. A P-well 42 is provided between the surface 11S1 of the semiconductor substrate 11 and the PD 41.

The PD 41 is provided for each unit region (for each of the unit regions P-1 and P-2) in the semiconductor substrate 11. The PD 41 is, for example, an n-type impurity diffusion region provided in the thickness direction of the semiconductor substrate 11. The PD 41 has, for example, a p-n junction with the P-well 42 provided in the vicinity of the surface 11S1 of the semiconductor substrate 11 and the P-well layer 44 around the element isolation section 43. That is, the PD 41 is a so-called photodiode of a p-n junction type.

The floating diffusion FD, the charge holding section C, the transfer transistor TR, the reset transistor RST, the amplifying transistor AMP, the selection transistor SEL, and the dummy transistor DMY are provided in the vicinity of the surface 11S1 of the semiconductor substrate 11.

The floating diffusion FD is configured to receive signal charge generated in the PD 41 and transferred via the transfer transistor TR. The P-well 42 is provided between the floating diffusion FD and the PD 41. The floating diffusion FD is formed, for example, by diffusing an N-type impurity at a high concentration into the P-well 42 provided in the vicinity of the surface 11S1 of the semiconductor substrate 11. That is, the floating diffusion FD is an N-type impurity diffusion region provided in the vicinity of the surface 11S1 of the semiconductor substrate 11. The floating diffusion FD of the unit region P-1 and the floating diffusion FD of the unit region P-2 are electrically coupled by the wiring line 113. In other words, the floating diffusion FD is shared by each two unit regions (unit regions P-1 and P-2). The floating diffusion FD has, for example, a quadrangular plan shape (FIG. 2).

In addition to the floating diffusion FD, the imaging device 100 of the present embodiment includes the charge holding section C configured to receive signal charge generated in the PD 41. The charge holding section C is provided in each of the unit regions P-1 and P-2. This allows signal charge to flow from the PD 41 into the charge holding section C when the PD 41 is saturated with the signal charge, as will be described later in detail. Accordingly, it is possible to suppress image degradation caused by signal charge saturation in the PD 41.

In the imaging device 100, a potential barrier between the PD 41 and the charge holding section C is configured to be smaller than a potential barrier between the PD 41 and the floating diffusion FD upon accumulation of signal charge (FIGS. 9A and 9B which will be described later). This allows signal charge to flow into the charge holding section C via a transfer transistor (transfer transistors TR1*b* and TR2*b* which will be described later) when the PD 41 is saturated with accumulated signal charge.

The charge holding section C is provided, for example, in the vicinity of the surface 11S1 of the semiconductor substrate 11. The P-well 42 is provided between the charge holding section C and the PD 41. The charge holding section C is formed, for example, by diffusing an N-type impurity into the P-well 42 provided in the vicinity of the surface 11S1 of the semiconductor substrate 11. That is, the charge holding section C is an N-type impurity diffusion region provided in the vicinity of the surface 11S1 of the semiconductor substrate 11. In the charge holding section C, a depletion layer generated at the border between the N-type impurity diffusion region and the P-well 42 functions as a capacitance. For example, the floating diffusion FD is provided at one (a transfer gate TG which will be described later) of gate electrodes of the transfer transistor TR, and the charge holding section C is provided at the other. The charge holding section C has, for example, a quadrangular plan shape (FIG. 2).

The transfer transistor TR includes, for example, the transfer gate TG and a gate insulating film. The transfer gate TG has, for example, a T-like cross-sectional shape, and is partially embedded in the semiconductor substrate 11. The reset transistor RST includes, for example, a gate electrode RST-G and a gate insulating film. The amplifying transistor AMP includes, for example, a gate electrode AMP-G and a gate insulating film. The selection transistor SEL includes, for example, a gate electrode SEL-G and a gate insulating film. The dummy transistor DMY includes, for example, a gate electrode DMY-G and a gate insulating film. Such transistors each include, for example, a MOSFET (Metal Oxide Semiconductor Field Effect Transistor). For example, the amplifying transistor AMP and the reset transistor RST are provided in the unit region P-1, and the selection transistor SEL and the dummy transistor DMY are provided in the unit region P-2 (FIG. 2).

A potential adjustment region Ca is provided between the transfer gate TG and the charge holding section C. For example, it is formed by diffusing an N-type impurity into the P-well 42 provided in the vicinity of the surface 11S1 of the semiconductor substrate 11. The potential adjustment region Ca is provided in each of the unit regions P-1 and P-2. Providing such a potential adjustment region Ca makes it possible to adjust the potential barrier between the PD 41 and the charge holding section C to be smaller than the potential barrier between the PD 41 and the floating diffusion FD.

Further, a P-type impurity diffusion region coupled to a power supply line VSS, and an N-type impurity diffusion region coupled to a power supply line VDD are provided in the vicinity of the surface 11S1 of the semiconductor substrate 11 (FIG. 2). When the PD 41 and the charge holding section C are saturated with signal charge, the excess signal charge is to be discharged to the power supply line VDD via the reset transistor RST.

FIG. 6 illustrates an example of a configuration of a pixel circuit of the imaging device 100.

The unit region P-1 includes, for example, a PD1 (the PD 41), transfer transistors TR1*a* and TR1*b* (the transfer transistors TR), and a charge holding section C1 (the charge holding section C). The unit region P-2 includes, for example, a PD2 (the PD 41), transfer transistors TR2a and TR2b (the transfer transistors TR), and a charge holding section C2 (the charge holding section C). The transfer transistors TR1a and TR1b are electrically coupled to the PD1. The transfer transistors TR2a and TR2b are electrically coupled to the PD2. The charge holding section C1 temporarily holds signal charge overflowing from the PD1 via the transfer transistor TR1b. The charge holding section C2 temporarily holds signal charge overflowing from the PD1 via the transfer transistor TR2b. The floating diffusion FD shared by the unit regions P-1 and P2 temporarily holds signal charge outputted from the PD1 and the charge holding section C1 via the transfer transistors TR1a and TR1b and signal charge outputted from the PD2 and the charge holding section C2 via the transfer transistors TR2a and TR2b.

Cathodes of the PD1 and the PD2 are electrically coupled to sources of the transfer transistors TR1a and TR2a and to drains of the transfer transistors TR1b and TR2b. Anodes of the PD1 and the PD2 are electrically coupled to a reference potential line (e.g., the ground). Drains of the transfer transistors TR1a and TR2a are electrically coupled to the floating diffusion FD. Sources of the transfer transistors TR1b and TR2b are electrically coupled to the charge holding sections C1 and C2. Gates of the transfer transistors TR1a, TR1b, TR2a, and TR2b are electrically coupled to a pixel driving line (the pixel driving line Lread in FIG. 1). In the unit region P-1, the gates of the transfer transistors TR1a and TR1b are electrically coupled to the same pixel driving line. In the unit region P-2, the gates of the transfer transistors TR2a and TR2b are electrically coupled to the same pixel driving line. That is, the transfer transistor TR1a and the transfer transistor TR1b are switchable between the conduction state and the shut-off state together, and the transfer transistor TR2a and the transfer transistor TR2b are switchable between the conduction state and the shut-off state together.

The source of the reset transistor RST and the gate of the amplifying transistor are electrically coupled to the floating diffusion FD. The drain of the reset transistor RST and the drain of the amplifying transistor AMP are coupled to the power supply line VDD. The gate of the reset transistor RST is electrically coupled to the pixel driving line. The source of the amplifying transistor AMP is electrically coupled to the drain of the selection transistor SEL. The source of the selection transistor SEL is electrically coupled to a vertical signal line (the vertical signal line Lsig in FIG. 1), and the gate of the selection transistor SEL is electrically coupled to the pixel driving line.

When being turned on, the transfer transistors TR1a, TR1b, TR2a, and TR2b transfer the signal charge in the PD1, the PD2, and the charge holding sections C1 and C2 to the floating diffusion FD. The transfer gate TG of the transfer transistor TR runs from the surface 11S1 of the semiconductor substrate 11 through the P-well 42 and extends to a depth reaching the PD 41 (FIG. 3), for example. The reset transistor RST resets the potential of the floating diffusion FD to a predetermined potential. When being turned on, the reset transistor RST resets the potential of the floating diffusion FD to the potential of the power supply line VDD. The amplifying transistor AMP generates, as a pixel signal, a signal of a voltage corresponding to the level of the charge held in the floating diffusion FD. The amplifying transistor AMP forms an amplifier of a source follower type, and outputs a pixel signal of a voltage corresponding to the level of charge generated in the PD1 and the PD2. The selection transistor SEL controls an output timing of the pixel signal from the amplifying transistor AMP. When the selection transistor SEL is turned on, the amplifying transistor AMP amplifies the potential of the floating diffusion FD, and supplies a voltage corresponding to the potential to the horizontal selector 203 via the vertical signal line.

The multilayer wiring layer 112 stacked on the semiconductor substrate 11 is in contact with the surface 11S1 of the semiconductor substrate 11. The wiring lines provided in the multilayer wiring layer 112 include, for example, the pixel driving line Lread, the vertical signal line Lsig, and the like in addition to the wiring line 113. The interlayer insulating film 117 includes, for example, silicon oxide (SiO) or the like.

The insulating film 115 covering the surface 11S2 of the semiconductor substrate 11 has, for example, a function of flattening the surface 11S2. The insulating film 115 includes, for example, silicon nitride (SiN), silicon oxide (SiO), silicon oxynitride (SiON), or the like. The insulating film 115 may have a single-layer structure, or may have a stacked structure. The insulating film 115 may include an anti-reflection film or a fixed charge film. For example, a high-dielectric material having negative fixed charge can be used for the fixed charge film. The fixed charge film includes, for example, hafnium oxide (HfO), aluminum oxide (AlO), a zirconium oxide (ZrO) film, tantalum oxide (TaO), titanium oxide (TiO), a stacked film thereof, or the like. The anti-reflection film includes, for example, titanium nitride (TiN), silicon nitride, silicon oxynitride, or the like.

A light-blocking film 116 is provided together with the insulating film 115 between the surface 11S2 of the semiconductor substrate 11 and the color filter 40, for example. The light-blocking film 116 is provided at a position overlapping with the element isolation section 43 in a plan view (an X-Y plane in FIG. 3), for example. The light-blocking film 116 includes, for example, a light-blocking metal material such as tungsten (W). For example, the insulating film 115 is provided between the light-blocking film 116 and the surface 11S2 of the semiconductor substrate 11, and between the light-blocking film 116 and the color filter 40. Providing such a light-blocking film 116 makes it possible to suppress leakage of light between the adjacent unit regions P-1 and P-2.

The color filter 40 covers the surface 11S2 of the semiconductor substrate 11 with the insulating film 115 interposed therebetween. The color filter 40 is, for example, any of a red (R) filter, a green (G) filter, a blue (B) filter, and a white filter (W), and is provided, for example, for each pixel P. These color filters 40 are provided in a regular color array (e.g., Bayer array). Providing such color filters 40 allows the imaging device 100 to obtain light receiving data of colors corresponding to the color array.

The light receiving lens 50 on the color filter 40 is provided, for example, for each pixel P.

FIG. 7 illustrates a plan configuration of the light receiving lens 50 together with the element isolation section 43. Thus, the light receiving lens 50 is provided over the element isolation section 43 between the unit region P-1 and the unit region P-2, and is shared by the two unit regions (the unit regions P-1 and P-2). The light receiving lens 50 provided for each pixel P has, for example, an elliptic plan shape. A lens system of the light receiving lens 50 is set to a value corresponding to the size of the pixel P. Examples of a lens material of the light receiving lens 50 include an organic material and a silicon oxide film (SiO).

(Operation of Imaging Device 100)

In such an imaging device 100, signal charge is acquired as follows, for example. When light passes the light receiving lens 50, the color filter 40, and the like and enters the surface 1152 of the semiconductor substrate 11, the light is detected (absorbed) by the PD 41 of each of the pixels P, and color light of red, green, and blue is subjected to photoelectric conversion. For example, of the electron-hole pairs generated in the PD 41, electrons are accumulated in the PD 41 and the charge holding section C, and holes are discharged to the power supply line VSS. Upon imaging, signal charge (e.g., electrons) generated in the PDs 41 in both of the unit regions P-1 and P-2 are added for each pixel P to read the pixel signal. (Phase-difference Detection of Imaging Device 100)

In the imaging device 100, each of the pixels P includes the two unit regions P-1 and P-2. Therefore, a phase difference in a left-right direction (an X-direction in FIG. 2, etc.) is detected. The transfer transistor TR1a and the transfer transistor TR2a (FIG. 6) are turned on at timings different from each other. This causes signal charge generated in the PD 41 of the unit region P-1 (the PD1 in FIG. 6) and signal charge generated in the PD 41 of the unit region P-2 (the PD2 in FIG. 6) to be transferred to the floating diffusion FD independently of each other. Thus, the respective pixel signals of the unit regions P-1 and P-2 are read and a phase difference in the left-right direction is detected.

(Workings and Effects of Imaging Device 100)

The imaging device 100 of the present embodiment is provided with the charge holding section C. Therefore, when the PD 41 is saturated with signal charge, the signal charge flows from the PD 41 into the charge holding section C. This makes it possible to suppress discharging of signal charge overflowing from the PD 41 into the power supply potential VDD or the like. The workings and effects of this is described below with use of a comparative example.

FIG. 8 illustrates a cross-sectional configuration of a light receiving region of a solid-state imaging device (an imaging device 200) according to the comparative example. FIG. 8 corresponds to FIG. 3 illustrating the imaging device 100. As with the imaging device 100, the imaging device 200 is configured to perform phase-difference detection by the PD division method, and each pixel P includes a unit region P-1 and a unit region P-2. A semiconductor substrate 11 is provided with an element isolation section 43 partitioning the unit region P-1 and the unit region P-2. The imaging device 200 differs from the imaging device 100 in that the charge holding section (the charge holding section C in FIG. 3) and the potential adjustment region (the potential adjustment region Ca in FIG. 3) are not provided in the unit regions P-1 and P-2.

In the imaging device 200, when the PD 41 is saturated with signal charge in either of the unit regions P1 and P2, an image is degraded easily. If the PD 41 in the unit region P-1 is saturated with signal charge, the signal charge generated in the unit region P-1 is discharged to the power supply line VDD via the reset transistor RST after the saturation. Therefore, the output from the unit region P-1 is constant.

FIG. 9 schematically illustrates respective input and output characteristics of the unit regions P-1 and P-2 and an input and output characteristic of the pixel P. The input and output characteristic of the pixel P corresponds to the sum of the input and output characteristic of the unit region P-1 and the input and output characteristic of the unit region P-2. As illustrated, when the PD 41 in the unit region P-1 is saturated with signal charge, the signal charge saturation makes it difficult to maintain the linearity (linearity) of the output from the pixel P. As a result, the image is degraded easily.

In a case where no element isolation section 43 is provided between the unit region P-1 and the unit region P-2, it is also conceivable to provide a blooming path between the PD 41 of the unit region P-1 and the PD 41 of the unit region P-2. Providing such a blooming path causes, even if the PD 41 of the unit region P-1 is saturated, signal charge generated in the unit region P-1 after the saturation to flow into the PD 41 of the unit region P-2 via the blooming path. Accordingly, the signal charge is not discharged to the power supply line VDD, and it is possible to maintain the linearity of the pixel P. However, in a case where no element isolation section 43 is provided between the unit region P-1 and the unit region P-2, signal charge easily moves between the unit region P-1 and the unit region P-2. This results in decrease in accuracy of the phase-difference detection accordingly. Further, the number of saturation electrons in each of the unit regions P-1 and P-2 depends on the potential of the blooming path. Therefore, in a case where the blooming path is provided, the number of saturation electrons in each of the unit regions P-1 and P-2, i.e., the signal output level, is decreased, as compared with a case where the element isolation section 43 is provided.

In contrast, in the present embodiment, the charge holding section C is provided in each of the unit regions P-1 and P-2. Therefore, signal charge overflowing from the photoelectric converter flows into the charge holding section C.

FIGS. 10A and 10B each illustrate a potential diagram of each of the pixels P of the imaging device 100. FIG. 10A illustrates the potential diagram at the time of signal charge accumulation, and FIG. 10B illustrates the potential diagram at the time of signal charge reading.

In the imaging device 100, the potential barrier between the PD1 (the PD 41) of the unit region P-1 and the charge holding section C1 (the charge holding section C) is configured to be smaller than the potential barrier between the PD1 and the floating diffusion FD at the time of signal charge accumulation. The adjustment of the potential barriers is achieved with the potential adjustment region Ca of the unit region P-1. Further, in the imaging device 100, the potential barrier between the PD2 (the PD 41) in the unit region P-2 and the charge holding section C2 (the charge holding section C) is configured to be smaller than the potential barrier between the PD2 and the floating diffusion FD at the time of signal charge accumulation. The adjustment of the potential barriers is achieved with the potential adjustment region Ca of the unit region P-2. Accordingly, when the PD1 or the PD2 is saturated with signal charge at the time of signal charge accumulation, the signal charge overflowing from the PD1 flows into the charge holding section C1, and the signal charge overflowing from the PD2 flows into the charge holding section C2 (FIG. 10A). Therefore, even if the PD1 and the PD2 are saturated with signal charge, the signal charge after the saturation is not discharged to the power supply line VDD.

The imaging device 100 operates as follows (FIG. 10B) at the time of signal charge reading. The transfer transistor TR1a and the transfer transistor TR1b (FIG. 6) are brought into a conduction state together, and signal charge accumulated in the PD1 and the charge holding section C1 is transferred to the floating diffusion FD. Further, the transfer transistor TR2a and the transfer transistor TR2b (FIG. 6) are brought into a conduction state together, and signal charge accumulated in the PD2 and the charge holding section C2 is transferred to the floating diffusion FD. Accordingly, the signal charge that has flown into the charge holding sections C1 and C2 is also read together with the signal charge in the PD1 and the PD2. In the imaging device 100, the charge holding section C thus allows to maintain the linearity of the output of the pixel P obtained by adding up the output of the PD1 and the output of the PD2. It is therefore possible to suppress image degradation caused by signal charge saturation.

Further, the element isolation section 43 running through the semiconductor substrate 11 is provided between the unit region P-1 and the unit region P-2. Therefore, it is possible to suppress decrease in accuracy of the phase-difference detection caused by movement of signal charge between the unit region P-1 and the unit region P-2.

As described above, the imaging device 100 according to the present embodiment is provided with the charge holding section C. Therefore, the charge holding section C can receive the signal charge overflowing from the PD 41. In other words, it is possible to suppress discharging of the signal charge overflowing from the PD 41 into the power supply potential VDD or the like. Accordingly, it is possible to suppress image degradation caused by signal charge saturation in the PD 41.

Further, the element isolation section 43 is provided between the unit region P-1 and the unit region P-2. Accordingly, it is possible to suppress decrease in accuracy of phase-difference detection caused by movement of signal charge between the unit region P-1 and the unit region P-2.

In addition, it is easier to maintain high resolution in the image-plane phase-difference detection AF method of the PD division method, as compared with the image-plane phase-difference detection AF method of the so-called one-side light-blocking method. Further, all the pixels P can function as phase-difference detection pixels. Therefore, it is possible to improve the accuracy of the phase-difference detection. Further, all the pixels P have the same configuration. This allows for easy manufacturing.

Modifications of the above-described embodiment are described below. In the following description, the same components as those of the embodiment described above are denoted by the same reference numerals, and the description thereof will be omitted as appropriate.

Modification 1

FIGS. 11A and 11B each schematically illustrate a configuration of a main part of an imaging device (an imaging device 100A) according to Modification 1 of the embodiment described above. FIG. 11A illustrates a plan configuration of a pixel P. FIG. 11B illustrates a cross-sectional configuration along a line B-B' illustrated in FIG. 11A. FIG. 11A corresponds to FIG. 2 illustrating the imaging device 100. In the imaging device 100A, the charge holding section C has a comb-like plan shape. Except for this point, the imaging device 100A has a configuration similar to that of the imaging device 100 of the embodiment described above, and has similar workings and effects.

As with the charge holding section C of the imaging device 100 described above, the charge holding section C provided in the imaging device 100A is, for example, an N-type impurity diffusion region in the vicinity of the surface 11S1 of the semiconductor substrate 11. The charge holding section C includes, for example, charge holding sections Ck1, Ck2, and Ck3 extending in an X-axis direction from the vicinity of the transfer gate TG of the transfer transistor TR, and a charge holding section Ck4 extending in a Y-axis direction. The charge holding section Ck4 is disposed in the vicinity of the transfer gate TG, and the charge holding sections Ck1, Ck2, and Ck3 are coupled to the charge holding section Ck4. A P-well 42 is provided around each of the charge holding sections Ck1, Ck2, Ck3, and Ck4. That is, the charge holding section C illustrated in FIGS. 11A and 11B has a comb-like plan shape branched into three parts. The comb-like shape of the charge holding section C is not limited to this shape.

In the imaging device 100A, each of the unit regions P-1 and P-2 is provided with the charge holding section C having the comb-like plan shape. Therefore, the surface area of the charge holding section C is increased, as compared with the charge holding section C having the quadrangular plan shape (e.g., FIG. 2). Accordingly, it is possible to increase the capacitance of the charge holding section C.

Modification 2

FIGS. 12A, 12B, and 12C each schematically illustrate a configuration of a main part of an imaging device (an imaging device 100G) according to Modification 2 of the embodiment described above. FIG. 12A illustrates a plan configuration of a pixel P, FIG. 12B illustrates a cross-sectional configuration along a line B-B' illustrated in FIG. 12A, and FIG. 12C illustrates a cross-sectional configuration along a line C-C' illustrated in FIG. 12A. A cross-sectional configuration along a line A-A' illustrated in FIG. 12A is similar to the cross-sectional configuration illustrated in FIG. 3. FIG. 12A corresponds to FIG. 2 illustrating the imaging device 100.

The imaging device 100G according to the present modification corresponds to the imaging device 100A according to Modification 1 described above in which: a charge holding section Ck5 is coupled to respective ends, of the charge holding sections Ck1, Ck2, and Ck3, on the opposite side from the end on the charge holding section Ck4 side; an element isolation film 47 is provided in each of a gap between the charge holding section Ck1 and the charge holding section Ck2 and a gap between the charge holding section Ck2 and the charge holding section Ck3; and a P-layer 48 covering the element isolation film 47 is provided between the element isolation film 47 and the charge holding sections Ck1, Ck2, Ck3, and Ck4. In this case, a side surface of each of the element isolation films 47 is covered with the charge holding section C with the P-layer 48 interposed therebetween. The element isolation film 47 is, for example, STI (Shallow Trench Isolation), and is embedded in the surface 11S1 of the semiconductor substrate 11. The P-layer 48 is a P-type impurity diffusion region, and is a layer for suppressing generation of a dark current around the STI. The p-type impurity concentration of the P-layer 48 is higher than the p-type impurity concentration of the P-well 42. Therefore, the imaging device 100G has a configuration similar to that of the imaging device 100A according to Modification 1 described above, except that the charge holding section Ck5 and the element isolation film 47 are provided. The imaging device 100G has at least workings and effects similar to those of the imaging device 100A according to Modification 1 described above.

The charge holding section C provided in the imaging device 100G is, for example, an N-type impurity diffusion region in the vicinity of the surface 11S1 of the semiconductor substrate 11, as with the charge holding section C of the imaging device 100A according to Modification 1 described above. In the charge holding section C, a depletion layer generated at the border between the N-type impurity diffusion region and the P-layer 48 covering the P-well 42 and the element isolation film 47 functions as a capacitance.

The charge holding section C includes, for example, the charge holding sections Ck1, Ck2, and Ck3 extending in the X-axis direction from the vicinity of the transfer gate TG of the transfer transistor TR, and the charge holding sections Ck4 and Ck5 extending in the Y-axis direction. The charge holding section Ck4 is disposed in the vicinity of the transfer gate TG. The charge holding sections Ck1, Ck2, and Ck3 are coupled to the charge holding section Ck4. The charge holding section Ck5 is disposed at a position away from the transfer gate TG. The charge holding sections Ck1, Ck2, and Ck3 are coupled to the charge holding section Ck5. The P-well 42 is provided around the charge holding section C.

In the present modification, for example, as illustrated in FIGS. 12B and 12C, the respective bottom portions of the charge holding sections Ck1, Ck2, Ck3, and Ck5 may be coupled to a charge holding section Ck6. In this case, the charge holding section C includes, for example, the charge holding sections Ck1, Ck2, and Ck3 extending in the X-axis direction from the vicinity of the transfer gate TG of the transfer transistor TR, the charge holding sections Ck4 and Ck5 extending in the Y-axis direction, and the charge holding section Ck6 expanding in the X-axis direction and the Y-axis direction. The charge holding section Ck6 is disposed at a position away from the transfer gate TG, and is disposed at a bottom portion of the charge holding section C. The charge holding sections Ck1, Ck2, Ck3, and Ck5 are coupled to the charge holding section Ck6. The side surface and the bottom surface of each of the element isolation films 47 are covered with the charge holding section C with the P-layers 48 interposed therebetween.

In the imaging device 100G, each of the unit regions P-1 and P-2 is provided with the charge holding section C having a plan shape with two slits in each which the element isolation film 47 is provided. Accordingly, the surface area of the charge holding section C is increased as compared with the charge holding section C having a quadrangular plan shape (e.g., FIG. 2). As a result, it is possible to increase the capacitance of the charge holding section C.

Modification 3

FIG. 13 schematically illustrates a plan configuration of a main part of an imaging device (an imaging device 100B) according to Modification 3 of the embodiment described above. FIG. 13 corresponds to FIG. 2 illustrating the imaging device 100. In the imaging device 100B, each pixel P has two unit regions (unit regions P-1 and P-2) disposed side by side along the Y-axis direction. That is, the imaging device 100B allows for phase-difference detection in an upper-lower direction. Except for this point, the imaging device 100B has a configuration similar to that of the imaging device 100 of the embodiment described above, and workings and effects also similar to those of the imaging device 100 of the embodiment described above.

The light receiving lens 50 of the imaging device 100B is provided, for example, for each pixel P as with that described in the above embodiment.

Modification 4

FIGS. 14 and 15 each schematically illustrate a configuration of a main part of an imaging device (an imaging device 100C) according to Modification 4 of the embodiment described above. FIG. 14 illustrates a plan configuration of the pixel P, and FIG. 15 illustrates a cross-sectional configuration along a line XIV-XIV' illustrated in FIG. 14. FIG. 14 corresponds to FIG. 2 illustrating the imaging device 100. In the imaging device 100C, each pixel P includes four unit regions (unit regions P-1, P-2, P-3, and P-4). Except for this point, the imaging device 100C has a configuration similar to that of the imaging device 100 of the embodiment described above, and workings and effects also similar to those of the imaging device 100 of the embodiment described above.

The unit region P-1 and the unit region P-2 are disposed side by side along the X-axis direction, and the unit region P-1 and the unit region P-3 are disposed side by side along the Y-axis direction. The unit region P-3 and the unit region P-4 are disposed side by side along the X-axis direction, and the unit region P-2 and the unit region P-4 are disposed side by side along the Y-axis direction. That is, each pixel P includes four unit regions P-1, P-2, P-3, and P-4 disposed in 2×2. Each of the unit regions P-1, P-2, P-3, and P-4 is provided with the charge holding section C. For example, the unit region P-1 is provided with the amplifying transistor AMP, the unit region P-2 is provided with the selection transistor SEL, the unit region P-3 is provided with the reset transistor RST, and the unit region P-4 is provided with the dummy transistor DMY.

The floating diffusion FD of the unit region P-1 and the floating diffusion FD of the unit region P-3 are coupled to each other by the wiring line 113, and the floating diffusion FD of the unit region P-3 and the floating diffusion FD of the unit region P-4 are coupled to each other by the wiring line 113. In addition, the floating diffusion FD of the unit region P-4 and the floating diffusion FD of the unit region P-2 are coupled to each other by the wiring line 113, and the floating diffusion FD of the unit region P-2 and the floating diffusion FD of the unit region P-1 are coupled to each other by the wiring line 113. That is, in one pixel P, the respective floating diffusions FD of the unit regions P-1, P-2, P-3, and P-4 are electrically coupled to each other. In other words, the four unit regions (the unit regions P-1, P-2, P-3, and P-4) share the floating diffusion FD.

FIG. 16 illustrates an example of a configuration of a pixel circuit regarding the imaging device 100C.

The unit region P-1 includes, for example, a PD1, transfer transistors TR1a and TR1b, and a charge holding section C1. The unit region P-2 includes, for example, a PD2, transfer transistors TR2a and TR2b, and a charge holding section C2. The unit region P-3 includes, for example, a PD3, transfer transistors TR3a and TR3b, and a charge holding section C3. The unit region P-4 includes, for example, a PD4, transfer transistors TR4a and TR4b, and a charge holding section C4. The transfer transistors TR1a and TR1b are electrically coupled to the PD1. The transfer transistors TR2a and TR2b are electrically coupled to the PD2. The transfer transistors TR3a and TR3b are electrically coupled to the PD3. The transfer transistors TR4a and TR4b are electrically coupled to the PD4.

The charge holding section C1 temporarily holds signal charge overflowing from the PD1 via the transfer transistor TR1b. The charge holding section C2 temporarily holds signal charge overflowing from the PD1 via the transfer transistor TR2b. The charge holding section C3 temporarily holds signal charge overflowing from the PD3 via the transfer transistor TR3b. The charge holding section C4 temporarily holds signal charge overflowing from the PD4 via the transfer transistor TR4b.

The floating diffusion FD shared by the unit regions P-1, P-2, P-3, and P-4 temporarily holds the signal charge outputted from the PD1 and the charge holding section C1 via the transfer transistors TR1a and TR1b, the signal charge outputted from the PD2 and the charge holding section C2 via the transfer transistors TR2a and TR2b, the signal charge outputted from the PD3 and the charge holding section C3 via the transfer transistors TR3a and TR3b, and the signal charge outputted from the PD4 and the charge holding section C4 via the transfer transistors TR4a and TR4b. The signal charge held in the floating diffusion FD is read out to the vertical signal line (the vertical signal line Lsig in FIG. 1) via the amplifying transistor AMP and the selection transistor SEL, in a manner similar to that described regarding the imaging device 100 above.

In the imaging device 100C, each pixel P includes four unit regions (the unit regions P-1, P-2, P-3, and P-4) disposed in 2×2. This allows for phase-difference detection in the upper-lower direction and the left-right direction.

FIG. 17 illustrates an example of a plan configuration of the light receiving lens 50 of the imaging device 100C together with the element isolation section 43. The light receiving lens 50 of the imaging device 100C is provided, for example, for each pixel P. The light receiving lens 50 is provided over the element isolation section 43 that partitions the unit regions P-1, P-2, P-3, and P-4, and is shared by the four unit regions (the unit regions P-1, P-2, P-3, and P-4). The light receiving lens 50 of each pixel P has, for example, a circular plan shape.

Modification 5

FIG. 18 schematically illustrates a plan configuration of a main part of an imaging device (an imaging device 100D) according to Modification 5 of the embodiment described above. FIG. 19 corresponds to FIG. 2 illustrating the imaging device 100. In the imaging device 100D, each pixel P includes eight unit regions (unit regions P-1, P-2, P-3, P-4, P-5, P-6, P-7, and P-8). Except for this point, the imaging device 100D has a configuration similar to that of the imaging device 100 of the embodiment described above, and workings and effects also similar to those of the imaging device 100 of the embodiment described above.

The unit region P-1, the unit region P-2, the unit region P-3, and the unit region P-4 are disposed side by side along the X-axis direction, and the unit region P-1 and the unit region P-5 are disposed side by side along the Y-axis direction. The unit region P-5, the unit region P-6, the unit region P-7, and the unit region P-8 are disposed side by side along the X-axis direction. The unit region P-2 and the unit region P-6 are disposed side by side along the Y-axis direction, the unit region P-3 and the unit region P-7 are disposed side by side along the Y-axis direction, and the unit region P-4 and the unit region P-8 are disposed side by side along the Y-axis direction. That is, each pixel P includes eight unit regions P-1, P-2, P-3, and P-4 disposed in 4×2. The plan shape of each of the unit regions P-1, P-2, P-3, P-4, P-5, P-6, P-7, and P-8 is, for example, rectangular, and the dimension in the Y-axis direction is greater than the dimension in the X-axis direction. For example, the dimension in the Y-axis direction of each of the unit regions P-1, P-2, P-3, P-4, P-5, P-6, P-7, and P-8 is twice as great as the dimension in the X-axis direction.

The unit regions P-1, P-2, P-3, P-4, P-4, P-5, P-6, P-7, and P-8 are each provided with the charge holding section C. For example, the unit region P-1 is provided with the reset transistor RST, the unit region P-2 is provided with the amplifying transistor AMP, the unit region P-3 is provided with the selection transistor SEL, and the unit region P-4 is provided with the dummy transistor DMY. The respective floating diffusions FD of the unit regions P-1, P-2, P-3, P-4, P-5, P-6, P-7, and P-8 are coupled to each other by the wiring line 113.

FIG. 19 illustrates a plan configuration of the light receiving lens 50 provided in the pixel P, together with the color filter 40 and the element isolation section 43. The light receiving lens 50 is, for example, provided over the two unit regions adjacent to each other in the X-axis direction. For example, the unit region P-1 and the unit region P-2 share the light receiving lens 50, the unit region P-3 and the unit region P-4 share the light receiving lens 50, the unit region P-5 and the unit region P-6 share the light receiving lens 50, and the unit region P-7 and the unit region P-8 share the light receiving lens 50. Two unit regions sharing the light receiving lens 50 are provided with the respective color filters 40 of the same color. For example, the unit region P-1 and the unit region P-2 are provided with respective red color filters (color filters 40R), the unit region P-3 and the unit region P-4 are provided with respective green color filters (color filters 40G), the unit region P-5 and the unit region P-6 are provided with respective green color filters 40G, and the unit region P-7 and the unit region P-8 are provided with respective blue color filters (color filters 40B).

Modification 6

FIGS. 20 and 21 each schematically illustrate a configuration of a main part of an imaging device (an imaging device 100E) according to Modification 6 of the embodiment described above. FIG. 20 illustrates a plan configuration of the pixel P, and FIG. 21 illustrates a cross-sectional configuration along a line XX-XX' illustrated in FIG. 20. FIG. 20 corresponds to FIG. 2 illustrating the imaging device 100, and FIG. 21 corresponds to FIG. 3 illustrating the imaging device 100. In the imaging device 100E, the charge holding section C includes a diffusion layer Cs and a wiring line Cw (FIG. 21). Except for this point, the imaging device 100E has a configuration similar to that of the imaging device 100 of the embodiment described above, and workings and effects also similar to those of the imaging device 100 of the embodiment described above.

The diffusion layer Cs is an N-type impurity diffusion region extending from the surface 11S1 of the semiconductor substrate 11 in the thickness direction of the semiconductor substrate 11. For example, the diffusion layer Cs is exposed on the surface 11S1 of the semiconductor substrate 11. The P-well 42 is provided between the PD 41 and the diffusion layer Cs. The wiring line Cw is provided, for example, in the multilayer wiring layer 112, and opposes the diffusion layer Cs.

The imaging device 100E has, for example, a pixel circuit similar to that described in the imaging device 100 above (FIG. 6).

FIG. 22 illustrates another example of the pixel circuit of the imaging device 100E. In the imaging device 100E, the charge holding section C of the unit region P-1 and the charge holding section C of the unit region P-2 may be electrically coupled to each other. In other words, in the imaging device 100E, the unit region P-1 and the unit region P-2 may share the charge holding section C. In this case, for example, the wiring line Cw of the unit region P-1 and the wiring line Cw of the unit region P-2 are electrically coupled to each other by the wiring line of the multilayer wiring layer 112.

The light receiving lens 50 of the imaging device 100E is provided for each pixel P, for example, in a manner similar to that described in the embodiment above (FIG. 7).

Further, each pixel P of the imaging device 100E may include two unit regions (the unit regions P-1 and P-2) disposed side by side in the X-axis direction (FIGS. 20 and 21), or may include two unit regions disposed side by side in the Y-axis direction as described in Modification 2 above. Each pixel P of the imaging device 100E may include four or eight unit regions in a manner similar to that described in Modifications 3 and 4 above.

Modification 7

FIG. 23 schematically illustrates a cross-sectional configuration of a main part of an imaging device (an imaging device 100F) according to Modification 7 of the embodiment described above. FIG. 23 corresponds to FIG. 3 illustrating the imaging device 100. FIG. 24 illustrates an example of a schematic configuration of the imaging device 100F. The imaging device 100F has a three-dimensional structure in which a first substrate 10 including a semiconductor substrate 11 and a second substrate 20 including a semiconductor substrate 21 are stacked on each other. The semiconductor substrate 11 is provided with a sensor pixel 12 that performs photoelectric conversion, and the semiconductor substrate 21 is provided with a readout circuit 22 that outputs an image signal based on charge outputted from the sensor pixel. Except for this point, the imaging device 100F has a configuration similar to that of the imaging device 100 of the embodiment described above, and workings and effects also similar to those of the imaging device 100 of the embodiment described above. Here, the semiconductor substrate 21 corresponds to a specific example of a "second semiconductor substrate" of the present disclosure.

In the imaging device 100F, three substrates (the first substrate 10, the second substrate 20, and a third substrate 30) are stacked in this order.

The first substrate 10 includes a plurality of sensor pixels 12 performing photoelectric conversion in the semiconductor substrate 11, as described above. The sensor pixels 12 are provided in a matrix in the pixel region 13 in the first substrate 10. The second substrate 20 includes the readout circuit 22 for each four sensor pixels 12 in the semiconductor substrate 21. The readout circuit 22 outputs a pixel signal based on the charges outputted from the sensor pixel 12. The second substrate 20 includes a plurality of pixel driving lines 23 extending in a row direction, and a plurality of vertical signal lines 24 extending in a column direction. The third substrate 30 includes a logic circuit 32 that processes a pixel signal in a semiconductor substrate 31. The logic circuit 32 includes, for example, a vertical drive circuit 33, a column-signal processing circuit 34, a horizontal drive circuit 35, and a system control circuit 36. The logic circuit 32 (specifically, the horizontal drive circuit 35) outputs an output voltage Vout of each sensor pixel 12 to the outside. In the logic circuit 32, for example, a low resistance region may be provided on the surface of the impurity diffusion region that is in contact with the source electrode and the drain electrode. The low resistance region may include silicide formed by a salicide (Self Aligned Silicide) process such as $CoSi_2$ or NiSi.

The vertical drive circuit 33 sequentially selects the sensor pixels 12 in a row-unit basis, for example. The column-signal processing circuit 34 performs a correlated double sampling (Correlated Double Sampling: CDS) process on a pixel signal outputted from each of the sensor pixels 12 in the row selected by the vertical drive circuit 33, for example. By performing the CDS process, the column-signal processing circuit 34 extracts a signal level of the pixel signal, and holds pixel data corresponding to a light reception amount of each of the sensor pixels 12, for example. The horizontal drive circuit 35 sequentially outputs the pieces of pixel data held in the column-signal processing circuit 34 to the outside, for example. The system control circuit 36 controls, for example, driving of each of the blocks in the logic circuit 32 (the vertical drive circuit 33, the column-signal processing circuit 34, and the horizontal drive circuit 35).

FIG. 25 illustrates an example of the sensor pixel 12 and the readout circuit 22. In the following, as illustrated in FIG. 25, a case where two sensor pixels 12 share one readout circuit 22 is described. Here, "share" refers to that the outputs of the two sensor pixels 12 are supplied to the common readout circuit 22. The number of the sensor pixels 12 sharing one readout circuit 22 may be, for example, four, eight, etc., and is not limited to two.

The sensor pixels 12 have components common to each other. In FIG. 25, the identification number (1 or 2) is given at the end of the sign of the component of each of the sensor pixels 12 in order to distinguish the respective components of the sensor pixels 12 from each other. In the following, in a case where the respective components of the sensor pixels 12 need to be distinguished from each other, the identification number is given to the end of the sign of each of the components of the sensor pixels 12. However, in a case where the respective components of the sensor pixels 12 need not be distinguished from each other, the identification number at the end of the sign of the component of each of the sensor pixels 12 is omitted.

Each of the sensor pixels 12 includes, for example, a photodiode PD, transfer transistors TRa and TRb, a floating diffusion FD, and a charge holding section C. The transfer transistors TRa and TRb are electrically coupled to the photodiode PD. The floating diffusion FD temporarily holds charge outputted from the photodiode PD via the transfer transistor TRa. The charge holding section C temporarily holds charge outputted from the photodiode PD via the transfer transistor TRb. The photodiode PD performs photoelectric conversion and generates charge corresponding to the light reception amount. A cathode of the photodiode PD is electrically coupled to a source of the transfer transistor TR, and an anode of the photodiode PD is electrically coupled to the reference potential line (e.g., the ground). A drain of the transfer transistor TRa is electrically coupled to the floating diffusion FD, a source of the transfer transistor TRb is electrically coupled to the charge holding section C, and the respective gates of the transfer transistors TRa and TRb are electrically coupled to the pixel driving line 23. The transfer transistors TRa and TRb are each, for example, a MOSFET (Metal Oxide Semiconductor Field Effect Transistor).

The respective floating diffusions FD of the sensor pixels 12 sharing one readout circuit 22 are electrically coupled to each other, and are electrically coupled to an input terminal of the common readout circuit 22. The readout circuit 22 includes, for example, a reset transistor RST, a selection transistor SEL, and an amplifying transistor AMP. Note that the selection transistor SEL may be omitted on an as-needed basis. A source of the reset transistor RST (the input terminal of the readout circuit 22) is electrically coupled to the floating diffusion FD, and a drain of the reset transistor RST is electrically coupled to the power supply line VDD and a drain of the amplifying transistor AMP. A gate of the reset transistor RST is electrically coupled to the pixel driving line 23. A source of the amplifying transistor AMP is electrically coupled to the drain of the selection transistor SEL, and a gate of the amplifying transistor AMP is electrically coupled to the source of the reset transistor RST. The source of the selection transistor SEL (an output terminal of the readout circuit 22) is electrically coupled to the vertical signal line 24, and the gate of the selection transistor SEL is electrically coupled to the pixel driving line 23. Here, the reset transistor RST, the selection transistor SEL, and the amplifying transistor AMP correspond to a specific example of an "output transistor" of the present disclosure.

When the transfer transistors TRa and TRb are turned on, the transfer transistors TRa and TRb transfer the charge in the photodiode PD and the charge in the charge holding section C to the floating diffusion FD. For example, as illustrated in FIG. 23, the respective gates (transfer gates TG) of the transfer transistors TRa and TRb extend from the surface of the semiconductor substrate 11 through the P-well 42 to a depth reaching the PD 41. The reset transistor RST resets the potential of the floating diffusion FD to a predetermined potential. When the reset transistor RST is turned on, the potential of the floating diffusion FD is reset to the potential of the power supply line VDD. The selection transistor SEL controls an output timing of the pixel signal from the readout circuit 22. The amplifying transistor AMP generates, as a pixel signal, a signal of a voltage corresponding to the level of charge held in the floating diffusion FD. The amplifying transistor AMP forms an amplifier of a source follower type, and outputs a pixel signal of a voltage corresponding to the level of charge generated in the photodiode PD. When the selection transistor SEL is turned on, the amplifying transistor AMP amplifies the potential of the floating diffusion FD, and outputs a voltage corresponding to the potential to the column-signal processing circuit 34 via the vertical signal line 24. The reset transistor RST, the amplifying transistor AMP, and the selection transistor SEL are each, for example, a MOSFET.

Note that, as illustrated in FIG. 26, the selection transistor SEL may be provided between the power supply line VDD and the amplifying transistor AMP. In this case, the drain of the reset transistor RST is electrically coupled to the power supply line VDD and the drain of the selection transistor SEL. The source of the selection transistor SEL is electrically coupled to the drain of the amplifying transistor AMP, and the gate of the selection transistor SEL is electrically coupled to the pixel driving line 23. The source of the amplifying transistor AMP (the output terminal of the readout circuit 22) is electrically coupled to the vertical signal line 24, and the gate of the amplifying transistor AMP is electrically coupled to the source of the reset transistor RST. Further, as illustrated in FIGS. 27 and 28, an FD transfer transistor FDG may be provided between the source of the reset transistor RST and the gate of the amplifying transistor AMP.

The FD transfer transistor FDG is used when conversion efficiency is to be switched. Generally, the pixel signal is small when shooting is performed in a dark place. Upon performing charge-voltage conversion on the basis of Q=CV, if the capacitance (an FD capacitance $C_{FD}$) of the floating diffusion FD is large, V at the time of conversion into a voltage by the amplifying transistor AMP becomes small. In contrast, in a bright place, the pixel signal becomes large. Therefore, if the FD capacitance $C_{FD}$ is not large, the floating diffusion FD cannot sufficiently receive the charge of the photodiode PD. Furthermore, the FD capacitance $C_{FD}$ needs to be large so that V at the time of conversion into a voltage by the amplifying transistor AMP does not become too large (in other words, becomes small). In view of these, when the FD transfer transistor FDG is turned on, because the gate capacitance increases by the amount of the FD transfer transistor FDG, the FD capacitance $C_{FD}$ as a whole increases. In contrast, when the FD transfer transistor FDG is turned off, the FD capacitance $C_{FD}$ as a whole is reduced. Thus, ON-OFF switching of the FD transfer transistor FDG allows the FD capacitance $C_{FD}$ to be variable, and makes it possible to switch the conversion efficiency.

FIG. 29 illustrates an example of a coupling state of a plurality of readout circuits 22 and a plurality of vertical signal lines 24. In a case where the readout circuits 22 are disposed side by side in a direction in which the vertical signal lines 24 extend (e.g., a column direction), the vertical signal lines 24 may be assigned for the readout circuits 22 on a one-to-one basis. For example, as illustrated in FIG. 29, in a case where four readout circuits 22 are disposed side by side in the extending direction of the vertical signal lines 24 (e.g., the column direction), four vertical signal lines 24 may be assigned for the readout circuits 22 on a one-to-one basis. Note that, in FIG. 29, the identification number (1, 2, 3, or 4) is given at the end of the sign of each of the vertical signal lines 24 in order to distinguish the vertical signal lines 24 from each other.

Next, a cross-sectional configuration of the imaging device 100F in the vertical direction is described with use of FIG. 23. As described above, the imaging device 100F has a configuration in which the first substrate 10, the second substrate 20, and the third substrate 30 are stacked in this order. The imaging device 100F further includes the color filter 40 and the light receiving lens 50 on the back surface (the light entering surface) side of the first substrate 10. The color filters 40 and the light receiving lenses 50 are provided for the sensor pixels 12 on a one-to-one basis. That is, the imaging device 100F is an imaging device of a back-illuminated type.

The first substrate 10 has a configuration in which an insulating layer 46 is stacked on the surface 11S1 of the semiconductor substrate 11. The first substrate 10 includes the insulating layer 46 as a portion of an interlayer insulating film 51. The insulating layer 46 is provided between the semiconductor substrate 11 and the semiconductor substrate 21 which will be described later.

The first substrate 10 includes a photodiode PD, a transfer transistor TR, a floating diffusion FD, and a charge holding section C for each sensor pixel 12. The first substrate 10 has a configuration in which the transfer transistor TR and the floating diffusion FD are provided in a portion of the semiconductor substrate 11 on the surface 11S1 side (the side opposite to the light entering surface side, the second substrate 20 side). The first substrate 10 has an element isolation section 43 that isolates each of the sensor pixels 12. The first substrate 10 further includes, for example, a fixed charge film 45 in contact with the surface 11S2 of the semiconductor substrate 11. The fixed charge film 45 is negatively charged in order to suppress generation of a dark current caused by the interface state of the light receiving surface side of the semiconductor substrate 11. The fixed charge film 45 includes, for example, an insulating film having negative fixed charge. Examples of a material for such an insulating film include hafnium oxide, zircon oxide, aluminum oxide, titanium oxide, and tantalum oxide. The electric field induced by the fixed charge film 45 forms a hole accumulation layer at the interface on the light receiving surface side of the semiconductor substrate 11. The hole accumulation layer suppresses generation of electrons from the interface.

The second substrate 20 has a configuration in which an insulating layer 52 is stacked on the semiconductor substrate 21. The insulating layer 52 includes, the second substrate 20 includes an insulating layer 52 as a portion of the interlayer insulating film 51. The insulating layer 52 is provided between the semiconductor substrate 21 and the semiconductor substrate 31. The semiconductor substrate 21 includes a silicon substrate. The second substrate 20 includes one readout circuit 22 for each two sensor pixels 12. The second substrate 20 has a configuration in which the readout circuit 22 is provided in a portion of the semiconductor substrate 21 on the front surface (a surface 21S1 opposing the third substrate 30, one surface) side. The second substrate 20 is bonded to the first substrate 10 in such a manner that a back surface (a surface 21S2) of the semiconductor substrate 21 opposes the front surface (the surface 11S1) of the semiconductor substrate 11. That is, the second substrate 20 is bonded to the first substrate 10 in a face-to-back manner. The second substrate 20 further includes an insulating layer 53 in the same layer as the semiconductor substrate 21. The insulating layer 53 runs through the semiconductor substrate 21. The second substrate 20 includes the insulating layer 53 as a portion of the interlayer insulating film 51. The insulating layer 53 is provided in such a manner as to cover a side surface of a through wiring line 54 which will be described later.

A stack including the first substrate 10 and the second substrate 20 includes the interlayer insulating film 51 and the through wiring line 54 provided in the interlayer insulating film 51. The above-described stack includes one through wiring line 54 for each sensor pixel 12. The through wiring line 54 extends in a normal direction of the semiconductor substrate 21. The through wiring line 54 is provided to run through a portion, of the interlayer insulating film 51, that includes the insulating layer 53. The first substrate 10 and the second substrate 20 are electrically coupled to each other by the through wiring line 54. Specifically, the through wiring line 54 is electrically coupled to the floating diffusion FD and the wiring line 113.

The second substrate 20 includes, for example, a plurality of coupling sections 59 in the insulating layer 52. The coupling sections 59 are each electrically coupled to the readout circuit 22, the semiconductor substrate 21, and the like. The second substrate 20 further includes, for example, a wiring layer 56 on the insulating layer 52. The wiring layer 56 includes, for example, an insulating layer 57, a plurality of pixel driving lines 23, and a plurality of vertical signal lines 24. The pixel driving lines 23 and the vertical signal lines 24 are provided in the insulating layer 57. The wiring layer 56 further includes, for example, a plurality of coupling wiring lines 55 in the insulating layer 57. The coupling wiring lines 55 are provided for the sensor pixels 12 on a one-to-two basis. The coupling wiring line 55 electrically couples the through wiring lines 54 electrically coupled to the floating diffusion FD included in the two sensor pixels 12 sharing the readout circuit 22 to each other.

The wiring layer 56 further includes, for example, a plurality of pad electrodes 58 in the insulating layer 57. Each of the pad electrodes 58 includes, for example, metal such as Cu (copper) or Al (aluminum). Each of the pad electrodes 58 is exposed on the surface of the wiring layer 56. Each of the pad electrodes 58 is used for electrical coupling between the second substrate 20 and the third substrate 30, and for bonding the second substrate 20 and the third substrate 30. The pad electrodes 58 are each provided, for example, for one pixel driving line 23 and one vertical signal line 24. Here, the total number of the pad electrodes 58 (or the total number of junctions between the pad electrodes 58 and pad electrodes 64 (which will be described later) is less than the total number of the sensor pixels 12 included in the first substrate 10.

The third substrate 30 has, for example, a configuration in which the interlayer insulating film 61 is stacked on the semiconductor substrate 31. Note that the upper-lower direction in the description of the configuration in the third substrate 30 is opposite to the upper-lower direction in the drawings because the surface on the front surface side of the third substrate 30 and the surface on the front surface side of the second substrate 20 are bonded to each other, as will be described later. The semiconductor substrate 31 includes a silicon substrate. The third substrate 30 has a configuration in which the logic circuit 32 is provided on a portion of the semiconductor substrate 31 on the front surface (a surface 31S1) side. The third substrate 30 further includes, for example, a wiring layer 62 on an interlayer insulating film 61. The wiring layer 62 includes, for example, an insulating layer 63 and a plurality of pad electrodes 64. The pad electrodes 64 are provided in the insulating layer 63, for example. The pad electrodes 64 are electrically coupled to the logic circuit 32. Each of the pad electrodes 64 includes, for example, Cu (copper). Each of the pad electrodes 64 is exposed on the surface of the wiring layer 62. Each of the pad electrodes 64 is used for electrical coupling between the second substrate 20 and the third substrate 30, and for bonding of the second substrate 20 and the third substrate 30. Further, the plurality of pad electrodes 64 may not necessarily be provided. Even a single pad electrode 64 is able to achieve electrically coupling with the logic circuit 32. The second substrate 20 and the third substrate 30 are electrically coupled to each other by the junction between the pad electrodes 58 and the pad electrodes 64. That is, the gate (the transfer gate TG) of the transfer transistor TR is electrically coupled to the logic circuit 32 via the through wiring line 54 and the pad electrodes 58 and 64. The third substrate 30 is bonded to the second substrate 20 in such a manner that the front surface (the surface 31S1) of the semiconductor substrate 31 opposes the front surface (the surface 21S1) side of the semiconductor substrate 21. That is, the third substrate 30 is bonded to the second substrate 20 in a face-to-face manner.

FIGS. 30 and 31 each illustrate an example of a cross-sectional configuration of the imaging device 100F in the horizontal direction. FIG. 30 is a diagram illustrating an example of a cross-sectional configuration on a cross-section Sec1 in FIG. 23, and FIG. 31 is a diagram illustrating an example of a cross-sectional configuration on a cross-section Sec2 in FIG. 23. Note that, in FIG. 30, a diagram illustrating an example of a surface configuration of the semiconductor substrate 11 is superimposed on the diagram illustrating the example of the cross-sectional configuration on the cross-section Sec1 in FIG. 23, and the insulating layer 46 is omitted. Further, in FIG. 31, a diagram illustrating an example of the surface configuration of the semiconductor substrate 21 is superimposed on the diagram illustrating the example of the cross-sectional configuration on the cross-section Sec2 in FIG. 23.

In the two sensor pixels 12 sharing the readout circuit 22, the two floating diffusions FD are disposed, for example, close to each other with the element isolation section 43 interposed therebetween. In the two sensor pixels 12 sharing the readout circuit 22, the two charge holding sections C extend, in a bent way, from regions opposing each other with the two floating diffusions FD interposed therebetween to the vicinity of the element isolation section 43 between the two sensor pixels 12 sharing the readout circuit 22. In the imaging device 100F, because the readout circuit 22 is provided in the second substrate 20, the area of the charge holding section C is easily increased as compared with the imaging device 100 and the like. That is, it is easy to increase the capacitance of the charge holding section C.

One readout circuit 22 shared by the two sensor pixels 12 includes, for example, a reset transistor RST, an amplifying transistor AMP, and a selection transistor SEL provided in a region opposing the two sensor pixels 12. One readout circuit 22 shared by the two sensor pixels 12 includes, for example, the amplifying transistor AMP and the reset transistor RST provided in a region opposing one of the sensor pixels 12, and the selection transistor SEL and the dummy transistor DMY provided in a region opposing the other of the sensor pixels 12.

FIG. 32 illustrates a cross-sectional configuration along a line I-I' illustrated in FIG. 31. As illustrated in FIG. 23, two through wiring lines 54 that are adjacent to each other with the element isolation section 43 interposed therebetween are electrically coupled to the respective floating diffusions FD. The two through wiring lines 54 are coupled to each other via the wiring line 113 of the wiring layer 56. Further, as illustrated in FIGS. 31 and 32, another through wiring line 54 is electrically coupled to a gate-electrode AMP-G of the amplifying transistor AMP via the wiring line of the wiring layer 56 and a coupling section 59. The wiring line of the wiring layer 56 electrically coupled to the gate-electrode AMP-G of the amplifying transistor AMP is electrically coupled to the floating diffusion FD via the wiring line 113.

The imaging device 100F has a stacked structure including the first substrate 10, the second substrate 20, and the third substrate 30. Therefore, the amplifying transistor AMP and the selection transistor SEL are provided on a substrate (the second substrate 20) different from the first substrate 10 provided with the PD 41, the floating diffusion FD, and the charge holding section C. Thus, it is possible to increase the area occupied by the amplifying transistor AMP and the selection transistor SEL, and to effectively suppress noise. In addition, it is also possible to increase the capacitance of the charge holding section C. Further, in terms of a manufacturing process, it is possible to optimize the manufacturing temperature for the amplifying transistor AMP and the selection transistor SEL, and to suppress generation of noise.

In addition, the third substrate 30 including the logic circuit 32 is stacked on the first substrate 10 provided with the PD 41 and the like. Therefore, it is possible to reduce the chip size.

FIG. 33 illustrates another example of the cross-sectional configuration of the imaging device 100F in the vertical direction. As illustrated, the electrical coupling between the second substrate 20 and the third substrate 30 may be achieved in a region opposing a peripheral region 14 of the first substrate 10. The peripheral region 14 corresponds to a frame region of the first substrate 10, and is provided on the periphery of the pixel region 13. The second substrate 20 includes a plurality of pad electrodes 58 in a region opposing the peripheral region 14. The third substrate 30 includes a plurality of pad electrodes 64 in a region opposing the peripheral region 14. The second substrate 20 and the third substrate 30 are electrically coupled to each other by the junction between the pad electrodes 58 and the pad electrodes 64 provided in the respective regions opposing the peripheral region 14.

Thus, the second substrate 20 and the third substrate 30 may be electrically coupled to each other by the junction between the pad electrodes 58 and the pad electrodes 64 provided in the respective regions opposing the peripheral region 14. This makes it possible to reduce a possibility of inhibiting miniaturization of the area per pixel, as compared with the case where the pad electrodes 58 and the pad electrodes 64 are joined with each other in a region opposing the pixel region 13. Therefore, in addition to the above-described effects, it is possible to provide the imaging device 100F having a three-layered structure that does not inhibit the miniaturization of the area per pixel with the chip size equivalent to the existing chip size.

FIG. 34 illustrates an example of a circuit configuration of the imaging device 100F. The imaging device 100F is, for example, a CMOS image sensor on which column-parallel ADCs are mounted.

As illustrated in FIG. 34, the imaging device 100F has a configuration that includes a vertical drive circuit 33, a column-signal processing circuit 34, a reference-voltage supply section 38, a horizontal drive circuit 35, a horizontal output line 37, and a system control circuit 36 in addition to the pixel region 13 in which a plurality of sensor pixels 12 each including a photoelectric conversion element is two-dimensionally arranged in rows and columns (in a matrix).

In this system configuration, the system control circuit 36 generates a clock signal, a control signal, and the like serving as references for operation of the vertical drive circuit 33, the column-signal processing circuit 34, the reference-voltage supply section 38, the horizontal drive circuit 35, and the like on the basis of a master clock MCK, and supplies the generated clock signal, the control signal, and the like to the vertical drive circuit 33, the column-signal processing circuit 34, the reference-voltage supply section 38, the horizontal drive circuit 35, and the like.

Further, the vertical drive circuit 33 is provided in the first substrate 10 together with the sensor pixels 12 in the pixel region 13, and is also provided in the second substrate 20 in which the readout circuit 22 is provided. The column-signal processing circuit 34, the reference-voltage supply section 38, the horizontal drive circuit 35, the horizontal output line 37, and the system control circuit 36 are provided in the third substrate 30.

As the sensor pixel 12, although not illustrated here, for example, one having a configuration that includes, in addition to the photodiode PD, a transfer transistor TR transferring charge obtained by photoelectric conversion in the photodiode PD to the floating diffusion FD can be used. Further, as the readout circuit 22, although not illustrated here, for example, one having a three-transistor configuration including a reset transistor RST that controls the potential of the floating diffusion FD, an amplifying transistor AMP that outputs a signal corresponding to the potential of the floating diffusion FD, and a selection transistor SEL that performs pixel selection can be used.

In the pixel region 13, the sensor pixels 12 are disposed two-dimensionally, the pixel driving line 23 is wired for each row with respect to the pixels disposed in m-rows and n-columns, and the vertical signal line 24 is wired for each column thereof. One end of each of the pixel driving lines 23 is coupled to an output terminal corresponding to each row of the vertical drive circuit 33. The vertical drive circuit 33 includes a shift register or the like, and controls row addressing and row scanning in the pixel region 13 via the pixel driving lines 23.

The column-signal processing circuit 34 includes, for example, ADCs (analog-to-digital converter circuits) 34-1 to 34-$m$. The ADCs 34-1 to 34-$m$ are each provided for each pixel column in the pixel region 13, i.e., for each vertical signal line 24. The column-signal processing circuit 34 converts an analog signal outputted from the respective sensor pixels 12 in the pixel region 13 on a column basis into a digital signal and outputs the digital signal.

The reference-voltage supply section 38 includes, for example, a DAC (digital-to-analog converter circuit) 38A as a component that generates a reference voltage Vref having a level that varies in an inclined shape as time elapses, i.e., having a ramp (RAMP) waveform. Note that, the component generating the reference voltage Vref of the ramp waveform is not limited to the DAC 38A.

Under a control with use of a control signal CS1 supplied from the system control circuit 36, the DAC 38A generates the reference voltage Vref having the ramp waveform on the basis of a clock CK supplied from the system control circuit 36, and supplies it to the ADCs 34-1 to 34-m of the column-signal processing circuit 34.

Note that each of the ADCs 34-1 to 34-m is configured to selectively perform AD conversion operation corresponding to each of the operation modes, i.e., a normal frame rate mode of a progressive scanning method and a high-speed frame rate mode. In the normal frame rate mode of the progressive scanning method, information of all of the sensor pixels 12 is read. In the high-speed frame rate mode, the exposure time of the sensor pixels 12 is set to 1/N to increase the frame rate by N times, for example, to double the frame rate, as compared with those in the normal frame rate mode. This switching of the operation mode is executed by a control with use of control signals CS2 and CS3 supplied from the system control circuit 36. Further, the system control circuit 36 receives instruction information for switching the operation mode between the normal frame rate mode and the high-speed frame rate mode from an external system controller (not illustrated).

All of the ADCs 34-1 to 34-m have the same configuration. Here, it is described with reference to the ADC 34-m as an example. The ADC 34-m has a configuration including a comparator 34A, for example, an up/down counter (described as U/DCNT in the drawing) 34B serving as a counter, a transfer switch 34C, and a memory 34D.

The comparator 34A compares a signal voltage Vx of the vertical signal line 24 corresponding to a signal outputted from each of the sensor pixels 12 in the n-th column in the pixel region 13 and the reference voltage Vref of the ramp waveform supplied from the reference-voltage supply section 38. For example, when the reference voltage Vref is higher than the signal voltage Vx, an output Vco is brought to an "H" level, and when the reference voltage Vref is the signal voltage Vx or lower, the output Vco is brought to an "L" level.

The up/down counter 34B is an asynchronous counter. Under a control with use of the control signal CS2 supplied from the system control circuit 36, the up/down counter 34B receives a clock CK from the system control circuit 36 at the same time as the DAC 18A. The up/down counter 34B performs down (DOWN) count or up (UP) count in synchronization with the clock CK. The up/down counter 34B thereby measures a comparison period from the start of the comparison operation to the end of the comparison operation performed by the comparator 34A.

Specifically, in the normal frame rate mode, in operation of reading a signal from one sensor pixel 12, it performs the down count upon first reading operation to measure the comparison time at the time of the first reading. It performs the up count upon second reading operation to measure the comparison time at the time of the second reading.

In contrast, in the high-speed frame rate mode, the count result for the sensor pixels 12 in a certain row is kept as it is. Continuously, for the sensor pixels 12 in the next row, it performs the down count upon first reading operation from the previous count result to measure the comparison time at the time of the first reading. It performs the up count upon second reading operation to measure the comparison time at the time of the second reading.

Under a control with use of the control signal CS3 supplied from the system control circuit 36, in the normal frame rate mode, the transfer switch 34C is brought to an ON (closed) state when the count operation by the up/down counter 34B for the sensor pixels 12 in the certain row is completed, and transfers the count result obtained by the up/down counter 34B to the memory 34D.

In contrast, for example, in the high-speed frame rate of N=2, it is still in an OFF (open) state when the count operation by the up/down counter 34B for the sensor pixels 12 in the certain row is completed. Continuously, it is brought to the ON state when the count operation by the up/down counter 34B for the sensor pixels 12 in the next row is completed, and it transfers the count result for two pixels in the vertical direction obtained by the up/down counter 34B to the memory 34D.

Thus, the analog signal supplied to each column from each of the sensor pixels 12 in the pixel region 13 via the vertical signal line 24 is converted into an N-bit digital signal by the operation of each of the comparators 34A and the up/down counters 34B in the ADCs 34-1 to 34-m and stored in the memory 34D.

The horizontal drive circuit 35 incudes a shift register and the like. The horizontal drive circuit 35 controls column addressing, column scanning, and the like for the ADCs 34-1 to 34-m in the column-signal processing circuit 34. Under the control of the horizontal drive circuit 35, the respective N-bit digital signals subjected to AD conversion by the ADCs 34-1 to 34-m are sequentially read out to the horizontal output line 37. The N-bit digital signals are outputted as imaging data via the horizontal output line 37.

Note that, although not illustrated as it is not directly related to the present disclosure, a circuit or the like that performs various kinds of signal processing on the imaging data outputted via the horizontal output line 37 may be provided in addition to the above-described components.

In the imaging device 100F according to the present modification having the above-described configuration on which the column-parallel ADCs are mounted, the count result obtained by the up/down counter 34B can be selectively transferred to the memory 34D via the transfer switch 34C. Accordingly, it is possible to independently control the count operation by the up/down counter 34B and the operation of reading out the count result obtained by the up/down counter 34B to the horizontal output line 37.

FIG. 35 illustrates an example in which the imaging device 100F in FIG. 34 has a configuration with a stack of three substrates (the first substrate 10, the second substrate 20, and the third substrate 30). Here, in the first substrate 10, the pixel region 13 including a plurality of sensor pixels 12 is provided in a middle portion, and the vertical drive circuit 33 is provided around the pixel region 13. Further, in the second substrate 20, a readout circuit region 15 including a plurality of readout circuits 22 is provided in a middle portion, and the vertical drive circuit 33 is provided around the readout circuit region 15. In the third substrate 30, the column-signal processing circuit 34, the horizontal drive circuit 35, the system control circuit 36, the horizontal output line 37, and the reference-voltage supply section 38 are provided. As with the above-described modification, this prevents increase in chip size or inhibition of miniaturization of the area per pixel caused by the structure in which the substrates are electrically coupled to each other. As a result, it is possible to provide the imaging device 100F having a three-layer structure that does not inhibit the miniaturization of the area per pixel with the chip size equivalent to the existing chip size. Note that the vertical drive circuit 33 may be provided only in the first substrate 10 or only in the second substrate 20.

FIG. 36 illustrates an example of a cross-sectional configuration of the imaging device 100F described above. The imaging device 100F illustrated in FIG. 35 or the like has the configuration including the stack of the three substrates (the first substrate 10, the second substrate 20, and the third substrate 30). However, the imaging device 100F may have a configuration including a stack of two substrates (the first substrate 10 and the second substrate 20). In this case, the logic circuit 32 may be dividedly provided in the first substrate 10 and the second substrate 20 as illustrated in FIG. 36, for example. Here, a circuit 32A, of the logic circuit 32, provided on the first substrate 10 side is provided with a transistor having a gate structure including a stack of a high dielectric constant film and a metal gate electrode. The high dielectric constant film includes a material (e.g., high-k) resistant to a high-temperature process. Meanwhile, a circuit 32B provided on the second substrate 20 side is provided with a low resistance region 26 on the surface of the impurity diffusion region in contact with the source electrode and the drain electrode. The low resistance region 26 includes silicide formed using a salicide (Self Aligned Silicide) process such as $CoSi_2$ or NiSi. The low resistance region including silicide includes a compound of a semiconductor substrate material and metal. Thus, it is possible to use a high temperature process such as thermal oxidization upon forming the sensor pixels 12. Further, in a case where the low resistance region 26 including silicide is provided on the surface of the impurity diffusion region in contact with the source electrode and the drain electrode in the circuit 32B, of the logic circuit 32, provided on the second substrate 20 side, it is possible to reduce contact resistance. As a result, it is possible to increase the speed of calculation performed by the logic circuit 32.

FIG. 37 illustrates another example of the cross-sectional configuration of the imaging device 100F described above. In the imaging device 100F, a low resistance region 37 including silicide formed by a salicide (Self Aligned Silicide) process such as $CoSi_2$ or NiSi may be provided on the surface of the impurity diffusion region in contact with the source electrode and the drain electrode in the logic circuit 32 in the third substrate 30. Thus, it is possible to use a high temperature process such as thermal oxidization upon forming the sensor pixels 12. Further, in a case where the low resistance region 37 including silicide is provided on the surface of the impurity diffusion region in contact with the source electrode and the drain electrode in the logic circuit 32, it is possible to reduce contact resistance. As a result, it is possible to increase the speed of calculation performed by the logic circuit 32.

Note that the conductivity types may be opposite in the embodiment and Modifications 1 to 7 thereof described above. For example, in the description of the embodiment and Modifications 1 to 7 thereof described above, the P-type may be replaced by the N-type, and the N-type may be replaced by the P-type. Effects similar to those of the embodiment and Modifications 1 to 7 thereof described above can be obtained also in such a case.

Application Example

FIG. 38 illustrates an example of a schematic configuration of an imaging system 7 provided with any of the imaging devices 100 and 100A to 100G (hereinafter collectively referred to as the imaging device 100) according to the embodiment and Modifications 1 to 7 thereof described above.

The imaging system 7 is, for example, an imaging apparatus such as a digital still camera or a video camera, or an electronic apparatus such as a portable terminal apparatus such as a smartphone or a tablet-type terminal. The imaging system 7 includes, for example, an optical system 241, a shutter device 242, the imaging device 100, a DSP circuit 243, a frame memory 244, a display section 245, a storage section 246, an operation section 247, and a power source section 248. In the imaging system 7, the shutter device 242, the imaging device 100, the DSP circuit 243, the frame memory 244, the display section 245, the storage section 246, the operation section 247, and the power source section 248 are coupled to each other via a bus line 249.

The imaging device 100 outputs image data corresponding to entering light. The optical system 241 includes one or more lenses. The optical system 241 guides light (entering light) from a subject to the imaging device 100 to form an image on the light receiving surface of the imaging device 100. The shutter device 242 is disposed between the optical system 241 and the imaging device 100. The shutter device 242 controls a light application period and a light blocking period for the imaging device 100 in accordance with a control by the operation section 247. The DSP circuit 243 is a signal processing circuit that processes a signal (image data) outputted from the imaging device 100. The frame memory 244 temporarily holds the image data processed by the DSP circuit 243 on a frame unit basis. The display section 245 includes, for example, a panel-type display device such as a liquid crystal panel or an organic EL (Electro Luminescence) panel. The display section 245 displays a moving image or a still image captured by the imaging device 100. The storage section 246 records the image data of the moving image or the still image captured by the imaging device 100 in a recording medium such as a semiconductor memory or a hard disk. The operation section 247 outputs an operation command related to various functions of the imaging system 7 in accordance with an operation by the user. The power source section 248 provides various power sources serving as operation power sources of the imaging device 100, the DSP circuit 243, the frame memory 244, the display section 245, the storage section 246, and the operation section 247 to these supply targets as appropriate.

Next, an imaging procedure of the imaging system 7 is described.

FIG. 39 illustrates an example of a flowchart of imaging operation of the imaging system 7. The user operates the operation section 247 to give an instruction to start imaging (step S101). Then, the operation section 247 transmits an imaging command to the imaging device 100 (step S102). Upon receiving the imaging command, the imaging device 100 (specifically, the system control circuit 36) executes imaging in a predetermined imaging method (step S103).

The imaging device 100 supplies light (image data) formed as an image on the light receiving surface via the optical system 241 and the shutter device 242 to the DSP circuit 243. Here, the image data is data for all pixels of the pixel signals generated on the basis of charge temporarily held in the floating diffusions FD. The DSP circuit 243 performs predetermined signal processing (e.g., a noise reduction process or the like) on the basis of the image data supplied from the imaging device 100 (step S104). The DSP circuit 243 causes the frame memory 244 to hold the image data subjected to the predetermined signal processing, and the frame memory 244 stores the image data in the storage section 246 (step S105). In this manner, imaging by the imaging system 7 is performed.

In the present application example, the imaging device 100 is applied to the imaging system 7. Thus, it is possible to reduce the size or increase the definition of the imaging device 100. Accordingly, it is possible to provide a small-sized or high-definition imaging system 7.

FIGS. 40A, 40B, and 40C are diagrams illustrating an outline of a configuration example of a solid-state imaging device of a non-stacked type (a solid-state imaging device 23210) and a solid-state imaging device of a stacked type (a solid-state imaging device 23020) to which the technology of the present disclosure is applicable.

40A illustrates a schematic configuration example of the solid-state imaging device of the non-stacked type. The solid-state imaging device 23010 includes one die (a semiconductor substrate) 23011 as illustrated in FIG. 40A. A pixel region 23012 including arrayed pixels, a control circuit 23013 performing various controls including driving of the pixels and the like, and a logic circuit 23014 for performing signal processing are mounted on the die 23011.

FIGS. 40B and 40C each illustrate a schematic configuration example of the solid-state imaging device of the stacked type. As illustrated in FIGS. 40B and 40C, the solid-state imaging device 23020 includes two dies, i.e., a sensor die 23021 and a logic die 23024 that are stacked on each other and electrically coupled to each other to form a single semiconductor chip.

In FIG. 40B, a pixel region 23012 and a control circuit 23013 are mounted on the sensor die 23021. A logic circuit 23014 that includes a signal processing circuit performing signal processing is mounted on the logic die 23024. Further, for example, the above-described readout circuit 22 or the like may be mounted on the sensor die 20321.

In FIG. 40C, the pixel region 23012 is mounted on the sensor die 23021, and the control circuit 23013 and the logic circuit 23014 are mounted on the logic die 23024.

FIG. 41 is a cross-sectional view of a first configuration example of the solid-state imaging device 23020 of the stacked type.

In the sensor die 23021, a PD (photodiode), an FD (floating diffusion), a Tr (MOS FET), which provide a pixel to be the pixel region 23012, a Tr to be as the control circuit 23013, and the like are provided. Further, a wiring layer 23101 including a wiring line 23110 of a plurality of layers, in this example, three layers, is provided in the sensor die 23021. Note that (the Tr to be) the control circuit 23013 may be provided not in the sensor die 23021, but in the logic die 23024.

In the logic die 23024, a Tr providing the logic circuit 23014 is provided. Further, a wiring layer 23161 including a wiring line 23170 of a plurality of layers, in this example, three layers, is provided in the logic die 23024. In addition, the logic die 23024 has a coupling hole 23171 in which an insulating film 23172 is provided on the inner wall surface, and a coupling conductor 23173 coupled to the wiring line 23170 and the like is provided in the coupling hole 23171.

The sensor die 23021 and the logic die 23024 are bonded to each other in such a manner that their wiring layers 23101 and 23161 oppose each other, thereby providing the solid-state imaging device 23020 of the stacked type in which the sensor die 23021 and the logic die 23024 are stacked on each other. A film 23191 such as a protective film is provided on a surface where the sensor die 23021 and the logic die 23024 are bonded.

The sensor die 23021 has a coupling hole 23111. The coupling hole 23111 runs through the sensor die 23021 from a back surface side (side where light enters the PD) (upper side) of the sensor die 23021 and reaches the wiring line 23170 in the uppermost layer of the logic die 23024. Furthermore, the sensor die 23021 has a coupling hole 23121. The coupling hole 23121 is located near the coupling hole 23111 and reaches the wiring line 23110 in the first layer from the back surface side of the sensor die 23021. An insulating film 23112 is provided on an inner wall surface of the coupling hole 23111, and an insulating film 23122 is provided on an inner wall surface of the coupling hole 23121. Further, coupling conductors 23113 and 23123 are provided in the coupling holes 23111 and 23121, respectively. The coupling conductors 23113 and 23123 are electrically coupled to each other on the back surface side of the sensor die 23021. This allows the sensor die 23021 and the logic die 23024 to be electrically coupled to each other via the wiring layer 23101, the coupling hole 23121, the coupling hole 23111, and the wiring layer 23161.

FIG. 42 is a cross-sectional view of a second configuration example of the solid-state imaging device 23020 of the stacked type.

In the second configuration example of the solid-state imaging device 23020, ((the wiring line 23110 of) the wiring layer 23101 of) the sensor die 23021 and ((the wiring line 23170 of) the wiring layer 23161 of) the logic die 23024 are electrically coupled to each other by means of one coupling hole 23211 in the sensor die 23021.

That is, in FIG. 42, the coupling hole 23211 runs through the sensor die 23021 from the back surface side of the sensor die 23021 to reach the wiring line 23170 in the uppermost layer of the logic die 23024 and to reach the wiring line 23110 in the uppermost layer of the sensor die 23021. An insulating film 23212 is provided on an inner wall surface of the coupling hole 23211, and a coupling conductor 23213 is provided in the coupling hole 23211. In FIG. 41 described above, the sensor die 23021 and the logic die 23024 are electrically coupled to each other by means of the two coupling holes 23111 and 23121. However, in FIG. 42, the sensor die 23021 and the logic die 23024 are electrically coupled to each other by means of one coupling hole 23211.

FIG. 43 is a cross-sectional view of a third configuration example of the solid-state imaging device 23020 of the stacked type.

The solid-state imaging device 23020 of FIG. 43 differs from the case of FIG. 41 in that the film 23191 such as the protective film is not provided on the surface where the sensor die 23021 and the logic die 23024 are bonded. In the case of FIG. 41, the film 23191 such as the protective film is provided on the surface where the sensor die 23021 and the logic die 23024 are bonded.

The solid-state imaging device 23020 of FIG. 43 is configured by overlapping the sensor die 23021 and the logic die 23024 in such a manner that the wiring lines 23110 and 23170 come into direct contact with each other, heating them while applying a desired weight, and directly joining the wiring lines 23110 and 23170.

FIG. 44 is a cross-sectional view of another configuration example of the solid-state imaging device of the stacked type to which the technology according to the present disclosure is applicable.

In FIG. 44, the solid-state imaging device 23401 has a three-layer stack structure in which three dies, i.e., a sensor die 23411, a logic die 23412, and a memory die 23413 are stacked on each other.

The memory die 23413 includes, for example, a memory circuit that stores data that is to be temporarily necessary in signal processing performed in the logic die 23412.

In FIG. 44, the logic die 23412 and the memory die 23413 are stacked in this order under the sensor die 23411. However, the logic die 23412 and the memory die 23413 can be stacked under the sensor die 23411 in an opposite order, i.e., in the order of the memory die 23413 and the logic die 23412.

Note that, in FIG. 44, the sensor die 23411 is provided with a PD to be the photoelectric converter of the pixel and the source/drain regions of the pixel Tr.

A gate electrode is provided around the PD with a gate insulating film interposed therebetween. The gate electrode and the paired source/drain regions form a pixel Tr 23421 and a pixel Tr 23422.

The pixel Tr 23421 adjacent to the PD is a transfer Tr, and one of the paired source/drain regions included in the pixel Tr 23421 serves as a FD.

Further, an interlayer insulating film is provided in the sensor die 23411. The interlayer insulating film has a coupling hole. A coupling conductor 23431 coupled to the pixel Tr 23421 and the pixel Tr 23422 is provided in the coupling hole.

Further, a wiring layer 23433 including a multilayer wiring line 23432 coupled to each coupling conductor 23431 is provided in the sensor die 23411.

Further, an aluminum pad 23434 that serves as an electrode for external coupling is provided in the lowermost layer of the wiring layer 23433 in the sensor die 23411. That is, the aluminum pad 23434 is provided at a position closer to a bonding surface 23440 of bonding with the logic die 23412 than the wiring line 23432 in the sensor die 23411. The aluminum pad 23434 is used as one end of a wiring line related to input and output of a signal to and from the outside.

Further, a contact 23441 is provided in the sensor die 23411. The contact 23441 is used for electrical coupling to the logic die 23412. The contact 23441 is coupled to a contact 23451 in the logic die 23412 and is also coupled to an aluminum pad 23442 in the sensor die 23411.

Further, the sensor die 23411 has a pad hole 23443 that reaches the aluminum pad 23442 from a back surface side (upper side) of the sensor die 23411.

FIG. 45 is a cross-sectional view of a third configuration example of the solid-state imaging device 23020 of the stacked type.

As illustrated in FIG. 45, the sensor die 23021 and the logic die 23024 may be joined by means of coupling wiring lines (coupling wiring lines 23136 and 23158). The coupling wiring line 23136 is exposed on the surface, of the sensor die 23021, that joins the logic die 23024. The coupling wiring line 23158 is exposed on the surface, of the logic die 23024, that joins the sensor die 23021. The coupling wiring lines 23136 and 23158 are in contact with each other at the surface where the sensor die 23021 and the logic die 23024 are joined. The coupling wiring lines 23136 and 23158 include metal such as copper (Cu), for example. Thus, the sensor die 23021 and the logic die 23024 may be joined by metal direct joining.

The technology according to the present disclosure is applicable to the solid-state imaging device as described above. For example, the wiring line 23110, the wiring layer 23161, and the like may be provided with, for example, the plurality of pixel driving lines 23 and the plurality of vertical signal lines 24 described above.

PRACTICAL APPLICATION EXAMPLES

Practical Application Example 1

The technology (the present technology) according to the present disclosure is practically applicable to various products. For example, the technology according to the present disclosure may be implemented as a device mounted on any kind of mobile body such as an automobile, an electric vehicle, a hybrid electric vehicle, a motorcycle, a bicycle, a personal mobility, an airplane, a drone, a vessel, or a robot.

FIG. 46 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 46, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 46, an audio speaker 12061, a display section 12062, and an instrument panel 12063 are illustrated as the output device. The display section 12062 may, for example, include at least one of an on-board display and a head-up display.

FIG. 47 is a diagram depicting an example of the installation position of the imaging section 12031.

In FIG. 47, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 47 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the mobile body control system to which the technology according to the present disclosure is applicable has been described above. The technology according to the present disclosure is applicable to the imaging section 12031 among the components described above. Specifically, the imaging device 100 according to any of the embodiment and its modifications described above is applicable to the imaging section 12031. Applying the technology according to the present disclosure to the imaging section 12031 makes it possible to obtain a high-definition captured image with less noise. Therefore, it is possible to perform a control with high accuracy utilizing the captured image in the mobile body control system.

Practical Application Example 2

FIG. 48 is a view depicting an example of a schematic configuration of an endoscopic surgery system to which the technology according to an embodiment of the present disclosure (present technology) can be applied.

In FIG. 48, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endo scope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 49 is a block diagram depicting an example of a functional configuration of the camera head 11102 and the CCU 11201 depicted in FIG. 48.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided correspondingly to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure is applicable has been described above. The technology according to the present disclosure is suitably applicable to the image pickup unit 11402 provided in the camera head 11102 of the endo scope 11100. Applying the technology according to the present disclosure to the image pickup unit 11402 makes it possible to reduce size or increase definition of the image pickup unit 11402. It is therefore possible to provide a small-sized or high-definition endoscope 11100.

The present disclosure has been described above with reference to the embodiment, Modifications 1 to 7 thereof, the application example thereof, and the practical application examples thereof; however, the present disclosure is not limited to the above-described embodiment and the like, and is variously modifiable. For example, in the above-described embodiment and the like, an example has been described in which the plurality of pixel driving lines 23 extends in the row direction and the plurality of vertical signal lines extends in the column direction. However, they may extend in the same direction as each other. Further, the extending direction of the pixel driving lines 23 can be changed as appropriate, for example, to the vertical direction or the like.

Further, in the above-described embodiment and the like, the description has been given of an example in which the pixel P including the unit regions P-1 and P-2 and the like is used as a phase-difference detection pixel. However, the pixel P including the unit regions P-1 and P-2 and the like may have other functions.

Further, in the above-described embodiment and the like, the description has been given of a case where all of the pixels P in the light receiving region 100P include the unit regions P-1 and P-2 and the like. However, a portion of the pixels P in the light receiving region 100P may include the unit regions P-1 and P-2 and the like. Further, the pixel P functioning as a phase-difference detection pixel may be provided with, instead of the color filter 40, another member.

The effects described in the above-described embodiment and the like are mere examples, and may be other effects or may further include other effects.

Note that the present disclosure may have any of the following configurations. According to the solid-state imaging device having any of the following configurations, because the charge holding section is provided, the charge holding section can receive the signal charge overflowing from the photoelectric converter. In other words, it is possible to suppress discharging of the signal charge overflowing from the photoelectric converter into the power supply potential VDD or the like. Therefore, it is possible to suppress image degradation caused by signal charge saturation in the photoelectric converter.

(1)
A solid-state imaging device including:
a first semiconductor substrate in which a photoelectric converter is provided for each of unit regions;
an isolation region that is provided to run through the first semiconductor substrate in a thickness direction and electrically isolates the unit regions from each other;
a charge holding section that is electrically coupled to the photoelectric converter and configured to receive signal charge from the photoelectric converter; and
a charge accumulation section that is shared by two or more of the unit regions and to which the signal charge is transferred from the photoelectric converter and the charge holding section of each of the unit regions sharing the charge accumulation section.

(2)
The solid-state imaging device according to (1) described above, in which a potential barrier between the photoelectric converter and the charge holding section is smaller than a potential barrier between the photoelectric converter and the charge accumulation section.

(3)
The solid-state imaging device according to (1) or (2) described above, further including
a transfer transistor that transfers the signal charge from the photoelectric converter to the charge accumulation section, in which
one of a source and a drain of the transfer transistor is coupled to the charge accumulation section, and another of the source and the drain is coupled to the charge holding section.

(4)
The solid-state imaging device according to (3) described above, in which the transfer transistor is provided for each of the unit regions.

(5)
The solid-state imaging device according to any one of (1) to (4) described above, in which
the charge holding section includes an impurity diffusion region of a first conductivity type provided in the first semiconductor substrate, and the impurity diffusion region of the first conductivity type is provided in a portion of a diffusion layer of a second conductivity type of the first semiconductor substrate.

(6) The solid-state imaging device according to (5) described above, in which the charge holding section includes the impurity diffusion region having a comb-like plan shape.

(7) The solid-state imaging device according to any one of (1) to (6) described above, in which the charge accumulation section is shared by two of the unit regions.

(8) The solid-state imaging device according to any one of (1) to (6) described above, in which the charge accumulation section is shared by four of the unit regions.

(9) The solid-state imaging device according to any one of (1) to (8) described above, in which the charge holding section is provided for each of the unit regions.

(10) The solid-state imaging device according to any one of (1) to (8) described above, in which the two or more of the unit regions sharing the charge accumulation section share the charge holding section.

(11) The solid-state imaging device according to any one of (1) to (10) described above, further including an output transistor electrically coupled to the charge accumulation section.

(12) The solid-state imaging device according to (11) described above, further including a second semiconductor substrate in which the output transistor is provided and that is stacked on the first semiconductor substrate.

(13) The solid-state imaging device according to any one of (1) to (12) described above, further including
a multilayer wiring layer provided on a front surface of the first semiconductor substrate; and
a light receiving lens provided on a back surface of the first semiconductor substrate.

(14) The solid-state imaging device according to (13) described above, in which the light receiving lens is provided over the two or more of the unit regions sharing the charge accumulation section.

(15) The solid-state imaging device according to any one of (1) to (14) described above, further including
phase-difference detection pixels, in which
the charge accumulation section is provided for each of the phase-difference detection pixels.

This application claims the priority on the basis of Japanese Patent Application No. 2019-102044 filed on May 31, 2019 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A solid-state imaging device, comprising:
a first semiconductor substrate comprising a plurality of unit regions and a potential adjustment region;
a photoelectric converter for each of the plurality of unit regions;
an isolation region that runs through the first semiconductor substrate in a thickness direction of the first semiconductor substrate and is configured to electrically isolate the plurality of unit regions from each other;
a charge holding section that is electrically coupled to the photoelectric converter and configured to receive signal charge from the photoelectric converter; and
a charge accumulation section that is shared by at least two unit regions of the plurality of unit regions and to which the signal charge is transferred from the photoelectric converter, wherein
the charge holding section of each of the plurality of unit regions shares the charge accumulation section, and
a potential barrier between the photoelectric converter and the charge holding section is adjusted to be smaller than a potential barrier between the photoelectric converter and the charge accumulation section based on the potential adjustment region.

2. The solid-state imaging device according to claim 1, further comprising a transfer transistor configured to transfer the signal charge from the photoelectric converter to the charge accumulation section, wherein
one of a source or a drain of the transfer transistor is coupled to the charge accumulation section, and
another of the source or the drain is coupled to the charge holding section.

3. The solid-state imaging device according to claim 2, wherein the transfer transistor is for each of the plurality of unit regions.

4. The solid-state imaging device according to claim 1, wherein
the charge holding section includes an impurity diffusion region of a first conductivity type in the first semiconductor substrate, and
the impurity diffusion region of the first conductivity type is in a portion of a diffusion layer of a second conductivity type of the first semiconductor substrate.

5. The solid-state imaging device according to claim 4, wherein the charge holding section includes the impurity diffusion region having a comb-like plan shape.

6. The solid-state imaging device according to claim 1, wherein the charge accumulation section is shared by two unit regions of the plurality of unit regions.

7. The solid-state imaging device according to claim 1, wherein the charge accumulation section is shared by four unit regions of the plurality of unit regions.

8. The solid-state imaging device according to claim 1, wherein the charge holding section is for each unit region of the plurality of unit regions.

9. The solid-state imaging device according to claim 1, wherein the at least two unit regions of the plurality of unit regions sharing the charge accumulation section share the charge holding section.

10. The solid-state imaging device according to claim 1, further comprising an output transistor electrically coupled to the charge accumulation section.

11. The solid-state imaging device according to claim 10, further comprising a second semiconductor substrate comprising the output transistor, wherein the second semiconductor substrate is on the first semiconductor substrate.

12. The solid-state imaging device according to claim 1, further comprising:
a multilayer wiring layer on a front surface of the first semiconductor substrate; and a light receiving lens on a back surface of the first semiconductor substrate.

13. The solid-state imaging device according to claim 12, wherein the light receiving lens is over at least two unit regions of the plurality of unit regions sharing the charge accumulation section.

14. The solid-state imaging device according to claim 1, further comprising phase-difference detection pixels, wherein the charge accumulation section is for each of the phase-difference detection pixels.

* * * * *